US012770556B1

(12) United States Patent
Xu et al.

(10) Patent No.: US 12,770,556 B1
(45) Date of Patent: Oct. 20, 2026

(54) AR DISPLAY WITH IR-CONTROLLED PIXEL-LEVEL TINTING

(71) Applicant: Adeia Semiconductor Inc., San Jose, CA (US)

(72) Inventors: Ning Xu, Irvine, CA (US); Christopher Phillips, Hartwell, GA (US); Yan Chai, San Jose, CA (US); Jean-Yves Couleaud, Mission Viejo, CA (US)

(73) Assignee: Adeia Semiconductor Inc., San Jose, CA (US)

( * ) Notice: Subject to any disclaimer, the term of this patent is extended or adjusted under 35 U.S.C. 154(b) by 0 days.

(21) Appl. No.: 19/346,130

(22) Filed: Sep. 30, 2025

(51) Int. Cl.
*G09G 3/32* (2016.01)
*G02B 27/01* (2006.01)
(Continued)

(52) U.S. Cl.
CPC ............... *G09G 3/32* (2013.01); *H10H 29/34* (2025.01); *H10H 29/855* (2025.01); *G02B 2027/0138* (2013.01); *G02B 27/0172* (2013.01); *G02B 2027/0178* (2013.01); *G09G 3/3413* (2013.01); *G09G 3/36* (2013.01); *G09G 2310/04* (2013.01); *G09G 2320/06* (2013.01); *G09G 2360/144* (2013.01)

(58) Field of Classification Search
CPC .......... G09G 3/32; G09G 3/3413; G09G 3/36; G09G 2310/04; G09G 2320/06; G09G 2360/06; H10H 29/34; H10H 29/855; G02B 2027/0138; G02B 2027/0178
See application file for complete search history.

(56) References Cited

U.S. PATENT DOCUMENTS

| | | | | |
|---|---|---|---|---|
| 9,626,936 B2 * | 4/2017 | Bell | ..................... | G02B 27/017 |
| 10,694,607 B1 * | 6/2020 | Xu | ......................... | H05B 45/22 |

(Continued)

OTHER PUBLICATIONS

U.S. Appl. No. 19/255,860, filed Jun. 30, 2025, Title: Pixel-Level Transparency Control for See-Through XR Waveguide Displays. (Not Provided: USPTO in possession of specification, claims, and prosecution history).

(Continued)

*Primary Examiner* — Ariel A Balaoing
(74) *Attorney, Agent, or Firm* — HG LAW LLP

(57) ABSTRACT

Pixel level transparency control for see-through XR devices is described. An example system comprises an XR display, comprising a transparent waveguide layer, an infrared (IR) waveguide layer disposed on the XR display, and a dimmable layer disposed on the IR waveguide layer. The XR system further comprising, a light source array configured to emit red light, green light, blue light, and IR light controllable on per-pixel level, and a control circuitry. The control circuitry is configured to generate pixel-level drive signals to cause the light source array to (i) emit a red light pattern, green light pattern, and blue light pattern through the transparent waveguide layer to generate an XR image defined by the pixel-level drive signals, and (ii) emit an IR light pattern through the IR waveguide layer to the dimmable layer to change respective opacities of respective portions of the dimmable layer, on a pixel-level where respective portions of the dimmable layer correspond to pixels of the XR display.

20 Claims, 17 Drawing Sheets

(51) Int. Cl.

| | |
|---|---|
| ***G09G 3/34*** | (2006.01) |
| ***G09G 3/36*** | (2006.01) |
| ***H10H 29/34*** | (2025.01) |
| ***H10H 29/855*** | (2025.01) |

(56) References Cited

U.S. PATENT DOCUMENTS

| | | | | |
|---|---|---|---|---|
| 11,366,321 | B1 * | 6/2022 | Grundhoefer | G06F 3/147 |
| 2010/0156955 | A1 * | 6/2010 | Kimura | G02F 1/133608 348/448 |
| 2015/0168731 | A1 * | 6/2015 | Robbins | G06T 19/006 345/8 |
| 2016/0116745 | A1 * | 4/2016 | Osterhout | G02B 7/008 359/614 |
| 2016/0282625 | A1 * | 9/2016 | Fleck | F21V 5/004 |
| 2018/0232048 | A1 * | 8/2018 | Popovich | G02B 6/105 |
| 2022/0059050 | A1 * | 2/2022 | Thareja | G02F 1/13318 |
| 2022/0165188 | A1 * | 5/2022 | Yamazaki | B60K 35/10 |
| 2024/0404223 | A1 | 12/2024 | Ofir | |

OTHER PUBLICATIONS

Zhu M., et al., "MicroLED Displays from Full-Color Conversion: A Practical, Manufacturable Approach", Information Display, 40.8, May/Jun. 2024, pp. 20-25.

* cited by examiner

AR DISPLAY WITH IR-CONTROLLED PIXEL-LEVEL TINTING

BACKGROUND

This present disclosure relates to devices, apparatuses, methods, and systems for providing extended reality (XR) images on a display device, and more particularly, to display technologies (such as using micro-LEDs) for XR display devices.

SUMMARY

See-through displays may benefit from per-pixel control over light transmission and brightness to improve visibility, realism, and user comfort under dynamic lighting conditions. In some approaches, systems that provide XR content lack the ability to measure and/or respond to localized variations in brightness (e.g., from the environment), resulting in inconsistent opacity and/or color bleeding across the XR display's field of view (FOV). In some instances, an application on a see-through display (e.g., XR headset, XR heads-up display (HUD), XR head mounted display (HMD) and/or augmented reality (AR) display) may project XR images (e.g., virtual images) onto an environment. In some instances, the projected XR images (e.g., virtual images) may appear with inconsistent opacity due to variations of light intensity from the environment. For example, an XR headset may run an application (e.g., Pokémon™ GO) causing augmented reality scenes by projecting Pokémon (e.g., XR images) onto the environment. A user, while running the Pokémon GO application on a respective XR device may attempt to catch Jigglypuff and fail due in part to obstructing elements in the FOV of the user. In one particular example, Jigglypuff may be projected in front of or adjacent to a bright light source, reducing its visibility to the user. In another particular example, highly reflective surfaces (e.g., white sand, snow, glass etc.,) may reflect light from the environment (e.g., sun) and reduce visibility of Jigglypuff. Accordingly, there exists a need in the art to provide XR images with selective opaque regions.

One approach for reducing light interference (e.g., light from the environment) may include activating polarizers to increase opacity of the entire display. This approach may increase contrast of the XR image however may be ineffective as it does not allow for selectively dimming locations on the display and may cause the whole display to be opaque. Additionally, blocking large portions of the XR display may decrease visibility of the surrounding environment and reduce spatial awareness which can be dangerous to XR users and those nearby.

Another approach for reducing light interference (e.g., light from the environment) may include activating a dimmable material of an XR device with a separate light source (e.g., activation light source). However, without pixel-level integration of the XR image source with the separate light source, the XR image and the activated regions of the dimmable material may be misaligned and cause regions on the XR display to be unnecessarily opaque.

Disclosed herein are systems, methods and devices (e.g., XR devices, XR HMDs, XR HUDs) capable of providing selective opacity control of XR images (e.g., XR content, virtual images, AR images).

XR devices (e.g., XR HMDs, and/or XR HUDs) utilizing see-through displays may benefit from light source(s) (e.g., LEDs, mini-LEDs, micro-LEDs or other suitable light emitting devices/sources) that combine, at pixel level, VIS (visible) LEDs (e.g., capable of providing XR image) and IR (infrared) LEDs (e.g., capable of providing opacity control). These light sources may improve XR images on see-through displays by causing selective portions of a dimmable material to activate with the displayed XR image (simultaneously or multiplexed).

Embodiments disclosed herein relate to systems for controlling opacity of XR images. In an example, the XR system comprises an XR display comprising a transparent waveguide layer, an infrared (IR) waveguide layer disposed on the transparent waveguide layer, and a dimmable layer disposed on the IR waveguide layer. The system further comprises a light source array configured to emit red light, green light, blue light, and IR light controllable on per-pixel level, and control circuitry configured to generate pixel-level drive signals to cause the light source (e.g., micro-LED) array to (i) emit a red light pattern, green light pattern and blue light pattern through the transparent waveguide layer to generate an XR image defined by the pixel-level drive signals, and (ii) emit an IR light pattern through the IR waveguide layer to the dimmable layer to change respective opacities of respective portions of the dimmable layer, on a pixel-level where respective portions of the dimmable layer correspond to portions of the XR display.

In some embodiments, the control circuitry of the XR system is further configured to determine a correlation between (a) drive signals causing the red light pattern, the green light pattern, and the blue light pattern, and (b) drive signals causing the IR light pattern, where the pixel-level drive signals are generated based at least in part on the determined correlation to cause the light source (e.g., micro-LED) array to emit the red, green, and blue light patterns in coordination with the IR light pattern.

In some embodiments, correlation is determined based at least in part on a weighted sum of luminance values associated with the red light pattern, the green light pattern, and the blue light pattern, and where the weighted sum is used to generate the corresponding IR light pattern.

In some embodiments, the XR system further comprises an ambient light sensor configured to detect ambient light conditions in an environment of the XR system, and the control circuitry is further configured to adjust an intensity of the IR light pattern emitted by the light source (e.g., micro-LED) array based at least in part on the detected ambient light conditions.

In some embodiments, the XR system further comprises a camera configured to detect ambient light conditions in an environment of the XR system, and the control circuitry is further configured to (a) adjust an intensity of at least one of the red light pattern, green light pattern, or blue light pattern emitted by the light source (e.g., micro-LED) array based at least in part on the detected ambient light conditions and (b) adjust an intensity of the IR light pattern, emitted by the light source (e.g., micro-LED) array based at least in part on the detected ambient light conditions.

In some embodiments, each of the transparent waveguide layers comprises a diffractive grating configured to in-couple and/or out-couple corresponding colored light.

In some embodiments, the IR waveguide layer comprises a diffractive grating configured to in-couple and out-couple corresponding IR light.

In some embodiments, the dimmable layer comprises an electrochromic, liquid crystal, or suspended particle material configured to modulate transmission of visible light in response to the IR light pattern.

In some embodiments, the control circuitry is further configured to apply different drive signals such that intensities of the IR light pattern applied to different regions of the dimmable layer spatially vary the opacity across the XR display.

In some embodiments, the light source (e.g., micro-LED) array and the control circuitry is further configured to operate in a time-multiplexed mode, alternating between emitting the red light pattern, the green light pattern, and the blue light pattern for image generation with emitting the IR light pattern for dimming control.

In some embodiments, the transparent waveguide layer further comprises a first transparent waveguide layer, configured to diffract red light, a second transparent waveguide layer, configured to diffract green light, and a blue transparent waveguide layer configured to diffract blue light.

Embodiments disclosed herein relate to a micro-LED array (e.g., light source array) which may allow XR systems to provide opacity control of XR images at pixel level. In an example, the XR system comprises a micro-LED array (e.g., light source array), the micro-LED array further comprises a plurality of pixel control elements, each pixel control element of the plurality of pixel control elements comprises a plurality of layers arranged in a vertical stack. The vertical stack may comprise a first LED that comprises (a) a first active region of a first width configured to emit light in a first wavelength range, (b) a first p-type region disposed over the first active region, (c) a first n-type region disposed under the first active region, and (d) a first contact electrically connected to the n-type region. The vertical stack may comprise a second LED disposed over the first LED and communicatively coupled (e.g., electrically) thereto by a first layer, the second LED comprising (a) a second active region of a second width smaller than the first width configured to emit light in a second wavelength range, (b) a second p-type region disposed over the second active region, (c) a second n-type region disposed under the second active region, and (d) a second contact communicatively coupled (e.g., electrically) to the second n-type region. The vertical stack may comprise a third LED disposed over the second LED and communicatively coupled (e.g., electrically) thereto by a second layer, the third LED comprising (a) a third active region of a third width smaller than the second width configured to emit light in a third wavelength range, (b) a third p-type region disposed over the third active region, (c) a third n-type region disposed under the third active region, and (d) a third contact communicatively coupled (e.g., electrically) to the third n-type region. The vertical stack may comprise a fourth LED disposed over the third LED and communicatively coupled (e.g., electrically) thereto by a third layer, the fourth LED comprising (a) a fourth active region of a fourth width smaller than the third width configured to emit light in a fourth wavelength range, (b) a fourth p-type region disposed over the fourth active region, (c) a fourth n-type region disposed under the fourth active region, and (d) a fourth contact communicatively coupled (e.g., electrically) to the fourth n-type region.

In some embodiments, the first n-type region comprises a fifth width larger than the first width, and the first contact is disposed on a portion of the first n-type region that extends past the first width.

In some embodiments, the second n-type region comprises a sixth width larger than the second width, and the second contact is disposed on a portion of the second n-type region that extends past the second width.

In some embodiments, the third n-type region comprises a seventh width larger than the third width, and the third contact is disposed on a portion of the third n-type region that extends past the third width.

In some embodiments, the fourth n-type region comprises an eighth width larger than the fourth width, and the fourth contact is disposed on a portion of the fourth n-type region that extends past the fourth width.

In some embodiments, the micro-LED array further comprises a fourth layer disposed over the fourth LED and communicatively coupled (e.g., electrically) thereto a fifth n-type region, and a fifth contact disposed over the fifth n-type region.

In some embodiments, the first LED is a blue LED, and the first wavelength range is a blue wavelength range.

In some embodiments, the second LED is a green LED, and the second wavelength range is a green wavelength range.

In some embodiments, the third LED is a red LED, and the third wavelength range is a red wavelength range.

In some embodiments, the fourth LED is an IR LED, and the fourth wavelength range is an IR wavelength range.

In some embodiments, light intensity data includes luminance values.

In some embodiments, the system (e.g., corresponding to device and/or applications) may apply the drive signal to control the dimmable material, and may be further configured to generate IR light corresponding to an intensity value and directed at locations of the dimmable material that may be dimmed, the IR light directed at a particular location of the dimmable material may cause the particular location to be dimmed in proportion to the intensity value.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and should not be considered limiting of the breadth, scope, or applicability of these concepts. It should be noted that for clarity and ease of illustration, these drawings are not necessarily made to scale.

Figure 1A:
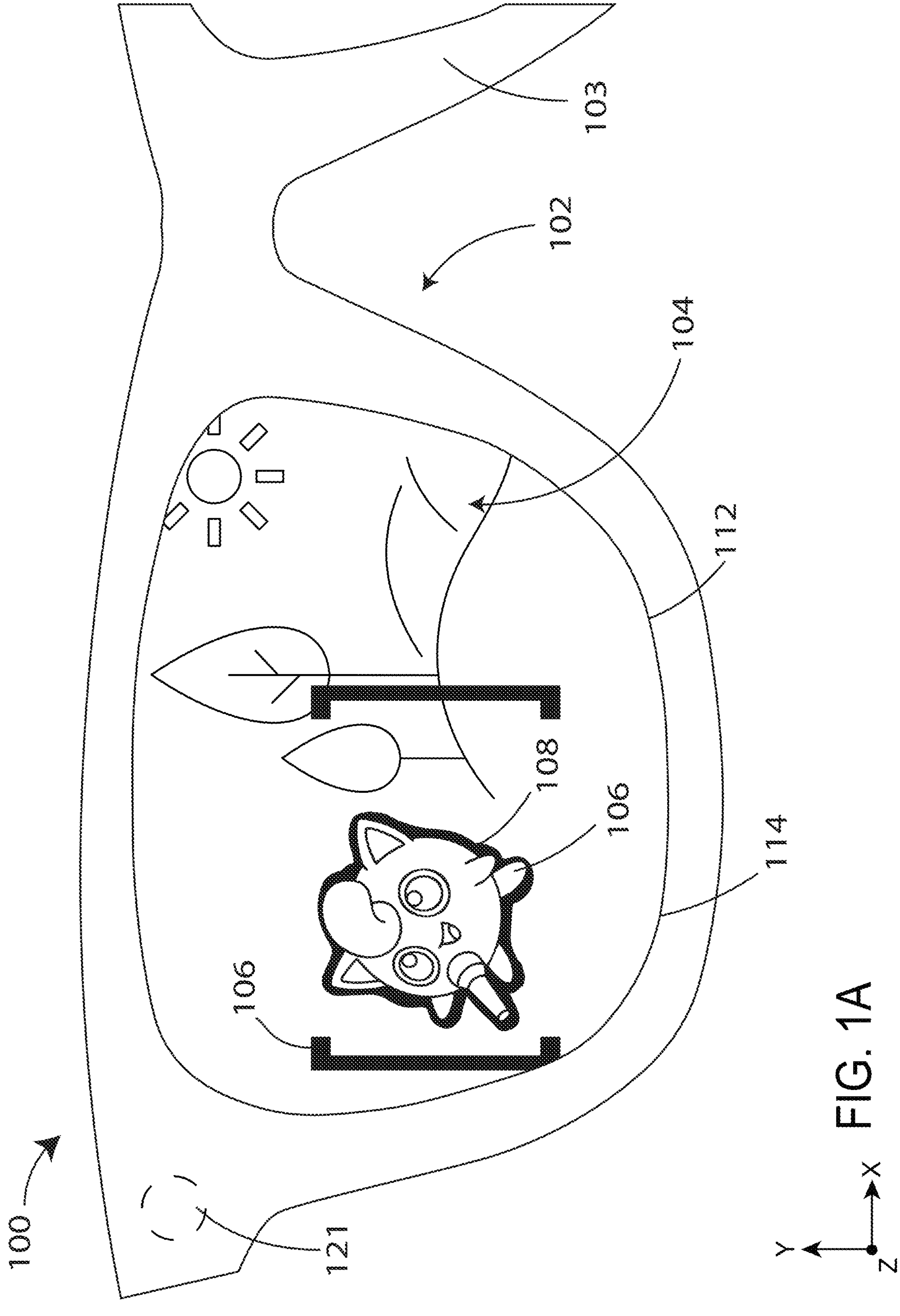
FIG. 1A schematically illustrates an example view of a device, according to some embodiments.

The figures herein depict various embodiments of the disclosure for purposes of illustration only. It will be appreciated that additional or alternative structures, assemblies, systems, and methods may be implemented within the principles set out by the present disclosure.

DETAILED DESCRIPTION

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood that the embodiments and examples described herein may be practiced without these specific details. In other instances, well-known methods, procedures and components, including software, firmware and hardware components, have not been described in detail so as not to obscure the embodiments described herein. Also, the description is not to be considered as limiting the scope of the embodiments described herein.

Embodiments described herein relate to systems and corresponding device structures configured to support extended reality (XR) functionalities, including virtual reality (VR), and/or augmented reality (AR). Advances in computing and display technologies have facilitated the development of XR systems for delivering so-called "virtual reality" and/or "augmented reality" experiences. In general, such systems are configured to present digitally rendered images, or portions thereof, in a manner that causes the images to appear real and/or physically present to a user. In some approaches, projection optics may be employed by an XR device (e.g., XR HMD, XR HUD) to generate virtual image planes, wherein light from the digitally rendered content is refracted or directed such that the resulting image appears to originate from a perceived depth or spatial location within the user's environment.

In a VR scenario, digital content may be presented without transparency to the surrounding environment, thereby occluding real-world visual input from the user. For example, when the device reduces or eliminates optical transparency, the user may become fully immersed in a virtual environment, such as gaming applications, virtual worlds, metaverse platforms, or media experiences (e.g., movies or shows) without distraction from real-world elements (e.g., ambient light), which might otherwise reduce the visibility or perceived realism of the XR content being displayed.

Conversely, in an AR scenario, the device may maintain sufficient optical transparency to allow the user to perceive the surrounding physical environment. In such cases, digital content is overlaid on, or integrated with, the user's view of the real world, thereby augmenting the user's perception of their actual environment. The digital content may include images, annotations, graphical user interfaces, animations, videos and/or interactive elements that appear spatially registered with real-world objects or locations. AR functionality may be facilitated through optical elements such as waveguides, beam combiners, or partially reflective surfaces that blend real-world light with virtual imagery. In some embodiments, sensors (e.g., cameras, inertial measurement units (IMUs), or depth sensors) may be used to track the user's environment and head position, enabling context-aware and spatially accurate rendering of the virtual content.

In some examples, XR functionalities are provided by optical see-through (OST) displays and/or video see-through displays (VST).

FIGS. 1A-1D generally depict various example perspectives and embodiments of system 100 including XR device 102. In some embodiments, system 100 may be an XR system capable of (i) displaying XR images 106 (e.g., AR images), (ii) generating virtual image planes, (iii) generating augmented reality scenes, and (iv) generating virtual reality scenes or a combination thereof. In some embodiments, XR device 102 comprises an XR display 112 capable of displaying XR images 106 (e.g., Jigglypuff) through the architecture of system 100 described herein.

FIGS. 1A-1D, 2, 3A-3D, 4A-4C, 5, 6-7, 8, 9, 10A-10B, and 11 schematically illustrate various embodiments of the disclosed systems and/or corresponding device structures. The features of system 100 generally depicted in FIGS. 1A-1D may be applied, combined, interchanged, or modified to operate with other systems and/or XR devices described in the present disclosure (e.g., any of system 200, system 340, system 500, system 600, system 60, system 700, system 800, system 900, and system 1100, XR device 202, XR device 502, device 709A, device 709B, XR device 802A, XR device 802B or any suitable system and/or device described throughout the present disclosure).

Although FIGS. 1A-1D, 2, and 8 generally depict head-worn XR devices (e.g., XR HMDs), systems and methods described throughout the present disclosure may be applied to any suitable transparent displays (e.g., OSTs displays) capable of providing XR images. In one general example, other XR devices may include HUDs (e.g., vehicle HUDs), and transparent monitors.

FIG. 1A schematically illustrates system 100. In particular FIG. 1A shows a partial back planar view of XR device 102, according to some embodiments. XR device 102 may be an XR HMD (e.g., AR HMD) configured to display XR images. As generally shown, XR device 102 (e.g., XR HMD) (e.g., running an XR application) may comprise a frame 103, an XR display 112, a dimmable layer 114, and an imaging system 121.

It may be understood that the perspective illustrated in FIG. 1A represents the perspective of a user wearing XR device 102 (e.g., XR HMD) (e.g., running an XR application). A user wearing XR device 102 may observe an environment 104 (e.g., real-world scene) comprising trees, hills, and sun. In some embodiments, XR device 102 (e.g., XR HMD) (e.g., running an XR application) may be configured to implement system 100. In some embodiments, system 100 may be configured to present XR images 106 (e.g., AR images, Jigglypuff) onto the environment 104.

In some embodiments, the dimmable layer 114 may be overlaid (e.g., fully or partially) with XR display 112. In some embodiments, the dimmable layer 114 may be selectively activated to provide an opaque object 108. In some embodiments, the dimmable layer 114 may be selectively activated such that the opaque object 108 appears directly behind and/or adjacent to the XR image 106.

In the example shown in FIG. 1A, an XR image 106 (e.g., the Pokémon character Jigglypuff) is rendered by system 100 (e.g., by means of optical projection) to appear at a distance within the environment 104. In some embodiments, the XR image 106 (e.g., Jigglypuff) may be displayed in a manner that appears spatially consistent with the user's environment such as standing on the ground or integrated with real-world terrain. In some embodiments, the dimmable layer 114 overlaying the XR display 112 may be selectively activated (e.g., opaque object 108) immediately, or substantially behind the XR image 106 (e.g., Jigglypuff). In some embodiments, the opaque object 108 may be smaller than the XR image 106. In some embodiments, the opaque object 108 may be larger than the XR image 106. In some embodiments, the dimmable layer 114 may be fully activate completely blocking light from environment 104 to provide VR scenes.

In some embodiments, by activating the dimmable layer 114 the contrast of the XR image 106 may be enhanced. For example, system 100 may cause an XR image 106 to appear on XR device 102 within the environment 104. In some instances, the environment 104 may be too bright and cause the XR image 106 to appear washed out. A washed-out appearance may be understood to derive from a low contrast ratio between light intensities of the XR image 106 to the light intensities of the environment 104. In some embodiments, activating the dimmable layer 114 may change the contrast ratio between the environment 104 and the XR image 106. In some instances, activating the dimmable layer 114 may cause the XR image 106 to appear brighter.

In some instances, activating the dimmable layer may cause the user's eyes to be saturated with light from the XR image 106 instead of light from the environment 104 (e.g., light of the sun or any other reflections and/or artificial sources). Additionally, activation of the dimmable layer 114 may increase the perceived opaqueness of the XR image 106, and in some instances may help to prevent it from appearing unnaturally translucent or ghost-like and may therefore improve realism and visual coherence within the scene.

Although FIG. 1A generally depicts system 100 being applied to XR device 102 (e.g., Meta Quest 3 glasses, Apple Vision Pro, or similar augmented reality and virtual reality headsets and wearables), system 100 may be implemented on other XR devices. Some examples include a windshield display for a car, aircraft, or other suitable vehicle; a transparent display (e.g., a transparent microLED panel); a glass screen or architectural window; or any other transparent or semi-transparent substrate capable of transmitting and/or reflecting incident light for the projection of XR images.

In some embodiments, XR device 102 may include optical elements like mirrors, lenses, and/or coated surfaces configured to present virtual content.

In some embodiments, system 100 may be incorporated into a software application executable, for example, by XR device 102 and/or any computational device (e.g., smartphone, tablet, laptop or similar computing device) communicatively connected to XR device 102. For example, XR device 102 may receive image data corresponding to XR image 106 via a mobile device. In one example, a user may run an XR application (e.g., Pokémon GO) on a computing device (e.g., a smartphone) which may be communicatively connected to XR device 102 (e.g., XR HMD). Once connection between XR device 102 and the computational device is established, XR device 102 may receive XR data (e.g., data comprising graphical assets and animation sequences for a virtual Pokémon character Jigglypuff) from the connected XR application (e.g., Pokémon GO). In response to receiving XR content from the computational device, XR device 102 may provide an augmented reality (e.g., XR image 106, Jigglypuff) experience for the user.

In some embodiments, XR device 102 may be communicatively coupled to the computational device via any suitable wireless or wired communication protocol. Examples include Bluetooth, Wi-Fi, near-field communication (NFC), 5G, ultra-wideband (UWB), or a physical connection (e.g., USB-C, Lightning cable), further described, for example, in FIGS. 6-7.

In some embodiments, system 100 and corresponding XR device 102 may utilize techniques for dimming optical materials, such as photochromic or electrochromic elements, as described in U.S. Patent Publication No. 2024/0404223 A1, which is hereby incorporated by reference herein in its entirety. These techniques may be used to dynamically modulate the opacity or transmission characteristics of a dimmable material (e.g., dimmable layer 114) in response to target opacity, ambient light conditions, user preferences, or display content.

In some embodiments, XR device 102 comprises imaging system 121. In some embodiments, imaging system 121 comprises a front-facing camera or detector configured to capture data from the surrounding environment 104 (e.g., within the field of view (FOV) of XR device 102). In an example, imaging system 121 may capture data including, positional information associated with real-world objects, and/or measurements of light intensity within environment 104. Data received by imaging system 121 may be used to support various XR functionalities, including spatial mapping, object recognition, environmental awareness, and adaptive display adjustments (e.g., modifying brightness or dimming levels).

Figure 1B:
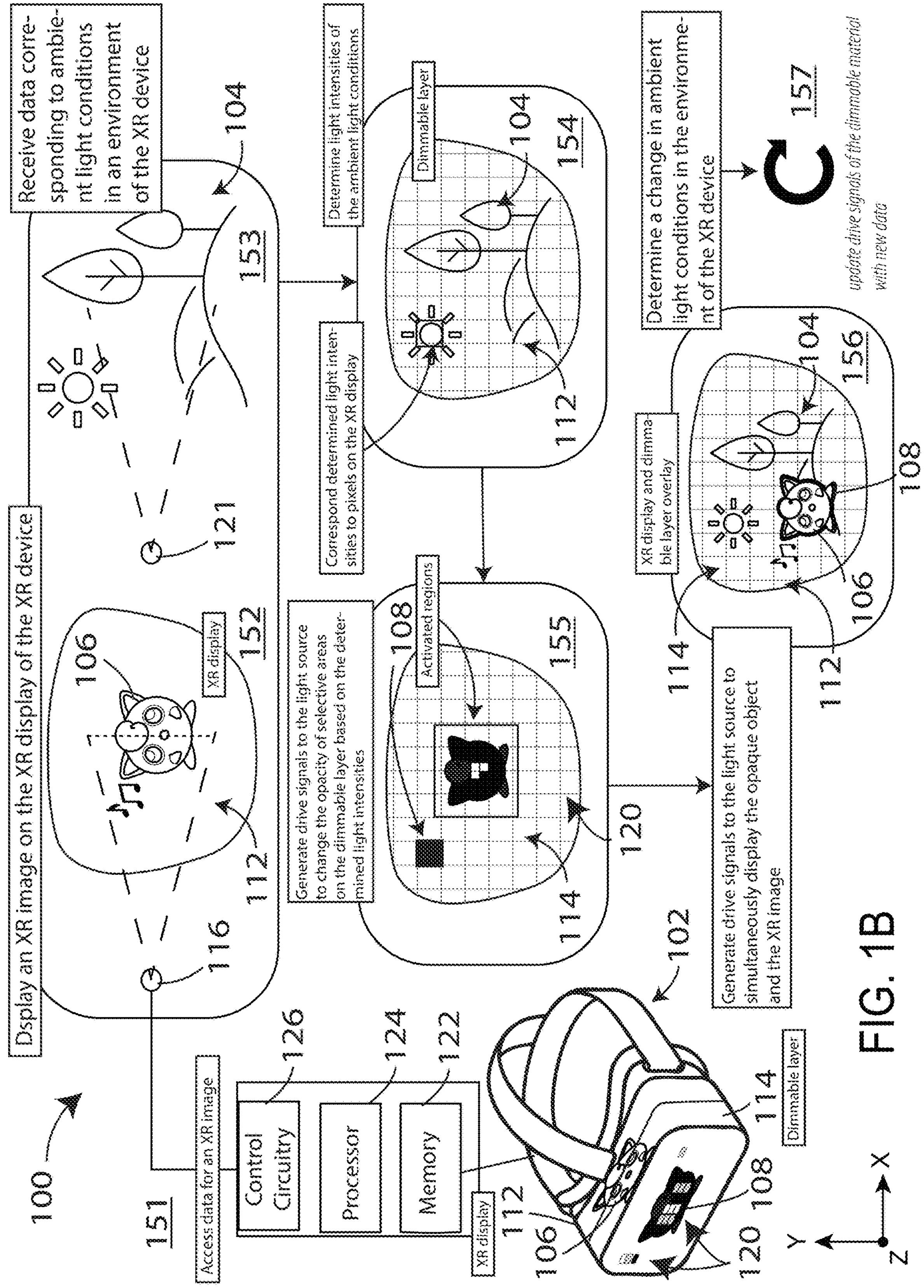
FIG. 1B is a block diagram illustrating a system for driving a dimmable material of a device, according to some embodiments.

FIG. 1B schematically illustrates example techniques for dynamically adjusting one or more regions of a dimmable layer 114, based on received light conditions of the surrounding environment 104, in accordance with some embodiments. XR device 102 (e.g., XR HMD) (e.g., running an XR application) is shown generally as an isometric schematic comprising an XR display 112, and a dimmable layer 114. While running an XR application the XR device 102 may display an XR image 106 (e.g., Jigglypuff) and opaque object 108.

As generally depicted in FIG. 1B selective pixels (e.g., pixels 120) may be activated on the dimmable layer 114 to provide variations in opacity. In some embodiments, pixels 120 may are displayed on the dimmable layer 114 as comprising varying transparencies levels (e.g., white, black and gray). In one example, a black pixel may be understood to be highly opaque (e.g., comprising an absorption spectrum absorbing at or above 70% visible light), a gray pixel may be understood to be moderately opaque (e.g., between 30%-70% visible light absorption), and a white pixel may be understood to be lightly or not opaque (e.g., at or below 30% visible light absorption). In some embodiments, these transparency/opaqueness levels may represent the relative amount of ambient background light allowed to pass through XR display 112.

As generally depicted, system 100 may include XR device 102 (e.g., XR HMD) (e.g., running an XR application) comprising XR display 112, dimmable layer 114, control circuitry 126, processor 124, and memory 122.

In some embodiments, the term "pixels" (e.g., pixels 120) in reference to the dimmable layer 114 may be understood as the smallest resolvable area of light projected onto the dimmable layer 114 by a corresponding light source (e.g., light source 116). Unlike traditional displays (e.g., computer monitors with physical pixel arrays), the dimmable layer 114 or XR display 112 may not contain physical pixels. Instead, pixels represent the effective resolution of the projected optical output from light source 116, forming an XR image 106 and corresponding opaque object 108. In some embodiments, certain XR display systems, such as augmented reality glasses (e.g., Meta Quest 3 glasses), images may be created by the projected light rather than discrete pixel elements in the display medium.

Additionally, the features described herein are not limited to projective display configurations. In some embodiments, XR display 112 may be another type of display, some examples of which include, liquid crystal displays (LCDs), transparent displays, transparent electronic devices, transparent microLED displays, and other suitable transparent display technologies.

In some embodiments, system 100 may begin at step 151, where the XR device 102 (e.g., XR HMD) (e.g., running an XR application) may accesses data for XR image 106. In some embodiments, accessing data for the XR image 106 may include retrieving content from local memory or from a remote source, such as a cloud-based server (e.g., 704 of FIG. 7). For example, the XR image 106 may correspond to a virtual character (e.g., Jigglypuff), and the associated data may include graphical assets, animation sequences, interaction metadata, or contextual placement information used for rendering. In some embodiments, the metadata corresponding to the XR image 106 may be saved on the memory 122 on the XR device 102. In some embodiments, the XR application running on XR device 102 may access and receive metadata corresponding to the XR image 106 from a remote server associated with the XR application.

In some embodiments, XR image 106 may represent any suitable media content, including but not limited to animated characters, still images, video clips, three-dimensional models, and/or other visual or audiovisual elements configured for presentation within an XR environment.

In one example, prior or subsequent to accessing data for XR image 106 (e.g., step 151) a target opacity may be established by system 100. In some embodiments, target opacity may be established through system settings (e.g., saved on XR device 102) in a corresponding XR application. In one particular example, a user may set an opacity value for XR images 106 to be completely opaque. In response, system 100 (e.g., running XR application) may send drive signals to light source 116 and cause IR light to emit at maximum power.

In some embodiments, system 100 on XR device 102 may prompt a user (e.g., via the user interface on XR device 102) to calibrate the appearance of an XR image 106 to a desired opacity and brightness (e.g., under various ambient lighting conditions). For example, the XR device 102 may display an XR image 106 while simultaneously recording the ambient light conditions of the environment. The XR device 102 may then prompt the user to adjust the opacity and brightness of the XR image 106, via an adjustable opacity layer, to a desired level. The XR device 102 may then record the user's selected settings (e.g., desired brightness level of XR images), including an approximate luminance value derived from the adjusted brightness. This recorded luminance value may serve as a baseline for automatically adjusting the XR image 106 in response to changes in ambient light conditions.

In some embodiments, the XR device 102 may measure and record ambient light conditions of the environment 104, including parameters such as luminance values, irradiance values, or ambient exposure values. These measurements may be used to characterize the lighting context during the user calibration process described in or to monitor changes in ambient light conditions. The recorded ambient light data may be stored in memory 122 and serve as input for dynamically adjusting the XR image 106 and the dimmable layer 114 to maintain the user's preferred appearance under varying environmental lighting conditions.

In some embodiments, system 100 may offer a plurality of predefined display configurations, each comprising a unique combination of XR image 106 brightness and dimmable layer 114 opacity, this may be controlled by corresponding drive signals to the light source 116. For example, the XR device 102 may prompt the user to select a preferred configuration from these options under specific ambient light conditions. Upon receiving the user's selection, system 100 may store a calibrated relationship, such as a ratio or mapping function, between the ambient light intensity and the desired XR image visibility in memory 122. This stored calibration data may allow the XR device 102 to dynamically adjust the drive signals to the light source 116, to maintain XR image appearance as ambient light conditions change.

In some embodiments, the XR device 102 may present the user with an XR image 106 rendered at a fixed display intensity (e.g., a predefined luminance value or optical output) while sequentially adjusting the dimmable layer 114 (e.g., by emitting IR light patterns from light source 116) to cycle through multiple opacity levels (e.g., transmission levels ranging from 10% to 90%). The system 100 may prompt the user to select the configuration in which the XR image 106 appears most visually clear or comfortable under the current ambient lighting conditions of the environment 104. The selected configuration may define a target ratio between the luminance of the XR image 106 and the measured ambient light intensity of the environment 104. This target ratio may be stored in memory 122 and used by the system 100 to dynamically adjust the drive signals to the light source 116 and dimmable layer 114 in response to changes in ambient light conditions.

In an illustrative example, the XR device 102 may display an XR image 106 at a fixed luminance of 300 nits (where one nit equals one candela per square meter) while cycling portions of the dimmable layer 114 through five optical transmission levels (e.g., 10%, 30%, 50%, 70%, and 90%). The user may select the configuration with 30% transmission, corresponding to a target ratio of 1.5 between the XR image luminance (300 nits) and the effective ambient light intensity (e.g., 200 nits after attenuation). When ambient light intensity later increases to 400 nits, the system 100 may apply the stored target ratio by adjusting the drive signals of the light source 116 causing the opacity levels on the dimmable layer 114 to change accordingly. In some instances, this may reduce the perceived background light intensity to approximately 200 nits.

In some embodiments, an application developer may specify a desired target opacity level for a rendered XR image 106 through an application programming interface (API), such as a 70% light transmission level. To achieve this target opacity, the XR device 102 may control the intensity of the light source 116 (e.g., a microLED, OLED, or other suitable light emitter) at the pixel level. Based on measurements of ambient light luminance (e.g., in nits, derived from sensor data) and the projected light from the XR image 106 at each pixel location, the system 100 may selectively adjust the dimmable layer 114 (e.g., via IR emission) to achieve a spatially uniform appearance corresponding to the specified 70% opacity across the XR image 106.

In some examples, target opacity may originate from application logic (e.g., an XR app defining a transparency level for an XR image), developer-defined parameters, or user-selected display preferences. In some embodiments, by providing mechanisms for dynamic, pixel-level opacity control that adaptively responds to both real-time environmental lighting and user-defined transparency targets, systems described herein may provide for better contrast between the XR image and light originating from the environment.

In some embodiments, system 100 may capture environmental data (e.g., ambient light data) from one or more external or non-integrated cameras and/or light sensors. For example, system 100 may receive light intensity measurements from an external light sensing device (e.g., a paired smartphone camera, a standalone photodiode array, ambient light meters, or a networked sensor node located within a smart room or automotive cabin). In some embodiments, the external light sensing device(s) may supplement or replace internal sensing components (e.g., imaging system 121). In some embodiments, data from non-integrated (e.g., external) sources may be communicated to system 100 via a wired or wireless communication interface (e.g., Bluetooth, Wi-Fi, or USB, described in relation to FIGS. 6-7), and used to adjust drive signals of light source 116.

At step 152, XR device 102 (e.g., XR HMD) (e.g., running an XR application) may generates the XR image 106 (e.g., Jigglypuff) for rendering on XR display 112 using light source 116. In some embodiments, the XR image 106 may be generated by projection optics or other suitable optical components configured to form a virtual image. The projection optics may include, for example, lenses, mirrors, beam combiners, spatial light modulators, or waveguides configured to guide and shape image light toward the user's eye. In some embodiments, these optics may be positioned between the light source 116 and XR display 112. In some embodiments, these optics may be disposed within the XR display 112.

In some embodiments, the light source 116 may include a micro-display-based engine (e.g., a liquid crystal on silicon (LCOS), organic light-emitting diode (OLED), or micro-LED display), a laser-based projection system, or any other suitable light-emitting structure used to project and render the XR image 106. In some embodiments, the light source 116 may comprise a plurality of light sources, which may be used in combination to achieve desired luminance and optical characteristics. For example, a micro-LED display may be paired with a laser-based projection system to enhance the brightness and clarity of the XR image 106 under varying ambient light conditions At step 153, imaging system 121 of XR device 102 (e.g., an XR HMD) may capture data corresponding to ambient light conditions (e.g., within the XR devices FOV). In some embodiments, the captured data may include spatially resolved measurements of light intensity, directionality, or changes in environmental illumination over time. In some embodiments, imaging system 121 may perform active scanning to obtain such data (e.g., through frame-by-frame analysis or depth-aware sampling). In other embodiments, XR device 102 may comprise one or more ambient light sensors or a distributed array of photodetectors positioned on or near the device chassis, which may passively measure incident light from multiple directions to produce an ambient light intensity map.

In some embodiments, imaging system 121 may operate as a passive imaging sensor (e.g., RGB or grayscale camera) capable of capturing ambient light distributions across the FOV without active scanning. Accordingly, any suitable optical or optoelectronic sensing system capable of capturing environmental light data may be used to carry out step.

In some embodiments, the imaging system 121 of the XR device 102 may include one or more sensors to measure ambient light conditions of the environment 104.

These sensors may include: (i) ambient light sensors (ALS), such as silicon photodiodes, configured to measure broadband visible or near-infrared light; (ii) multi-directional photodiode arrays, oriented around the device chassis to capture angular light incidence data; (iii) RGB or RGB-IR cameras with CMOS or CCD image sensors, configured to measure spatially resolved luminance (e.g., in nits) and chromaticity; (iv) grayscale sensors or monochrome cameras for low-power intensity mapping; (v) spectral sensors to capture wavelength-specific intensity distributions, including UV and IR bands; (vi) time-of-flight (ToF) or structured light sensors to indirectly detect environmental lighting via reflected IR patterns; or (vii) single-photon avalanche diode (SPAD) arrays for high-dynamic-range and low-light conditions. In some embodiments, the sensor array may include a fusion of two or more types of these sensors.

In some embodiments, imaging system 121 may further comprise one or more emission sources configured to actively illuminate the environment 104 (e.g., to trigger or enhance sensor measurements). For example, imaging system 121 may include: (i) an IR light source (e.g., VCSEL array or IR LED) (e.g., to support time-of-flight (ToF) or LiDAR measurements); (ii) structured light projectors (e.g., to emit coded patterns for spatial triangulation); (iii) UV light sources (e.g., to excite photo responsive surfaces or fluorescent targets); and/or (iv) narrowband LED arrays (e.g., red, green, blue, or near-IR) synchronized with imaging sensors (e.g., configured to isolate spectral bands or reduce ambient interference). In some embodiments, these emission sources may be modulated or pulsed (e.g., via control circuitry 126 on XR device 102) in coordination with sensor readout cycles.

At step 154, system 100 may correspond (e.g., map) light intensities associated with the surrounding environment 104 to locations on the XR display 112. For example, imaging system 121 may include inward-facing cameras configured to track the user's eye position and gaze direction. By identifying a gaze vector and correlating it with the spatial location of detected light intensity values, system 100 may estimate which area on XR display 112 correspond to the user's line of sight.

System 100 may analyze incoming light data and determine which locations on XR display 112 correspond to specific objects and/or regions of the scanned environment, based on the images and/or captured light intensity values of imaging system 121.

In some embodiments, the FOV of the XR display and FOV of imaging system 121 may directly correspond to one another.

In the example generally depicted in FIG. 1B, at step 154, imaging system 121 may be an outward-facing imaging system configured to detect light intensity above a threshold.

In this particular example, system 100 may determine that a bright spot (e.g., sun) is in view of the FOV of the XR display 112. In response to identifying the bright spot, system 100 may automatically initiate opacity control (e.g., causing an area corresponding to the bright spot). System 100 may then determine which location on the dimmable layer 114 need to be activated.

In some embodiments, the XR device 102 may comprise inward facing cameras to track a user's gaze. In some embodiments, determining which location on the XR display 112 corresponds with the bright spot (e.g., sun), may be based partially on the direction of the user's gaze vector. The area corresponding to the bright spot (e.g., sun) on XR display 112 and dimmable layer 114 may be identified.

At step 155, system 100 may generate drive signals, for example via internal control circuitry 126, to activate respective pixels on light source 116 causing the dimmable layer 114 to activate (e.g., opaque object 108).

In some embodiments, the control circuitry 126 of the XR device 102 may be configured to manage the rendering and adjustment of the XR image 106 and dimmable layer 114, (e.g., consistent with the calibration and dynamic adjustment processes described earlier). The control circuitry 126 may perform functions including: (i) enabling or disabling pixels of the light source 116, to generate the XR image 106; (ii) adjusting the intensity of light emission from each pixel of the light source 116 to achieve desired luminance levels (e.g., 300 nits); and (iii) controlling the opacity of the dimmable layer 114 (e.g., by driving emission intensity and specific pixels of the IR light from light source 116) to maintain a spatially uniform appearance or target opacity (e.g., 70% transmission).

In some embodiments, the control circuitry 126 coordinates display rendering, light modulation, sensor input processing, and drive signal generation for optical and electronic components of the XR device 102, including the light source 116.

In some embodiments, the control circuitry 126 coordinates display rendering, light modulation, sensor input processing, and drive signal generation for optical and electronic components of the XR device 102, including the light source 116 and dimmable layer 114. For example, the control circuitry 126 may receive input from external applications (e.g., augmented reality apps like Pokémon GO) via an application programming interface (API), to trigger rendering of the XR image 106 or adjust the opacity of the dimmable layer 114. Based on this input, the control circuitry 126 may generate drive signals to the light source 116 to control pixel luminance and to the dimmable layer 114.

In some embodiments, a pixel or localized region of the dimmable layer 114 corresponding to an identified high-intensity light source (e.g., direct sunlight, glare from reflective surfaces, or artificial lighting) may be selectively activated to attenuate or block incoming light at that location. In some embodiments, the drive signals may be used to drive a light source causing both visible light that generates an XR image 106 and IR light that causes the dimmable material to activate (e.g., opaque object 108), to overlay uniformly as generally depicted at step 156.

In some embodiments, the drive signal may be generated based on input from one or more sensor systems (e.g., imaging system 121 and/or inward-facing eye-tracking cameras), which provide spatially resolved light intensity data mapped to the user's FOV and/or XR display's FOV. In some implementations, the dimmable layer 114 may comprise electrochromic, photochromic, liquid crystal, or other light-modulating materials capable of regional or pixel-level optical modulation in response to applied control signals.

In some embodiments, generating a drive signal to activate a region of the dimmable layer 114 may include directing a light source such as an infrared (IR) or ultraviolet (UV) emitter toward the dimmable material to induce a material state change (e.g., a darkened or light-absorbing state). In some instances, this may modulate light transmission in specific regions of the user's FOV. In some embodiments, the light source may be the same or have similar features to the light sources described in FIGS. 4A-4C.

At step 156, system 100 may provide drive signals to light source 116 such that the XR image 106 is displayed simultaneously with activated portions of the dimmable layer (e.g., opaque object 108).

In some embodiments, the XR image 106 and an opaque object 108 may be overlaid or substantially overlaid within the user's FOV. In certain implementations, the overlay may be determined based at least in part on the user's gaze vector, as tracked by inward-facing cameras or other eye-tracking sensors. In some embodiments, the overlay may correspond to a pixel-to-pixel mapping between XR display 112 and dimmable layer 114, based on alignment of the hardware layers.

In some embodiments, the light source 116 may be configured to emit both visible (VIS) and infrared (IR) light (e.g., light source 400 of FIG. 4A), to provide simultaneous generation of the XR image 106 and activation of the dimmable layer 114 (e.g., opaque object 108). For example, when the system 100 generates drive signals, via control circuitry 126, to render the XR image 106, the pixels of the light source 116, may emit VIS light to form the XR image 106 and IR light to selectively activate the dimmable layer 114. In some embodiments, the control circuitry 126 may coordinate these drive signals based on calibration data stored in memory 122, such as target ratios or opacity settings.

At step 157, the system 100 may detect a change in ambient light conditions in the environment of the XR device 102 and update the drive signals to the dimmable layer 114 based on the detected conditions. For example, when a user transitions from an indoor setting to a brightly lit outdoor environment, the imaging system 121 may detect an increase in ambient light luminance (e.g., measured in nits). In response, the control circuitry 126 may dynamically adjust the drive signals to the dimmable layer 114 (e.g., via light source 116), to increase opacity in specific regions, thereby attenuating the perceived background luminance.

At step 158, the system 100 may detect a change in the position or orientation of the XR device 102 (e.g., based on data from an inertial measurement unit (IMU) or head-tracking sensors) and update the drive signals to the dimmable layer 114 to adapt to the new viewpoint. For example, when a user turns their head toward a brighter light source, the imaging system 121 may detect an increase in ambient light luminance (e.g., measured in nits) from the new direction. In response, the control circuitry 126 may dynamically adjust the drive signals to the dimmable layer 114, to increase opacity in regions corresponding to the brighter light source, thereby attenuating its impact and maintaining the visibility and contrast of the XR image 106. In some embodiments, system 100 may detect a change in position and trigger ambient light readings.

In another embodiment, the system 100 may detect a shift in objects within the environment 104, such as by analyzing changes in an infrared (IR) depth map generated by the imaging system 121 (e.g., using time-of-flight or structured light sensors). For example, if a reflective object (e.g., a moving vehicle or glass surface) enters the field of view and alters the ambient light distribution, the control circuitry 126 may adjust the drive signals to the dimmable layer 114 to selectively increase opacity in affected regions.

In further embodiments, the system 100 may respond to subtle variations in ambient light luminance. For example, a slight increase in luminance (e.g., measured in nits) due to a passing cloud or gradual sun movement may be detected by the imaging system 121 using light sensors or image data analysis. In response, the control circuitry 126 may fine-tune the drive signals to the dimmable layer 114, using photochromic or electrochromic mechanisms, to adjust the opacity in specific regions. In some embodiments, imaging system 121 may be communicatively coupled to a video/image analyzer configured to receive image and determine elements via object recognition.

Figure 1D:
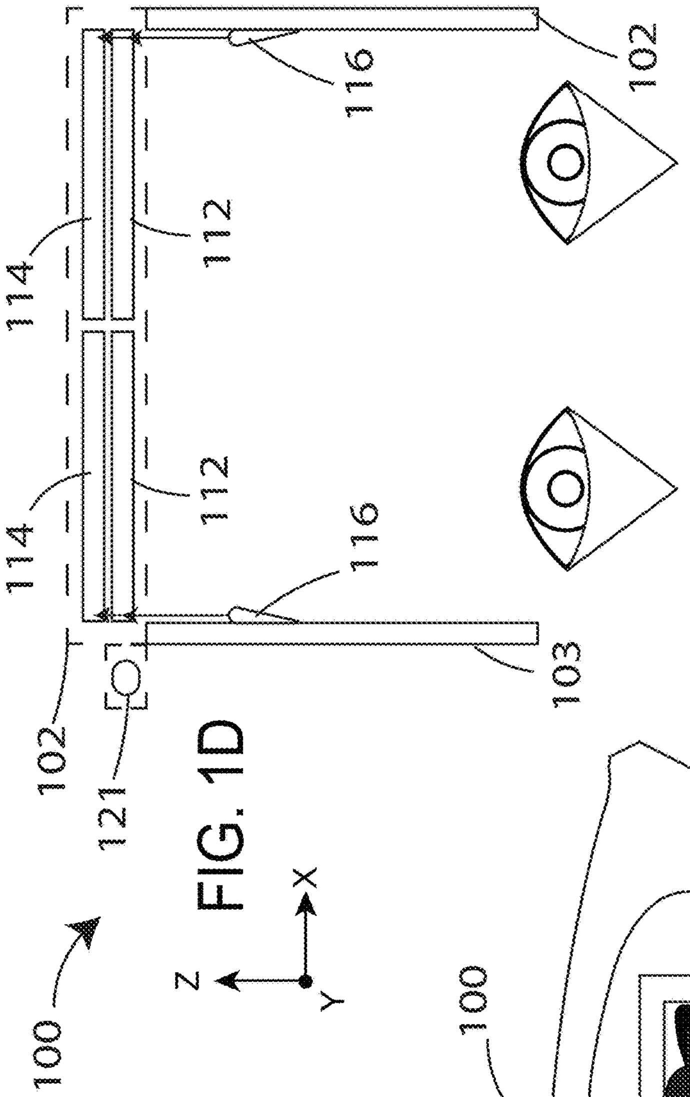
FIG. 1D schematically illustrates an example a top-down view of a device, according to some embodiments.
Figure 1C:
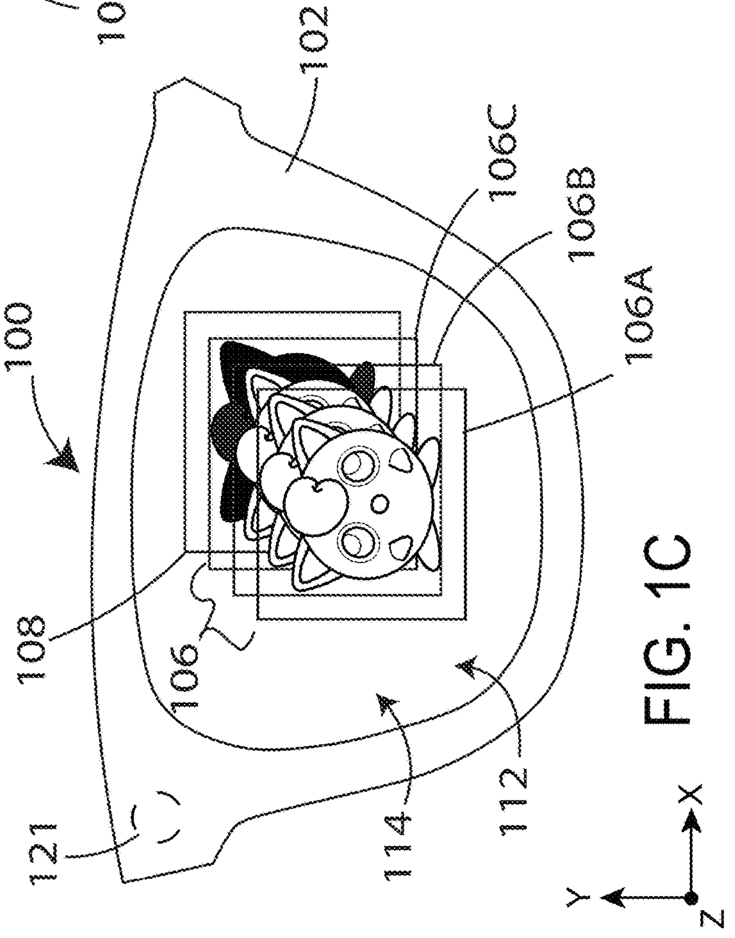
FIG. 1C schematically illustrates an example view of a device, according to some embodiments.

FIG. 1C schematically illustrates system 100 and XR device 102 (e.g., XR HMD) (e.g., running an XR application), according to some embodiments. FIG. 1C generally depicts how XR image 106 (e.g., Jigglypuff) may be comprised of multiple layers (e.g., a first layer 106A, second layer 106B, and third layer 106C). Although there are three layers in the example, any suitable number of layers may be used (e.g., one, three, five, or more). In some embodiments, each layer (e.g., a first layer 106A, second layer 106B, and third layer 106C) may correspond with a particular color. For example, the first layer 106A may correspond to blue, the second layer 106B may correspond to green, and the third layer 106C may correspond to red. In some embodiments, the different layers of the XR image (e.g., 106A, 106B, 106C) may be understood to comprise different focal planes (e.g., focal lengths) for the XR image 106. The different focal planes may be caused by stacking of different waveguides configured to project particular wavelength(s) of light, or caused by other optical components (e.g., mirrors and/or diffractive gratings of the display). In some embodiments, the first layer 106A, second layer 106B, and third layer 106C may be understood to comprise respective portions (e.g., of light intensity and/or color) of the complete XR image 106.

FIG. 1D schematically illustrates system 100. In particular, FIG. 1D shows a top-down view of XR device 102 (e.g., XR HMD) (e.g., running an XR application), according to some embodiments. Similar to FIGS. 1A-1C, FIG. 1D generally depicts XR device 102 comprising an XR display 112, a dimmable layer 114, imaging system 121, and light source 116. In some embodiments, XR device 102 may be smart glasses, a stereoscopic display, XR glasses, XR goggles, an XR HMD, or any other suitable computing device, or any combination thereof.

The dimmable layer 114 of the XR device 102 may comprise a controlled-opacity optical element containing photochromic materials embedded with upconverting nanoparticles (UCNPs). The photochromic materials, such as organic dyes or inorganic compounds, may reversibly modulate light transmission in response to light stimuli (e.g., UV, near-infrared (NIR), or IR light), functioning as an optical filter to selectively attenuate ambient light and enhance the visibility of the XR image 106.

In some embodiments, the photochromic materials in the dimmable layer 114 undergo a reversible molecular change when exposed to light stimuli, altering their optical absorption properties. For example, exposure to UV or short-wavelength visible (VIS) light, often generated via upconversion by UCNPs, may induce a conformational shift (e.g., from an open-ring to a closed-ring form in organic dyes) that increases absorption in the VIS wavelength range (approximately 400-700 nm). This shift may vary the opacity of the dimmable layer 114, reducing ambient light transmission to improve the contrast and visibility of the XR image 106.

The UCNPs in the dimmable layer 114 are optical nanomaterials configured to absorb lower-energy photons (e.g., NIR or IR light) and emit higher-energy photons (e.g., UV or short-wavelength VIS light) through a nonlinear upconversion process. For example, UCNPs may combine two or more NIR/IR photons to produce a single UV photon, which triggers the photochromic response. The UCNPs may comprise compositions such as $NaYF_4$ doped with rare-earth ions (e.g., $Yb^{3+}/Er^{3+}$, $Yb^{3+}/Tm^{3+}$, or $Yb^{3+}/Ho^{3+}$) and may be optimized through core/shell structures, particle size variations, or dye sensitization (e.g., via triplet-triplet annihilation) to enhance emission efficiency and target specific wavelengths for activating the photochromic materials.

The photochromic materials in the dimmable layer 114 may include a single photochromic dye, a blend of dyes (e.g., red, green, blue), or a neutral-density material (e.g., gray tint) to achieve desired coloration or achromatic attenuation. These materials respond to upconverted UV or VIS light from UCNPs, enabling dynamic modulation of the dimmable layer's opacity based on controlled light exposure from the light source 116 within the XR device 102.

The photochromic materials may comprise organic compounds, such as spiropyrans, naphthopyrans, spirooxazines, fulgides, triarylmethanes, stilbenes, azastilbenes, nitrones, quinones, or metal complexes (e.g., sodium nitroprussides, ruthenium sulfoxide complexes), selected for their activation wavelengths, coloration intensity, and recovery times. These materials undergo reversible photochemical isomerization or structural rearrangement when exposed to UV or short-wavelength VIS light, transitioning from a transparent to a colored state to modulate light transmission, and revert to transparent when the activating light is removed or reduced.

Additionally or alternatively, the photochromic materials in the dimmable layer 114 may include inorganic compounds, such as metal oxides (e.g., titanium oxide, zinc oxide, tungsten oxide), metal sulfides (e.g., zinc sulfide, cadmium sulfide), selenides (e.g., ZnSe, InSe), oxygen-containing hydrides (e.g., yttrium oxyhydrides), mixed oxides (e.g., lead titanate), or compound semiconductors (e.g., GaP, doped silicon). These materials, which may include metallic or polymeric dopants, are selected for their photochromic properties to dynamically modulate opacity in response to upconverted light stimuli and may enhance the XR image 106's visibility in varying ambient light conditions.

As depicted generally in FIG. 1D, XR device 102 may comprise one or more light sources 116. In some embodiments, light source 116 may include a plurality of dedicated emitters configured to serve respective functions, such as illuminating XR display 112 and activating dimmable layer 114. For example, light source 116 may include an IR light source such as an IR laser, IR emitter array, or IR scanning module configured to irradiate upconverting nanoparticles (UCNPs) embedded within or adjacent to the dimmable layer 114. In some embodiments, light source 116 may comprise a plurality of image sources (e.g., liquid crystal on silicon (LCOS) displays, microLED displays, or other display technologies) configured to produce XR image 106 by projecting image light through one or more optical elements (e.g., lenses, beam combiners, or waveguides) toward the user's eye. In some embodiments, light source 116 may be the same or have similar features as the display/light sources described in FIGS. 4A-4C.

In some embodiments, irradiation of UCNPs may be performed using light generated internally within XR device 102 (e.g., for operation in indoor or shaded environments), or using light from external sources (e.g., sunlight or ambient IR in outdoor settings). Upon receiving IR light of relatively lower photon energy, UCNPs may emit fluorescent ultraviolet (UV) light of relatively higher energy. The photochromic material may be configured to absorb this emitted UV light, thereby undergoing a reversible molecular change that induces a color change and reduces the material's optical transmittance. In some embodiments, this process may cause localized dimming or tinting of selected regions of dimmable layer 114. Dimming the dimmable layer 114 may modulate the amount of ambient light passing through those regions of the XR device 102. In one example, dimming may selectively block bright light originating from portions of the surrounding environment (e.g., direct sunlight or glare).

In some embodiments, the dimmable layer 114 may include alternative light-modulating materials beyond photochromic compounds. For example, the dimmable layer may comprise electrochromic materials, which change their optical transmittance in response to an applied electric field; liquid crystal-based materials, which modulate transparency through voltage-induced orientation changes; thermochromic materials, which respond to temperature changes (e.g., induced by an IR heating source); or plasmonic or nanoparticle-dispersed films, which alter their scattering or absorption behavior based on incident light intensity or wavelength. Each of these dimmable materials may be excited or actuated by a corresponding stimulus: for instance, electrochromic materials may be excited by electrical drive signals, liquid crystal materials by applied voltage waveforms, and thermochromic materials by localized IR radiation. In some embodiments, combinations of dimmable materials may be used to provide multi-modal control over optical transmission in response to varying environmental and system conditions.

Figure 2:
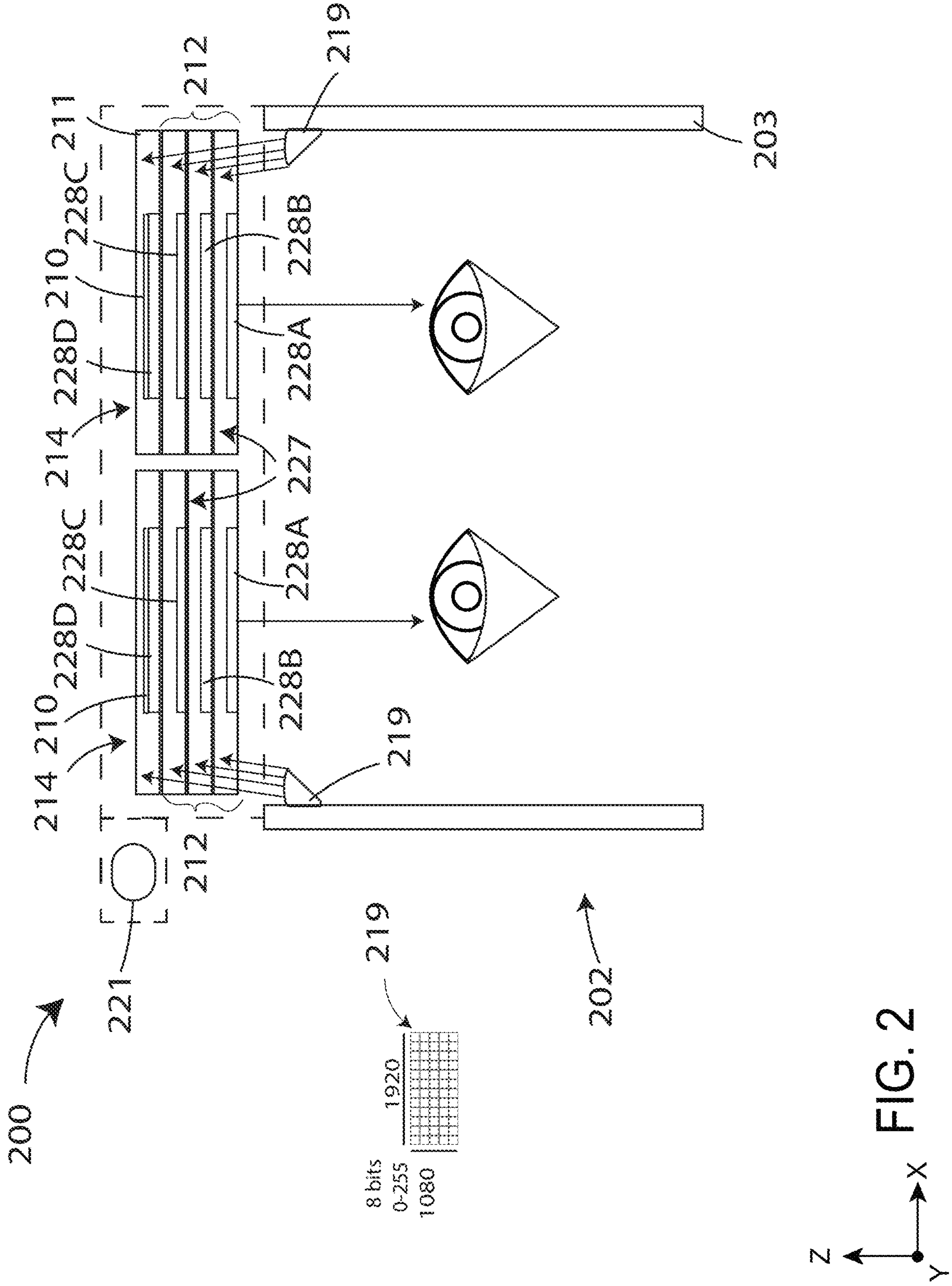
FIG. 2 schematically illustrates an example a top-down view of a device, according to some embodiments.

FIG. 2 schematically illustrates system 200. In particular FIG. 2 provides a top-down cross-sectional view of XR device 202, in accordance with some embodiments. XR device 202 may be an XR HMD (e.g., AR HMD) configured to display XR images. In some embodiments, system 200 includes XR device 202, which may correspond to any XR device described throughout the present disclosure (e.g., any of XR device 102, XR device 502, XR device 709A, XR device 709B, XR device 802A, XR device 802B or any suitable device described throughout the present disclosure). In one example, XR device 202 may be the same and/or have similar features to XR device 102 described in FIGS. 1A-1D.

FIG. 2 provides an example view of how an OST display lens on an XR device may be structured (e.g., to achieve dynamic light modulation and XR image rendering). In some embodiments, FIG. 2 may be understood as an expanded illustration of XR device 102 as depicted in FIGS. 1A-1D. While FIG. 1D provides a high-level schematic overview of system 100 and its components, FIG. 2 illustrates additional structural and functional details of XR device 202, including specific optical elements, control systems, and spatial relationships among components. As such, the features and embodiments shown in FIG. 2 may be implemented in conjunction with, or as a refinement of, those shown in FIG. 1D.

In some embodiments, XR device 202 may comprise a frame 203, an XR display 212, a dimmable layer 214, and an imaging system 221, which may be similar or identical to corresponding components described with respect to FIG. 1D (e.g., frame 103, XR display 112, dimmable layer 114, and imaging system 121).

In some embodiments, the XR display 212 comprises a plurality of layers (e.g., arranged in a stack). Each layer may comprise a substrate 227 and disposed within substrate 227 a respective set of waveguides (e.g., waveguide 228A, waveguide 228B, and waveguide 228C). Each waveguide may be configured to guide light received from light source 219 and direct the light toward the user's eye via outcoupling structures (e.g., diffractive gratings, and/or reflectors). Additional details regarding waveguide structures and their operations may be found in FIGS. 3A-3D, which generally illustrate various embodiments of waveguide geometries, coupling mechanisms, and optical routing strategies.

In some embodiments, XR display 212 may comprise coupling optics (e.g., partially reflective mirrors, diffractive gratings, holographic optical elements, or prism structures) outside or inside substrate 227. In some instances, these coupling optics may be configured to perform in-coupling, propagation, and out-coupling of light along the optical path. In some embodiments, waveguide may be understood as a lightguide.

In some embodiments, XR display may mean to include RGB waveguides. In some embodiments, XR display may mean to include RGB waveguides, an IR waveguide and a dimmable material.

In one example, each waveguide of XR display 212 (e.g., waveguide 228A, waveguide 228B, and waveguide 228C) may correspond to a respective XR layer (e.g., first layer 106A, second layer 106B, and third layer 106C of FIG. 1C). For instance, waveguide 228A may cause to first layer 106A, waveguide 228B to second layer 106B, and waveguide 228C to third layer 106C. In some embodiments, each respective waveguide (e.g., waveguide 228A, waveguide 228B, and waveguide 228C) may correspond to provide a respective portion an XR image (e.g., XR image 106). For example, waveguide 228A may be configured to direct blue light emitted from light source 219, waveguide 228B may be configured to direct green light emitted from light source 219, and waveguide 228B may be configured to direct red light emitted from light source 219.

In some embodiments, dimmable layer 214 may be disposed over XR display 212.

Dimmable layer 214 may comprise a substrate 211, a waveguide 228D and dimmable material 210. Although FIG. 2 generally depicts waveguides (e.g., waveguide 228A, waveguide 228B, waveguide 228C, and waveguide 228D) disposed in a respective substrate of XR display 212 and dimmable layer 214, each waveguide (e.g., waveguide 228A, waveguide 228B, waveguide 228C, and waveguide 228D) may be understood to be outcoupling gratings of a respective waveguide.

In some embodiments, waveguide 228D may correspond to a dimmable region (e.g., opaque object 108 of FIG. 1C), and may be used to selectively modulate ambient light transmission in spatial alignment with one or more XR image layers.

In some embodiments, light source 219 comprises a plurality of lights (e.g., red, green, blue, and IR (RGBI)) and may be configured to generate and project an XR image (e.g., XR image 106 Jigglypuff of FIGS. 1A-1D) along with causing IR emission in a similar shape to the XR image. In some embodiments, lights source 219 may comprise optical components (e.g., lenses) to form a beam shape. In some embodiments, as generally illustrated next to XR device 202, light source 219 may include image sources (e.g., 1920×1080) configuration. In some instances, light source 219 may comprise a micro display such as a microLED array or a liquid crystal on silicon (LCOS) panel. In some embodiments, light source 219 may be the same or have similar features to the light source/display described in FIG. 4A-4C. For example, light source 219 may be a microLED display comprising a vertical stack configuration, per pixel (e.g., light source 400 of FIG. 4A).

In some embodiments, light source 219 may be configured to emit light corresponding to distinct portions of an XR image layers (e.g., red, green, blue, and/or IR). Although a particular resolution is depicted, any suitable resolution may be applied to light source 219. As generally depicted in FIG. 2, light sources 219 may be optically coupled to respective waveguides (e.g., waveguide 228A, waveguide 228B, waveguide 228C, and waveguide 228D). Each waveguide may guide and diffract a corresponding light toward the user's eye.

In some embodiments, substrate 227 of XR display 212 may comprise an oxide, a dielectric or organic material some examples include high-refractive-index glasses (e.g., borosilicate glass or specialty optical glass like SCHOTT RealView® wafers), silicon carbide (SiC), lithium niobate ($LiNbO_3$), polycarbonate, and laminated glass. In some embodiments, a waveguide may be disposed on or within the substrate.

In some embodiments, the waveguide materials may comprise high-index glasses, silicon nitride ($Si_3N_4$) films, or polymer layers configured for total internal reflection and light propagation.

In some embodiments, waveguide 228D may be disposed within or integrated into substrate 227. Similar to the structural features of waveguide, the combination of waveguide 228D and substrate 227 may be stacked in a planar configuration.

In some embodiments, light source 219 (e.g., RGBI) may be configured to selectively emit light and project an image pattern onto dimmable layer 214 through one or more optical components (e.g., relay lenses or beam-shaping optics).

In some embodiments, system 200 (e.g., running XR application on XR device 202) may spatially group specific pixels of the light source 219 to selectively activate regions of the dimmable layer 214. For example, each of the 1920×1080 pixels of light source 219 may be configured to emit an activating wavelength (e.g., IR). Each pixel of light source 219 may be imaged (e.g., projected via the respective waveguide) onto the dimmable material 210 creating a 1920×1080 portions of dimmable layer 214 which may be activated.

In some embodiments, light source 219, capable of emitting both visible (VIS) and infrared (IR) light, may generate drive signals, via control circuitry, to illuminate pixels that project an XR image (e.g., a character like Jigglypuff) using VIS light while simultaneously emitting IR light to trigger photochromic materials, such as those embedded with upconverting nanoparticles (UCNPs), within the dimmable layer 214.

For example, the control circuitry may group pixels to form an activation pattern that induces localized opacity in the dimmable layer 214, creating an opaque region shaped to correspond to or outline the XR image (e.g., a silhouette of Jigglypuff).

In some embodiments, each pixel of light source 219 may comprise a respective driver configured to drive each light source of each pixel. In some embodiments, each color of each pixel may comprise an independent driver. In some embodiments, each pixel may comprise two drivers (e.g., one to drive VIS light and another to drive IR light). In some embodiments, each pixel may correspond to one driver. In some embodiments, a group of pixels may correspond to a driver.

In some embodiments, substrate 227 may comprise one or more optically transparent or semi-transparent materials suitable for embedding or supporting waveguides (e.g., waveguides 228A-228D) and for transmitting/propagating image source 219. For example, substrate 227 may be formed from glass (e.g., borosilicate glass, aluminosilicate glass, or fused silica), optical-grade polymers (e.g., polymethyl methacrylate (PMMA), polycarbonate (PC), cyclic olefin copolymer (COC), or cyclic olefin polymer (COP)), or hybrid materials combining glass and polymer layers.

In another example, system 200 may include a control architecture configured to modulate the opacity of dimmable layer 214, at the pixel level, by sending selective drive signals to different IR sources on light source 219. The control circuitry and architecture of system 200 may cause selective attenuation of ambient light through the XR display by modulating the intensity of IR light projected onto the dimmable layer 214.

In some instances, this may allow for dynamically controlling transparency for each corresponding display pixel. In one example, the control circuitry of system 200 may utilize a composite color and opacity encoding scheme where each display pixel may be assigned a 32-bit value. In some embodiments, the first 24 bits may represent color information (e.g., 8 bits per color channel (red, green, or blue)) corresponding to 256 possible intensity levels per channel for standard RGB color rendering. The remaining 8 bits may be used for pixel-level opacity control, representing 256 discrete levels for modulating the IR intensity projected by light source 219.

In some embodiments, the opacity control bit values may be mapped to IR intensity levels, such that a value of 0 may correspond to full transparency and a value of 255 may correspond to maximum dimming.

In some embodiments, system 200 may also include a camera and/or imaging system 221 configured to generate grayscale images of the real-world environment at a frame rate synchronized with XR display 212. Imaging system 221 may comprise a camera and/or detector which may possess a resolution at least equal to that of XR display 212 and/or light source 219. Grayscale images may be processed to compute per-pixel light intensity histograms, generating corresponding 8-bit values (0-255), which may then be used to adjust the IR drive signal on a pixel-by-pixel basis.

In some embodiments, the imaging system 221 may operate asynchronously relative to the rendering cycle of the XR display 212. For instance, if XR display 212 renders frames at 60 Hz using even-numbered intervals (e.g., 0, 2, 4, 6 . . . ), imaging system 221 may be configured to capture grayscale frames and/or convert images to grayscale, and perform brightness calculations at intermediate intervals (e.g., 1, 3.5, 5, 7.5 . . . ), based at least in part on the grayscale images. In one specific example, a captured 1920×1080 grayscale image may comprise pixel brightness values (0-255) and/or may be calibrated to such a scale and may spatially corresponded to the user's view through the waveguide display. In some embodiments, the one-to-one pixel mapping between the camera capture (e.g., of imaging system 221) and the XR display 212 (e.g., light source 219) may cause system 200 to identify an intensity value for the IR emitter required to achieve a desirable dimming effect.

In another example, system 200 may perform opacity control of a waveguide display based on measured light intensity levels. For instance, the user may be looking towards a bright area, such as a physical window exposed to high-intensity sunlight, and a virtual object is rendered in front of that window region (e.g., similar to step 851 of FIG. 8, where the XR/virtual image rendered 806, Jigglypuff, appears in front of a bright light source 861). In some embodiments, the bright light source causes glare. The imaging system 221 may capture incoming light at a frame rate that is at least equal to the refresh rate of the waveguide display. In some embodiments, if the camera is not a dedicated grayscale sensor, the image may be converted to grayscale. From the grayscale image, an 8-bit brightness level (0-255) may be calculated for each pixel in the captured image. Based at least in part on the brightness intensity of each pixel, a corresponding 8-bit opacity value (0-255) may also be computed for each rendered pixel of the virtual object (e.g., XR image).

In some embodiments, the opacity values (0-255) may be used to control the infrared emitter, which transmits IR light through the upper combiner (UC) waveguide (e.g., waveguide 228D) at the same refresh rate as the XR display 212.

In some embodiments, the infrared (IR) intensity applied to individual pixels of the dimmable layer 214 may be generated using IR-emitting components such as micro-LEDs, vertical-cavity surface-emitting lasers (VCSELs), MEMS-actuated mirrors, or OLED-like emitters. The per-pixel IR intensity may be digitally controlled based on an 8-bit value (e.g., 0-255), where control mechanisms include current modulation, pulse-width modulation (PWM), or digital-to-analog converters (DACs). For example, in PWM-based systems, the 8-bit value may represent the duty cycle of the PWM signal, where a value of 0 results in 0% intensity (IR emitter off), a value of 255 may correspond to 100% intensity (IR emitter fully on), and intermediate values (e.g., 128) may result in proportional IR output (e.g., 50% duty cycle). Alternatively, DAC-based control may be used (e.g., may provide precise and linear IR output), with the 8-bit input value determining the output current (e.g., 8-bit value of 64 resulting in ~10 mA, 128 resulting in ~20 mA, and 255 resulting in ~30 mA) based on a maximum target current (e.g., 30 mA). A DAC may be used in combination with a current-limiting resistor or a constant-current IR LED driver (e.g., LM317) to regulate the output intensity.

In some embodiments, the maximum IR current required to achieve 100% optical dimming (i.e., maximum opacity) may vary based on the composition and properties of the photoresponsive waveguide material (e.g., waveguide 228D). Accordingly, calibration or empirical testing may be performed to determine the actual current thresholds needed to achieve desired opacity levels. Suitable photochromic or electrochromic materials for the dimmable waveguide layer may include, without limitation, titanium oxide, zinc oxide, tungsten oxide, nickel oxide, $FeTiO_3$, $CdFe_{204}$, $YFeO_3$, $SrTiO_3$, CdO, $V_2O_5$, $Bi_2O_3$, PbO, $Ta_2O_5$, $Nb_2O_5$, $SnO_2$, $ZrO_2$, $CeO_2$, oxygen-containing hydrides (e.g., yttrium hydrides such as $YH_xO_y$), mixed oxides (e.g., lead titanate, lead-lanthanum titanate), metal sulfides (e.g., zinc sulfide, cadmium sulfide, lead sulfide), selenides (e.g., ZnSe, $ZrSe_2$, $HfSe_2$, InSe), and doped semiconductors (e.g., doped silicon, germanium-doped silicon carbide). In some implementations, photoconductive or semiconducting polymers such as polyvinyl carbazoles, polythiophenes, polyphenylene vinylenes, polyphenylenes, or polyanilines may also be employed as tunable light-modulating materials.

In some embodiments, dimmable layer may mean to comprise a dimmable material and an IR waveguide. In some embodiments, an XR display may mean to comprise RGB waveguides and the dimmable layer.

Figures 3A, 3B:
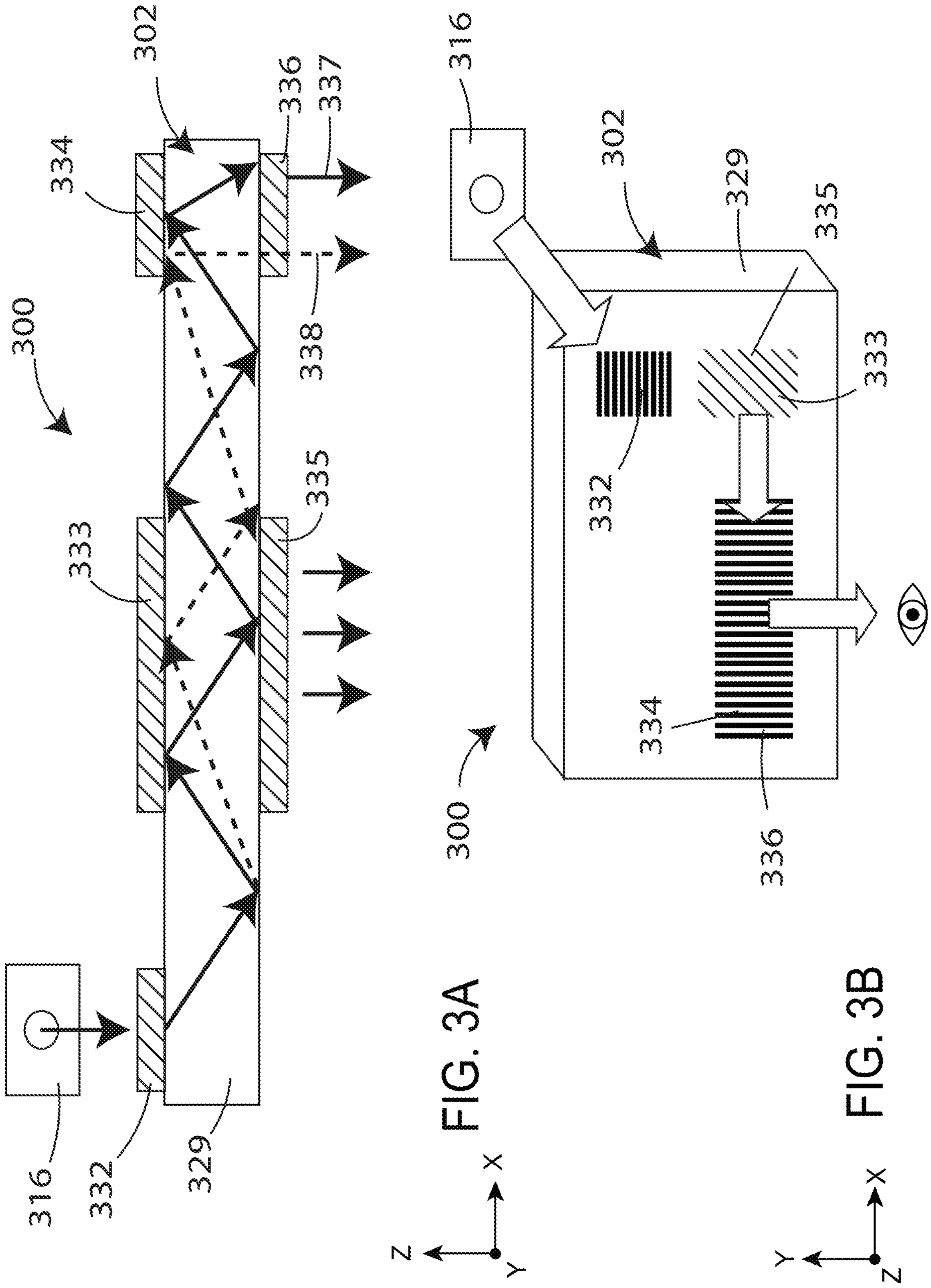
FIG. 3A schematically illustrates an example view of a device, according to some embodiments.
FIG. 3B schematically illustrates an example view of a device, according to some embodiments.

FIGS. 3A-3B schematically illustrate waveguide system 300, and in particular, provide two views of waveguide 302, in accordance with some embodiments. Waveguide 302 may be configured to present XR images. In some embodiments, waveguide system 300 includes waveguide 302, and light source 316 (e.g., driven by internal control circuitry) which may correspond to any waveguide or waveguide structure described throughout the present disclosure (e.g., waveguide 228A, waveguide 228B, waveguide 228C, waveguide 228D, waveguide 350, waveguide 360, waveguide 370, waveguide 380, waveguide 394, or any suitable waveguide described in this present disclosure). The features shown in FIGS. 3A-3B may be applied to any suitable system device or waveguide configuration of the disclosure. That is, features described with respect to any figure may be used in combination with features described in connection with 3A-3B.

FIG. 3A generally depicts a cross-section of waveguide system 300 and corresponding waveguide 302, according to some embodiments. System 300 comprises a light source 316 configured to emit image light into waveguide 302. In some embodiments, waveguide 302 comprises a plurality of diffractive gratings (e.g., diffractive grating 332, diffractive grating 333, diffractive grating 335, diffractive grating 334, and diffractive grating 336) any of which may be one of a type of diffractive grating (e.g., in-coupling diffractive grating, out-coupling diffractive grating, disparity grating, redirecting or expansion grating, beam-steering diffractive grating, or reflective structure).

In some embodiments, waveguide 302 of FIG. 3A may further include one or more diffractive gratings configured for pupil expansion or disparity correction. For example, internal structures such as diffractive grating 333 may function as a disparity grating or beam-steering grating, redirecting specific portions of light within waveguide 302 to support expanded eye-box or angular multiplexing functionality. Such gratings may be formed on one or more surfaces or embedded within the waveguide substrate. In some embodiments, diffractive grating 333 may be configured such that a portion of light is out-coupled from waveguide 302 and another portion of the light is internally reflected into waveguide 302.

In some embodiments, waveguide 302 comprises substrate 329. In some embodiments, substrate 329 may comprise an oxide or any suitable material (e.g., fused silica, aluminosilicate or borosilicate glass; crystalline oxides such as sapphire or spinel; fluoride crystals such as $CaF_2$ or $MgF_2$; optical polymers such as PMMA, cyclic olefin polymer/copolymer (COP/COC), or polycarbonate; or hybrid organosilicates such as ORMOCER-type materials) configured to propagate wavelengths including RGB and IR wavelengths. In some embodiments, substrate 329 may include any material described in the present disclosure.

In some embodiments, light source 316 may be a projector configured to emit an image beam or a test beam into waveguide 302. The image beam may enter the waveguide through an in-coupling region (e.g., diffractive grating 332) and propagate via total internal reflection within the waveguide structure. In some embodiments, diffractive grating 332 is an in-coupling grating. In some embodiments, waveguide 302 comprises a substrate 329, which may be formed from a high-refractive-index material (e.g., glass, SiC, or optical-grade polymer) and configured to support total internal reflection of light received from light source 316. In some embodiments, multiple light paths may be generated within the waveguide, such as light path 338 and light path 337, representing particular optical propagation routes. In one approach, the two distinct routes may correspond to, for example, different image layers, color channels, or test beam paths, which interact with internal gratings (e.g., diffractive grating 333, and diffractive grating 335) to redirect or out-couple light toward the user's eye. In some examples, light source 316 may comprise multiple wavelengths (e.g., RGB), each wavelength may be propagated through a singular waveguide (e.g., waveguide 302) and directed by a plurality of diffractive gratings disposed on or within waveguide 302. In some embodiments, waveguide 302 may be the same as XR display 212 (e.g., condensed) into one optical waveguide element. In another example, a plurality of waveguide 302 may be stacked to form XR display 212.

FIG. 3B generally depicts a perspective of waveguide system 300 and corresponding waveguide 302, according to some embodiments. FIG. 3B may be understood to have a similar perspective and/or orientation to FIG. 1A. In some embodiments, waveguide 302 may be the same or be part of XR display 112 of FIG. 1A.

Figure 3C:
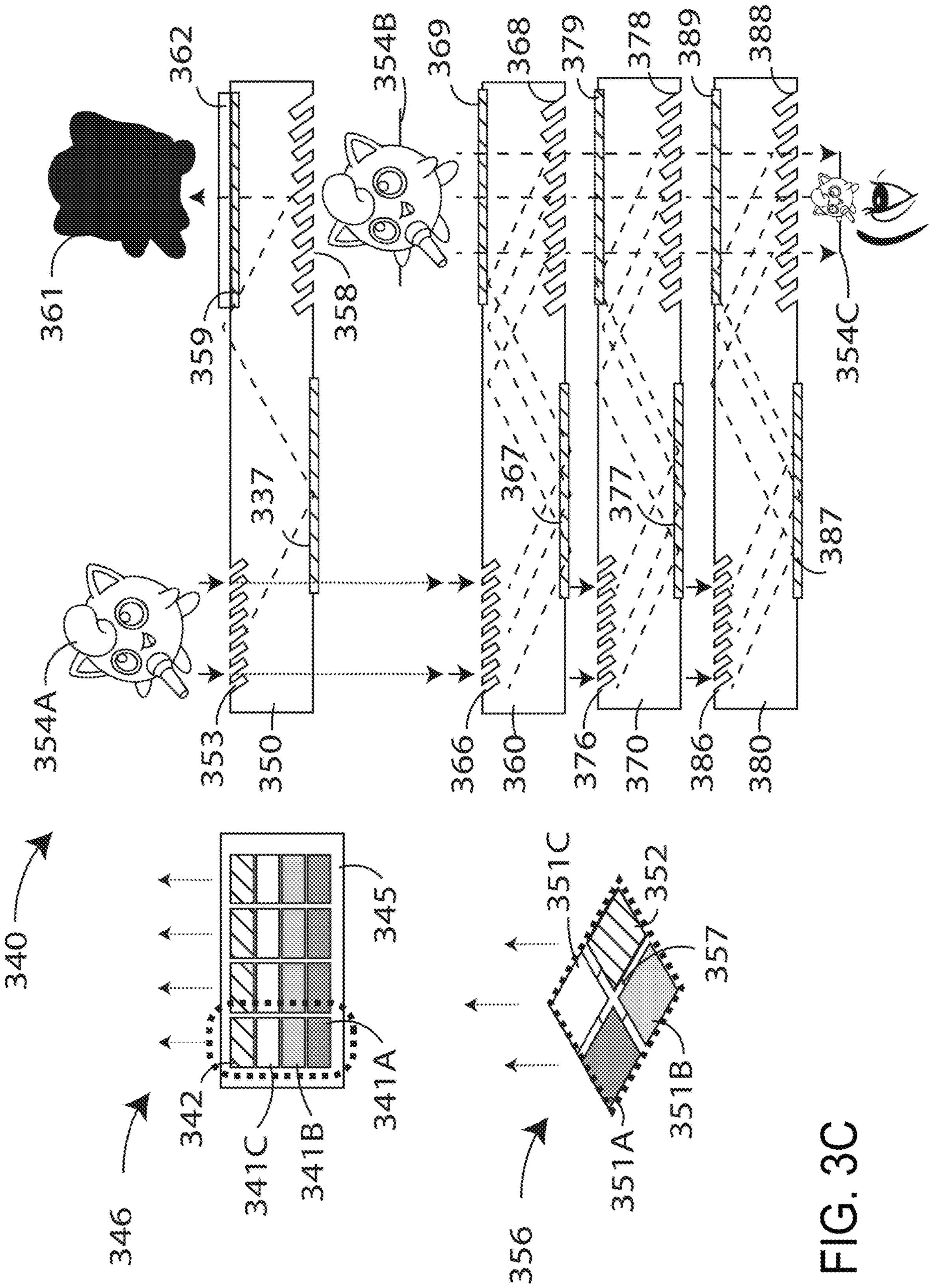
FIG. 3C schematically illustrates an example view of a device, according to some embodiments.

FIG. 3C schematically illustrates system 340, and in particular, provides cross-sectional view of a plurality of waveguides (e.g., waveguide 350, waveguide 360, waveguide 370, and waveguide 380) with light source (e.g., providing XR image 354A), in accordance with some embodiments. In some embodiments, waveguide any of waveguide 350, waveguide 360, waveguide 370, and waveguide 380 may be the same or have similar features to waveguide 302. Waveguide system 340 may be applied to any suitable XR device described throughout the present disclosure. That is, features described with respect to any figure may be used in combination with features described in connection with FIG. 3C, unless otherwise explicitly stated. In one particular example, any of the features or elements described for waveguide 302 may be applied to waveguide 360 or any suitable waveguide of the present disclosure.

In some embodiments, FIG. 3C may be understood as an expanded illustration of XR device 202 as generally shown in FIG. 2. While FIG. 2 provides a high-level schematic overview of system 200 and its components, FIG. 3C generally depicts additional structural and functional details of the XR display and dimmable layer, including specific optical elements, control systems, and spatial relationships among components.

In some embodiments, system 340 provides XR content including XR images 354A (e.g., Jigglypuff) from a light source. In some embodiments, XR image 354A may be generated by any suitable light source in the present disclosure (e.g., any of light source 119, light source 219, light source 319, light source 346, light source 356, light source 400, light source 406, light source 420, light source 430, light source 519).

In some embodiments, system 340 may comprise a plurality of first waveguides (e.g., waveguide 360, waveguide 370, and waveguide 380), and at least one second waveguide (e.g., waveguide 350). In some embodiments, the plurality of first waveguides (e.g., waveguide 360, waveguide 370, and waveguide 380) may be condensed into a singular waveguide (e.g., into waveguide 302). In some embodiments, the plurality of first waveguides (e.g., waveguide 360, waveguide 370, and waveguide 380) may be configured to guide visible light (e.g., XR image 354A), while the second waveguide 350 may be configured to guide IR light (e.g., image 354A).

In one particular example, XR image 354A generated by a light source may represent activated pixels comprising both VIS and IR wavelengths.

In some embodiments, the plurality of first waveguides (e.g., waveguide 360, waveguide 370, and waveguide 380) may be understood to be RGB waveguides configured to guide light emitted from any light source (e.g., any of light source 119, light source 219, light source 319, light source 346, light source 356, light source 400, light source 406, light source 420, light source 430, light source 519) (e.g., XR image 354A). In some instances, once XR image 354A propagates through any waveguide XR image 354A may be understood to be a virtual image (e.g., XR image 354B) perceived at a depth.

Figure 4A:
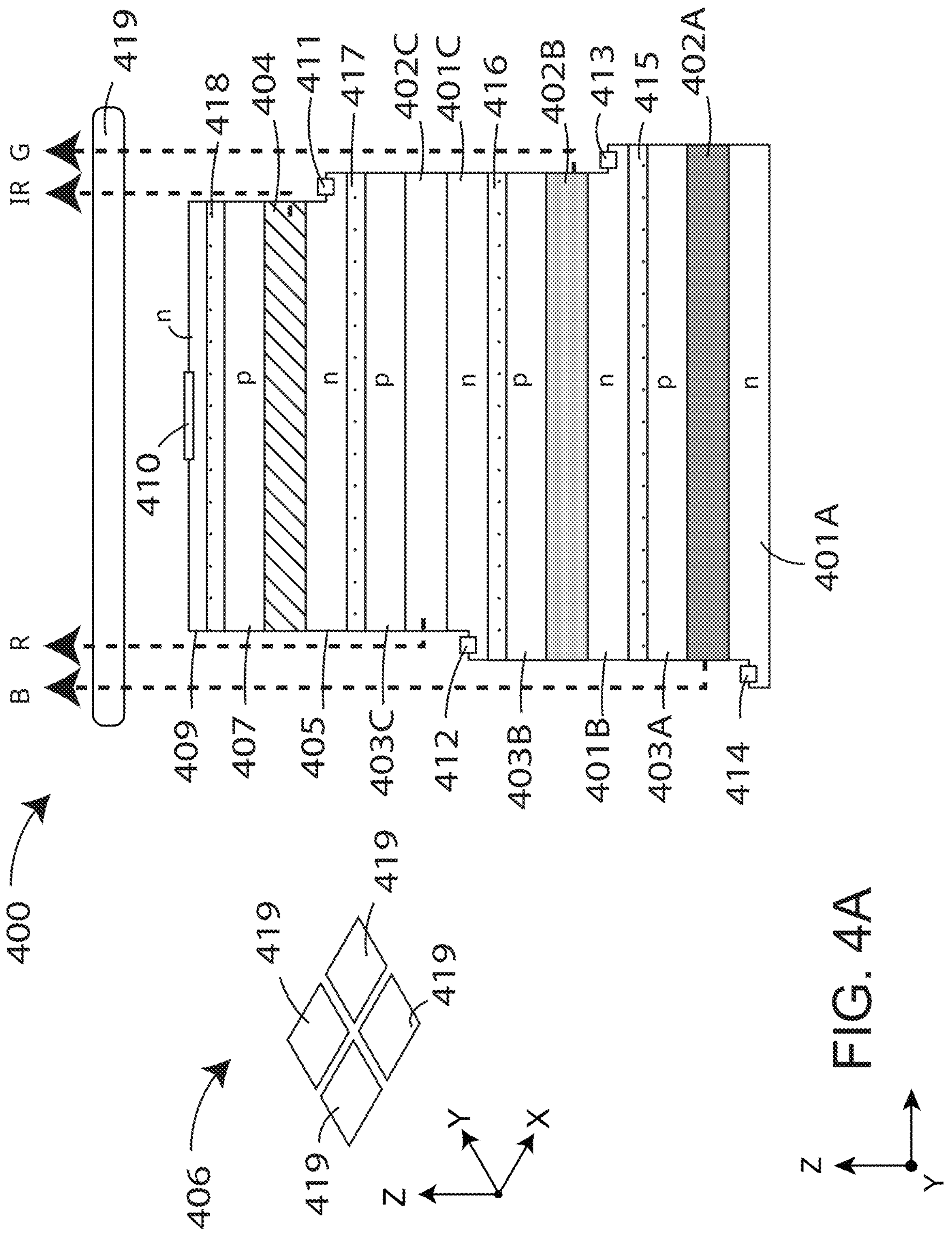
FIG. 4A schematically illustrates an example view of an LED, according to some embodiments.
Figure 4B:
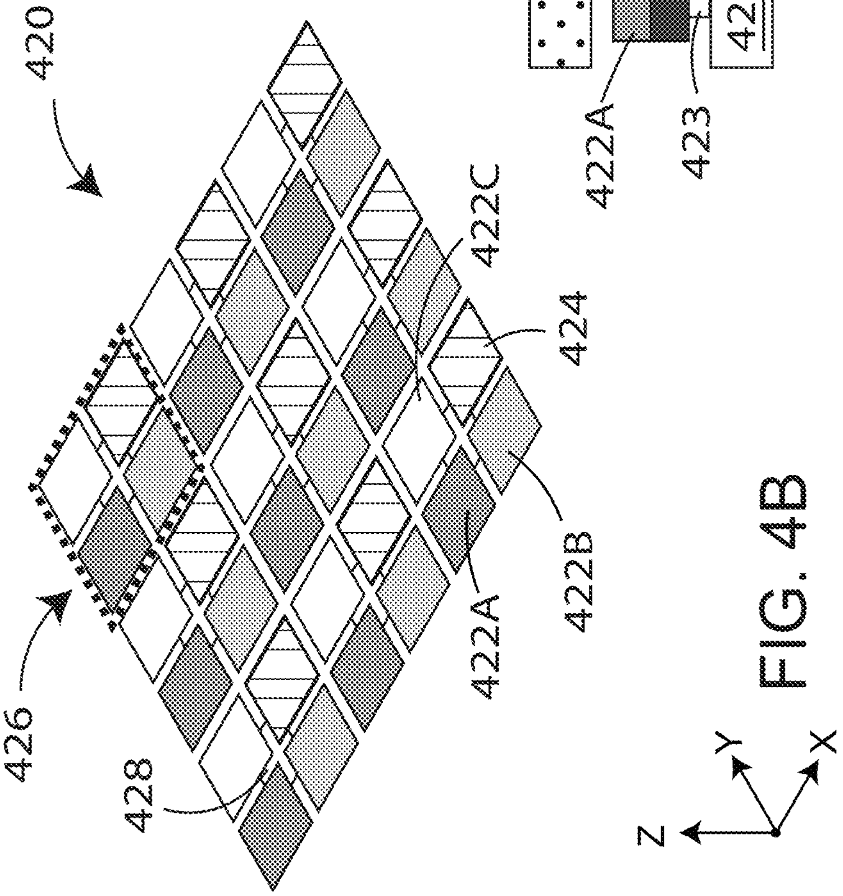
FIG. 4B schematically illustrates an isometric example view of a display, according to some embodiments.
Figure 4C:
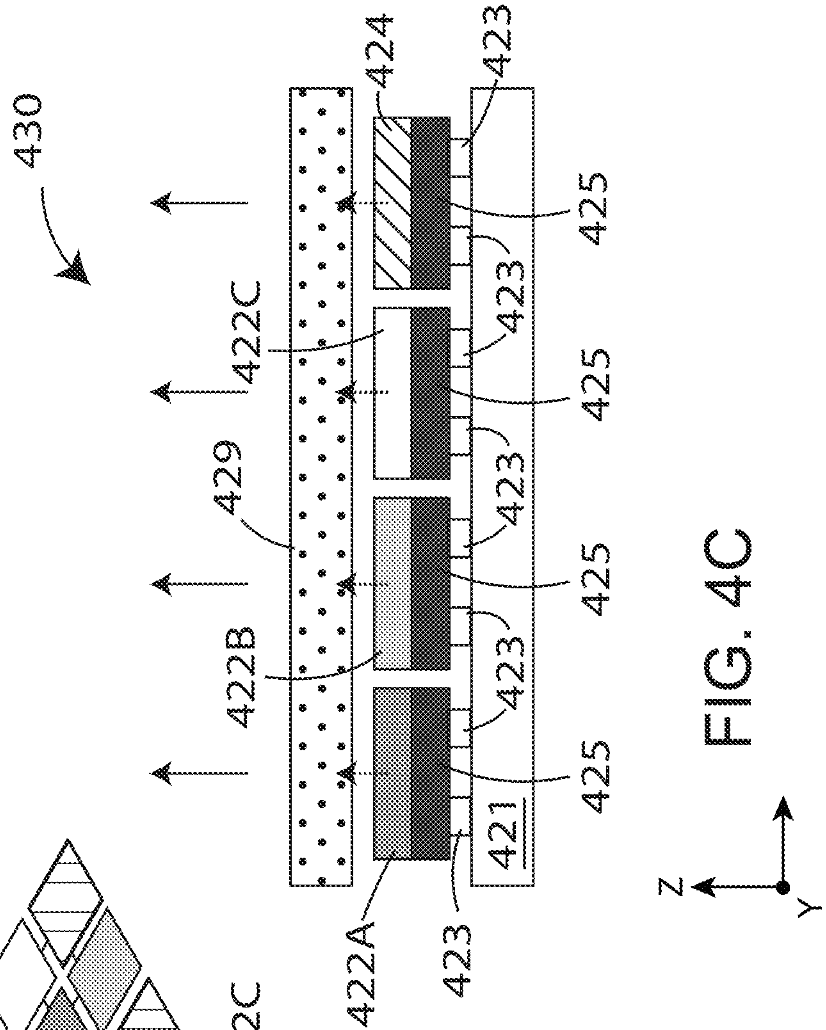
FIG. 4C schematically illustrates an example view of an LED, according to some embodiments.

In some embodiments, XR image 354A may be generated by a light source comprising a vertical pixel configuration (e.g., light source 400 of FIG. 4). In some embodiments, XR image 354A may be generated by a light source comprising a horizontal pixel configuration (e.g., light source 420 or light source 430 of FIGS. 4B-4C).

In some instances, wavelength of light generated by any light source described in this present disclosure (e.g., at LED active regions) may be generally understood to comprise a wavelength range or a plurality of wavelengths (e.g., wavelength bin). For example, (i) red light may comprise a wavelength range of approximately 620-750 nm; (ii) green light in the range of approximately 495-570 nm; (iii) blue light in the range of approximately 450-495 nm; and (iv) infrared (IR) light in the range of approximately 850-1000 nm.

In another example, the terminology of light color may rely on color perception metrics. Color terms defined by standards like the CIE (International Commission on Illumination) color space (e.g., CIE 1931 chromaticity coordinates) may be used to characterize the visible light output (e.g., red, green, blue) for rendering XR images.

In some instance the grouping/stacking of waveguide 360, waveguide 370, and waveguide 380 may be understood to from an XR display. In some embodiments, each the plurality of first waveguides (e.g., waveguide 360, waveguide 370, and waveguide 380) may comprise a plurality of diffractive gratings. For example, waveguide 360 may comprise an input grating 366, and internal grating 367, output grating 368 and/or optical element 369. In some embodiments, optical element 369 may be a second output grating, a refractive surface, or a reflective surface. Each grating may be disposed within the waveguide, embedded (e.g., cut and or etched) into the material of the waveguide, and/or disposed on the outside surface of the waveguide. In some embodiments, waveguide 360 may be configured to receive XR image 354A and cause a portion of XR image 354A (e.g., a respective color) to be projected (e.g., XR image 354B and XR image 354C). In some embodiments, XR image 354B may correspond to a focal plane. In some embodiments, XR image 354C may correspond to the XR device's eye box.

In another example, waveguide 370 may comprise an input grating 376, and internal grating 377, output grating 378 and/or optical element 379. In some embodiments, optical element 379 may be a second output grating, a refractive surface, or a reflective surface. Each grating may be disposed within the waveguide, embedded (e.g., cut and or etched) into the material of the waveguide, and/or disposed on the outside surface of the waveguide. In some embodiments, waveguide 370 may be configured to receive XR image 354A and cause a portion of XR image 354A (e.g., a respective color) to be projected (e.g., XR image 354B and XR image 354C). In some embodiments, XR image 354B may correspond to a focal plane. In some embodiments, XR image 354C may correspond to the XR device's eye box.

In another example, waveguide 380 may comprise an input grating 386, and internal grating 387, output grating 388 and/or optical element 389. In some embodiments, optical element 389 may be a second output grating, a refractive surface, or a reflective surface. Each grating may be disposed within the waveguide, embedded (e.g., cut and or etched) into the material of the waveguide, and/or disposed on the outside surface of the waveguide. In some embodiments, waveguide 380 may be configured to receive XR image 354A and cause a portion of XR image 354A (e.g., a respective color) to be projected (e.g., XR image 354B and XR image 354C). In some embodiments, XR image 354B may correspond to a focal plane. In some embodiments, XR image 354C may correspond to the XR device's eye box.

In some embodiments, disposed over the XR display (e.g., combination of waveguide 360, waveguide 370, and waveguide 380) is a dimmable layer. The dimmable layer may comprise waveguide 350 further comprising an input grating 353, and internal gratings, output grating 358 and/or optical element 359. In some embodiments, optical element 359 may be a second output grating, a refractive surface, or a reflective surface. Each grating may be disposed within the waveguide, embedded (e.g., cut and or etched) into the material of the waveguide, and/or disposed on the outside surface of the waveguide. In some embodiments, waveguide 350 may further comprise a dimmable material 362. In some examples, dimmable material 362 may be disposed on waveguide 350 such that it may receive light (e.g., IR light) output via output grating 358. In some embodiments, XR image 354A may comprise IR light (e.g., IR signals) and waveguide 350 may cause IR portions of the XR image 354A to project/image onto the dimmable material 362.

In some embodiments, between each waveguide may be a dichroic filter configured to allow certain colors to pass and others to reflect.

In some examples, waveguide 360 may be configured to guide red light of XR image 354A, waveguide 370 may be configured to guide green light of XR image 354A, and waveguide 380 may be configured to guide blue light of XR image 354A. Although a particular configuration is described, any variation or stackable configuration may be used.

As generally depicted in FIG. 3C each of the waveguides may be configured to generate a focal plane such that XR images (e.g., Jigglypuff) may appear a distance from the user.

In one example, IR corresponding wavelengths may be emitted from a source in the form of Jigglypuff. The IR pattern (e.g., Jigglypuff) may propagate through waveguide 350 and all corresponding components such that the IR pattern interacts with dimmable material 362. In some instances, a cascade reaction occurs within dimmable material 362 causing dimmable material 362 to absorb light in the visible spectrum and appear dark. Although activated portions of the dimmable material appear uniform (e.g., opaque object 361) activated portions may vary, based at least in part on how strong the respective IR drive signals are.

In some embodiments, any of the diffractive gratings described herein may be slanted gratings. In some embodiments, each grating may comprise different depths. Although a particular grating configuration is generally depicted, any suitable grating configuration may be applied.

FIG. 3C includes different embodiments for light a source structure (e.g., light source 346 and light source 356). In some embodiments, the XR device may comprise light source 346 (e.g., comprising a vertically stacked pixel structure). In some embodiments, light source 346 may comprise a plurality of pixels (e.g., single pixel may be represented by the dotted box). In some embodiments, each pixel of light source 346 may comprise a plurality of dies (e.g., a first die 341A, a second die 341B, a third die 341C, and a fourth die 342) each respective die may be configured to emit a light in a wavelength range or band different from one another. For example, die 341A may be configured to emit blue light, die 341B may be configured to emit green light, and die 341C may be configured to emit red light. In some embodiments, light source 346 may comprise die 342 configured to emit IR light. Although a particular configuration (e.g., stack order) is depicted and described, any stackable configuration may be used. Furthermore, although die 342 is depicted in each vertical stack, there may be a single die for a plurality/group of stacks. Although a particular color order is described any suitable vertical stack arrangement may be used.

In one example, light source 346 may be understood to be a RGBI display comprising equal parts RGB pixels to IR pixels. In another example, the ratio of RGB:IR pixels may be more than 1 and/or below 1. Although each pixel on light source 346 is shown to comprise die 342 (e.g., IR die) a group of pixels (e.g., 5, 3, 10, or any suitable value) may only comprise one IR die. In some embodiments, each vertical stack may be communicatively coupled to an integrated circuit (IC) and each vertical stack may be disposed in substrate 345.

In some embodiments, the XR device may comprise another configuration as generally depicted by light source 356. In some embodiments, the XR device may comprise light source 356 (e.g., comprising a horizontally arranged pixel structure). In some embodiments, light source 356 may comprise a plurality of pixels (e.g., single pixel may be represented by the dotted box). In some embodiments, each pixel of light source 356 may comprise a plurality of dies (e.g., a first die 351A, a second die 351B, a third die 351C, and a fourth die 352) each respective die may be configured to emit a light in a wavelength range or band different from one another. For example, die 351A may be configured to emit blue light, die 351B may be configured to emit green light, and die 351C may be configured to emit red light. In some embodiments, light source 356 may comprise die 352 configured to emit IR light. Although a particular configuration is depicted and described, any arrangement/configuration may be used. Furthermore, although die 352 is depicted in each pixel, there may be a single die for a plurality/group of stacks. Although a particular color order is described any suitable vertical stack arrangement may be used. In some embodiments, disposed under each die is IC 357.

In one example, light source 356 may be understood to be a RGBI display comprising equal parts RGB pixels to IR pixels. In another example, the ratio of RGB:IR pixels may be more than 1 and/or below 1. Although each pixel on light source 356 is shown to comprise die 352 (e.g., IR die) a group of pixels (e.g., 5, 3, 10, or any suitable value) may only comprise one IR die. In some embodiments, each pixel may be communicatively coupled to an IC 357, and each pixel may be disposed in a substrate.

In some embodiments, light source 346 and light source 356 may form a full color gamut image (e.g., XR image 354A) (e.g., Jigglypuff) (e.g., white in accordance with CRI display specifications), or at least a portion thereof.

In some embodiments, disposed under each pixel is an IC, configured to send drive signals to any of pixel of any light source, causing light emission. In some embodiments, a user may observe an overlap of XR image 354B and opaque 361.

In some embodiments, the IR waveguide may include gratings, thin films, coatings and/or diffractive elements for IR wavelengths to improve coupling efficiency and directivity while reducing back-reflection and unintended leakage into the eye box.

One of the aspects of the present system lies in the spatial alignment of the IR waveguide with the RGB waveguides. Since the IR subpixel is physically adjacent to the RGB subpixels on the light source (e.g., microLED panel), each IR emission path may be closely aligned with the corresponding (e.g., adjacent) RGB pixel. Accordingly, the IR waveguide may be configured to maintain pixel-to-pixel alignment across the display area to help ensure that the IR output from each pixel is co-located with the corresponding visible light output. In some embodiments, the IR waveguide may be configured with inverse or complementary grating structures compared to those of the RGB waveguides. More particularly, the input grating of the IR waveguide may match the input gratings of the RGB waveguides in angular and spatial alignment, while the output grating may be modified to reverse the directionality of the projection (e.g., directing light outward rather than inward). In some instances, this inverted design may cause improved alignment while compensating for differences in refractive index, coupling angle, grating pitch, and wavelength dispersion across the spectrum.

In some embodiments, the waveguides allow for parasitic diffraction management. In see-through display systems, parasitic transmission orders can result in undesirable optical effects such as: unintended light leakage into the user's field of view; reduced transparency of the optical substrate; internal reflections that interfere with eye-facing optics; and rainbow artifacts, angular blur, or image distortion. To mitigate these issues, the waveguide system may incorporate subwavelength gratings or volume holographic gratings (VHGs) designed with angular and spectral selectivity. These gratings can be tailored to allow only the desired diffraction order while suppressing higher-order or off-angle light propagation via evanescence or polarization control. For example, the system may employ polarization-selective gratings that suppress unwanted transmission orders based on the polarization state of the incident light.

Additionally, waveguide efficiency and suppression of parasitic orders can be improved by optimizing grating duty cycle, pitch, and profile. Anti-reflection coatings or blocking layers may also be added to prevent back-reflected light or crosstalk between RGB and IR channels. These design strategies preserve display clarity, improve contrast, and ensure consistent visual and opacity performance across a range of ambient conditions.

Figure 3D:
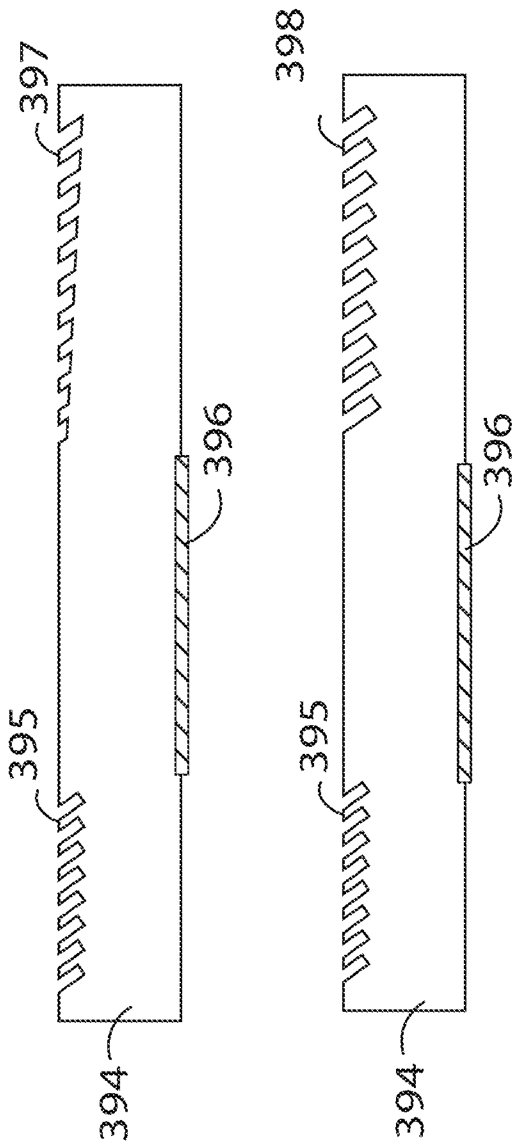
FIG. 3D schematically illustrates an example view of a device, according to some embodiments.

In some embodiments, the IR waveguide includes input and output gratings specifically designed to match the spatial layout of the RGB waveguides while compensating for the outward projection geometry. For instance, as illustrated in FIG. 3D, the waveguides may include slanted grating structures that are inversely shaped relative to the gratings used in the RGB waveguides. In some instances, as in the case for waveguides configured to transmit IR light, this may allow IR light to be redirected outward, while minimizing IR reflection back into the eye or display system. In some embodiments, diffractive gratings may be configured such that the parasitic transmission diffraction order is reversed relative to that of the RGB channels, this may reduce the likelihood of unintended IR exposure in the user's field of view.

FIG. 3D generally depicts waveguides with alternative configurations (e.g., configurations which may be used instead of or in combination with waveguide structures previously described). For example, FIG. 3D shows waveguide 394 comprising an input grating 395, an internal grating (e.g., expansion grating) 396, and an output grating 397. In some embodiments, output grating 397 may comprise slanted gratings with varying depths. In some embodiments, output grating 397 may comprise gratings wherein the depths of each grating increase and/or decrease in depth along an optical axis of the waveguide.

In another example, FIG. 3D shows waveguide 394 comprising an input grating 395, an internal grating (e.g., expansion grating) 396, and an output grating 398. In some embodiments, output grating 398 may comprise slanted gratings with uniform depths.

It should be appreciated that waveguides with respective gratings structures described herein may be used by either RGB wavelengths and/or IR wavelengths.

FIGS. 4A-4C show illustrative arrangements of light sources (e.g., light source 400, light source 420, and light source 430) for an XR device (e.g., XR HMD running an XR application), in accordance with some embodiments of this disclosure. Any of the light sources generally described herein may provide XR images (e.g., Jigglypuff) and activate portions of a dimmable material on the dimmable layer.

FIG. 4A schematically illustrates light source 400, and in particular, provides a cross-sectional view of light source (or light source element) 400, in accordance with some embodiments. Specifically, FIG. 4A may be understood to depict a single pixel of a larger light source or light source array. In some embodiments, light source 400 comprises a plurality of LEDs arranged in a stack (e.g., a first LED, a second LED, a third LED and a fourth LED).

In some embodiments, the first LED comprises an active region 402A, a p-region (e.g., positive) 403A, and an n-region (e.g., negative) 401A. In some embodiments, the first LED comprises contact 414 (e.g., metal contact). In some embodiments, the first LED is bonded to a second LED via a bonding region 415 (e.g., as generally described in FIGS. 10A-10B). In some embodiments, each layer of the first LED comprises semiconductor material configured to emit a particular color of light.

In some embodiments, second first LED comprises an active region 402B, a p-region (e.g., positive) 403B, and an n-region (e.g., negative) 401B. In some embodiments, the second LED comprises contact 413 (e.g., metal contact). In some embodiments, the second LED is bonded to a third LED via a bonding region 416 (e.g., as generally described in FIGS. 10A-10B). In some embodiments, each layer of the second LED comprises semiconductor material configured to emit a particular color of light.

In some embodiments, the third LED comprises an active region 402C, a p-region (e.g., positive) 403C, and an n-region (e.g., negative) 401C. In some embodiments, the third LED comprises contact 412 (e.g., metal contact). In some embodiments, the third LED is bonded to a fourth LED via a bonding region 417 (e.g., as generally described in FIGS. 10A-10B). In some embodiments, each layer of the third LED comprises semiconductor material configured to emit a particular color of light.

In some embodiments, the fourth LED comprises an active region 404, a p-region (e.g., positive) 407, and an n-region (e.g., negative) 405. In some embodiments, the fourth LED comprises contact 411 (e.g., metal contact). In some embodiments, the fourth LED is bonded to a n-region via a bonding region 418 (e.g., as generally described in FIGS. 10A-10B). In some embodiments, each layer of the fourth LED comprises semiconductor material configured to emit a particular color of light. In some embodiments, disposed over n-region 409 is contact 410 (e.g., metal contact).

As generally depicted by the dotted arrows in FIG. 4A each respective active region may be configured to emit a particular wavelength of color. For example, active region 402A of the first LED may be configured to emit blue light, active region 402B of the second LED may be configured to emit green light, active region 402C of the third LED may be configured to emit red light, and active region 404 of the fourth LED may be configured to emit IR light.

In some embodiments, the active region, n-type region, and p-type region of each LED in the light source 400 comprise specific semiconductor materials configured to their respective emission wavelengths. For example, the first LED may be configured to emit blue light, the active region 402A may comprise indium gallium nitride (InGaN) with a high indium content, the n-type region 401A may comprise n-doped gallium nitride (GaN), and the p-type region 403A may comprise p-doped GaN. In another example, the second LED may be configured to emit green light, the active region 402B may comprise InGaN with a moderate indium content, the n-type region 401B may comprise n-doped GaN, and the p-type region 403B may comprise p-doped GaN. In another example, the third LED may be configured to emit red light, the active region 402C may comprise aluminum gallium indium phosphide (AlGaInP) or gallium arsenide (GaAs), the n-type region 401C may comprise n-doped AlGaInP or GaAs, and the p-type region 403C may comprise p-doped AlGaInP or GaAs. In another example, the fourth LED may be configured to emit IR light, the active region 404 may comprise gallium arsenide (GaAs) or indium gallium arsenide (InGaAs), the n-type region 405 may comprise n-doped GaAs or InGaAs, and the p-type region 407 may comprise p-doped GaAs or InGaAs.

In some embodiments, the metal contacts (e.g., contacts 410, 411, 412, 413, 414) of the LEDs in the light source 400, used to couple electricity to each LED, may comprise conductive materials selected for low resistance and compatibility with semiconductor layers. These contacts may include metals such as gold (Au), silver (Ag), aluminum (Al), copper (Cu), nickel (Ni), titanium (Ti), or alloys thereof (e.g., Au/Ni, Ti/Al). In some embodiments, the contacts may incorporate transparent conductive oxides, such as indium tin oxide (ITO), for improved optical transparency in the optical see-through (OST) display.

Although FIG. 4A depicts a particular vertical stack arrangement, any vertical stack arraignment may be used. In some embodiments, light emitted from each active region of light source 400 may propagate through an aperture 419 and that aperture 419 may define a pixel. Adjacent to light source 400 is light source 406 generally depicting a plurality of pixels.

In some embodiments, stacking each LED as generally depicted in FIG. 4A may allow for larger surface area of an active region per pixel. A larger active region may allow for increased light output per pixel as opposed to the same pixel size/area split into four parts as depicted in FIG. 4B. In some embodiments, stacking smaller LEDs on top of larger ones as generally depicted in FIG. 4A may allow for LED edge emission, and therefore the LEDs generally in FIG. 4A may be understood as edge emitting LEDs (ELEDs).

In some embodiments, the order in which LEDs are vertically stacked—such as positioning the infrared (IR) LED above or below the red, green, and blue (RGB) LEDs—may be selected based on optical, electrical, or thermal considerations. For example, placing the IR LED above the RGB LEDs may help to reduce potential optical interference.

In some examples, stacking the IR LED on top may simplify the alignment of the IR output with dedicated optical elements such as outward-facing waveguides or diffusers.

In various embodiments, LEDs may be formed using semiconductor materials selected based on the desired emission wavelength. For visible light emissions (e.g., red, green, and blue), the LEDs may be formed from group III-nitride or III-V compound semiconductor materials. For example, the blue and green LEDs may comprise indium gallium nitride (InGaN) active regions grown on gallium nitride (GaN) or aluminum gallium nitride (AlGaN) layers, which are in turn supported by a suitable substrate such as sapphire, silicon carbide, silicon, or bulk GaN. Red LEDs may be formed using aluminum gallium indium phosphide (AlGaInP) or related III-V phosphide-based alloys grown on gallium arsenide (GaAs) or similar substrates, although in some embodiments, red LED InGaN-based materials may also be used.

In embodiments where infrared (IR) emission is desired, the IR LEDs may be formed from gallium arsenide (GaAs), indium gallium arsenide (InGaAs), aluminum gallium arsenide (AlGaAs), gallium indium arsenide antimonide (GaInAsSb) or other suitable materials having a bandgap corresponding to emission in the near-infrared or short-wave infrared range (e.g., 700 nm to 1600 nm). The IR LEDs may be grown on GaAs or InP substrates and may include one or more quantum wells or quantum dot layers to tailor the emission characteristics. In some embodiments, the IR LEDs may be monolithically integrated in a vertical stack with the visible light LEDs using wafer bonding, epitaxial regrowth, or intermediate tunnel junction layers.

The doping concentrations, barrier layers, cladding layers, and quantum well compositions may be configured according to known semiconductor device design principles for carrier injection efficiency, light extraction, and spectral purity for each emitter. Additional optical structures such as distributed Bragg reflectors (DBRs), transparent conductive layers, or wavelength conversion layers (e.g., phosphors or quantum dots) may be incorporated to enhance performance. In some embodiments, these layers may be disposed over, under or in between each LED described herein.

In various embodiments, a vertically stacked LED structure may be formed using a sequence of epitaxial growth and wafer bonding processes to create multiple optically and electrically isolated emitter layers (e.g., red, green, blue, and/or infrared). Each LED may be fabricated using material systems configured to the specific emission wavelength, and stacked in a common vertical optical axis. The process may begin with epitaxial growth of a first LED structure on a suitable substrate using techniques such as metal-organic chemical vapor deposition (MOCVD) or molecular beam epitaxy (MBE). For example, a blue-emitting indium gallium nitride (InGaN) LED may be grown on a gallium nitride (GaN) or sapphire substrate, including n-type, multiple quantum well (MQW), and p-type layers. Upon completion of the first LED structure, a tunnel junction may be grown or deposited on top of the p-type layer to enable electrical connection to a subsequent LED layer without requiring external interconnects.

After the first LED structure is completed, a second LED layer may be formed above it either by (i) direct epitaxial regrowth over the first device, or (ii) by wafer bonding a separately grown LED structure. In wafer bonding embodiments, the second LED structure (e.g., a green or red emitter grown on its own substrate) is bonded to the first using techniques such as plasma-activated bonding, oxide-oxide bonding, or metal-assisted bonding. The donor substrate of the second LED may then be removed via grinding and selective etching, exposing the active layers of the bonded emitter. In some cases, intermediate transparent or conductive bonding layers (e.g., indium tin oxide (ITO), $Al_2O_3$, or Au-based metals) may be included to improve optical coupling and alignment.

Figure 10A:
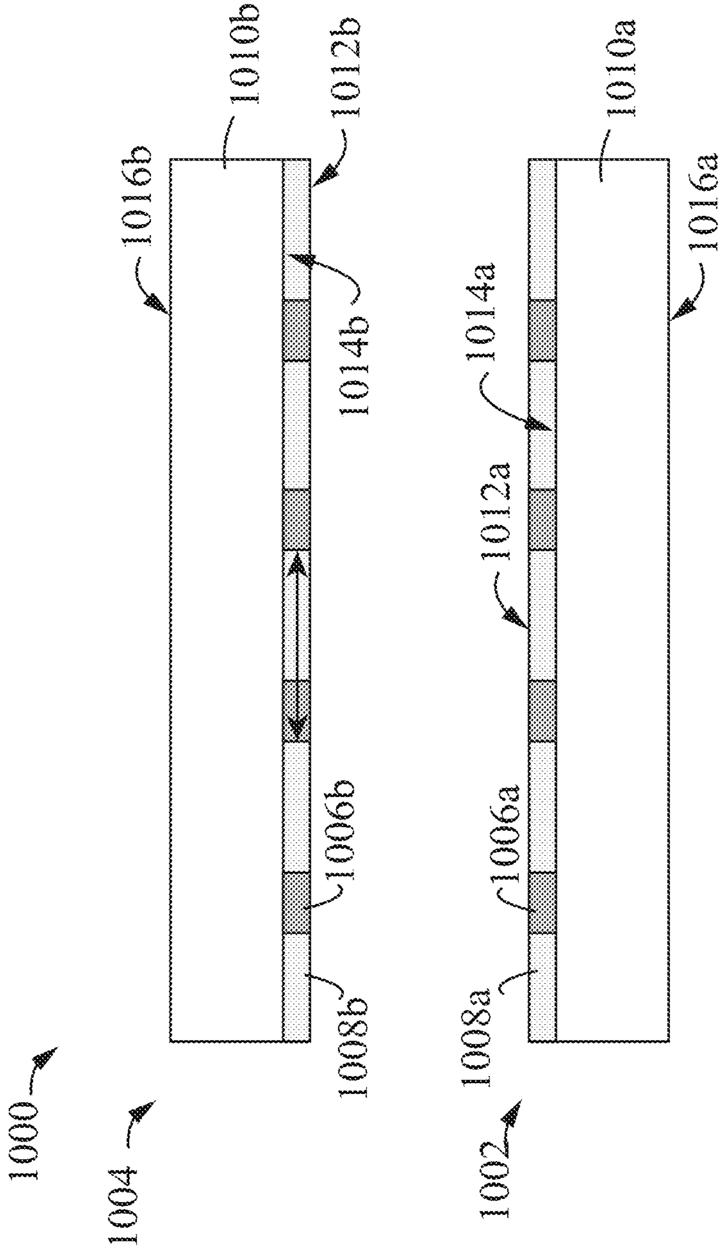
FIG. 10A schematically illustrates hybrid bonding, in accordance with some embodiments of the disclosure.
Figure 10B:
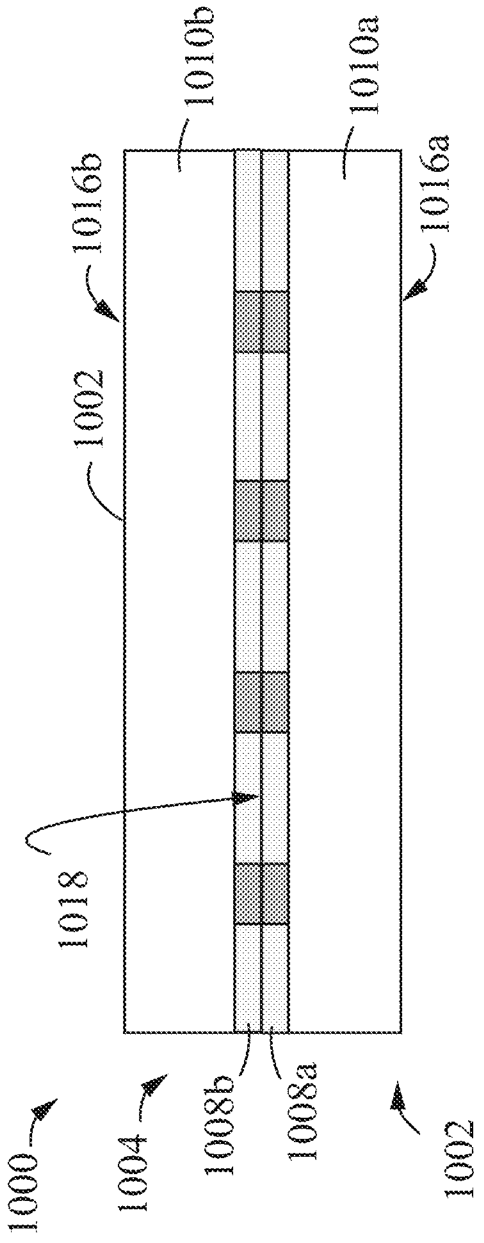
FIG. 10B schematically illustrates hybrid bonding, in accordance with some embodiments of the disclosure.

In some embodiments, the bonding regions (e.g., any of bonding region 415, bonding region 416, bonding region 417, and/or bonding region 418) may be the same or have similar features to those described in the bonding interfaces of FIGS. 10A-10B.

In some embodiments, to improve light extraction and coupling into a downstream optical system (e.g., waveguide, lens, or display panel), the light source (e.g., light source 400, light source 406) structure may further include one or more optical components, such as microlenses, diffractive structures, patterned films, or encapsulating layers. These optical features may be configured to enhance the uniformity and directionality of the emitted light from each subpixel.

FIG. 4B schematically illustrates a light source 420, and in particular, provides an isometric view of the light source 420, in accordance with some embodiments. In some embodiments, light source 420 comprises a plurality of pixels 426. Each pixel 426 of light source 420 may comprise a plurality of dies (e.g., die 422A, die 422B, die 422C, and die 424). The plurality of LEDs may be configured to emit light (e.g., RGB and/or IR) that may be used to form an XR image (e.g., Jigglypuff) and activate portions of a dimmable material. In some embodiments, each pixel 426 may comprise a singulated IC 428 configured to send drive signals to each LED. In some embodiments, each LED comprises semiconductor material previously described. Although FIG. 4B depicts a light source 420 comprising 3×3 pixels, any suitable number of pixels may be used. In one example, light source 420 may comprise 1920×1080 pixels (e.g., similar to light source 219 described in FIG. 2).

FIG. 4C schematically illustrates light source 430, and in particular, provides cross-sectional view of light source 430, in accordance with some embodiments. In some embodiments, the light source 430 may comprise a plurality of LEDs. Each LED may comprise a first die configured to cause a second die to emit a different wavelength of light. For example, light source 430 may comprise four LEDs, each configured to emit light of a different wavelength (e.g., RGBI). Each LED may comprise a first die (e.g., die 425) configured to emit a wavelength of light to excite a plurality of second dies (e.g., die 422A, die 422B, die 422C, and die 424).

Each first die may be communicatively coupled to a set of metal contacts (e.g., any of contacts 423). The contacts 423 may couple the plurality of first dies 425 to substrate 421. In some embodiments, substrate 421 may be any suitable semiconductor material comprising internal circuitry and/or drivers.

In some embodiments, disposed over the plurality of second dies (e.g., die 422A, die 422B, die 422C, and die 424) is a quantum dot (QD) encapsulation layer. In some embodiments, the QD encapsulation layer comprises a UV filter.

In some embodiments, the QD encapsulation layer 429 includes quantum dots that absorb incident high-energy blue photons and re-emit longer-wavelength light, such as red or green, depending on the quantum dot material composition and size. For example, when positioned above a blue die and in proximity to a red-emitting die, the QD encapsulation layer may serve dual functions: (1) downconverting blue light to red light to supplement or enhance the red emission spectrum, and (2) encapsulating or protecting the quantum dots from environmental degradation (e.g., oxidation or moisture ingress). The layer may be formed using a polymer or sol-gel matrix incorporating colloidal quantum dots, and may be applied by spin-coating, inkjet printing, or molding processes.

In a particular example, light source 430 may be configured to emit RGBI light, first die 425 may be a die configured to emit blue or near-ultraviolet (UV) light. The drivers disposed in substrate 421 may send signals through the contacts to cause blue light or UV light emission. The blue light or UV light emission may be used to excite one or more downconversion materials to generate light in a different spectral region. The downconversion material may be a phosphor, quantum dot, or other luminescent compound that absorbs the excitation light and re-emits light at a longer wavelength. Each of the first dies 425 may excite each of the respective second dies (e.g., die 422A, die 422B, die 422C, and die 424) to cause RGBI emission.

For example, first die 425 may be a blue-emitting light source (e.g., an InGaN-based LED) and may be optically coupled to a second die (e.g., 422C), a red-emitting phosphor layer. In some embodiments, red-emitting phosphor materials include, but are not limited to, europium-activated nitrides or oxynitrides such as (Sr,Ca) $AlSiN_3:Eu^{2+}$, $CaAlSiN_3:Eu^{2+}$, and $Sr_2Si_5N_8:Eu^{2+}$.

Similarly, green-emitting phosphors may be used in conjunction with a blue or UV emitter. Suitable green phosphors may include cerium-doped yttrium aluminum garnet (YAG:$Ce^{3+}$), β-sialon:$Eu^{2+}$, or other rare-earth or transition metal-activated compounds. Phosphors may be deposited as particulate layers in an organic or inorganic matrix, conformally coated over the emitter surface, or embedded in an optical structure such as a lens, waveguide, or film.

In some embodiments, an oxide (e.g., $SiO_2$) or other transparent material may be disposed over one of the blue emitting dies. In some embodiments, light source 430 may be representative of an RGBI pixel (e.g., comprising one of each color).

Figure 5:
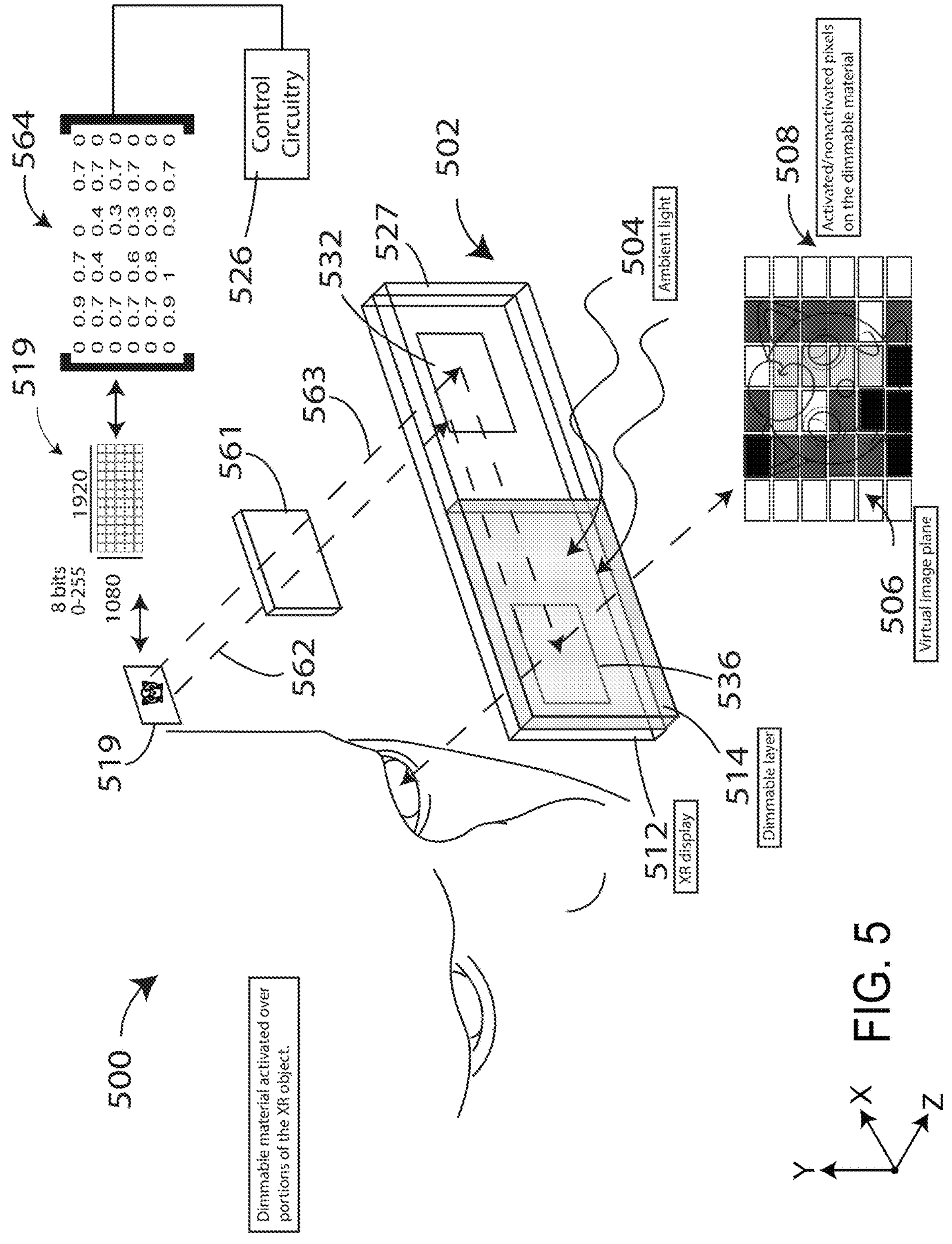
FIG. 5 illustrates systems and corresponding device structures to provide XR content, according to some embodiments.

FIG. 5 schematically illustrates system 500. In particular, FIG. 5 generally describes system 500 and XR device 502, in accordance with some embodiments. XR device 502 may be configured to present XR images (e.g., Jigglypuff on virtual image plane 506). In some embodiments, system 500 includes XR device 502, which may be the same or have similar features to XR devices described throughout the present disclosure (e.g., XR device 102, XR device 202, XR device 709A, XR device 709B, XR device 802A or XR device 802B). The system features described in FIG. 5 may be applied to any suitable system described throughout the present disclosure. That is, features described with respect to any figure may be used in combination with features described in connection with 5, unless otherwise explicitly stated.

FIG. 5 generally depicts an isometric view of system 500 and corresponding XR device 502. In some embodiments, XR device 502 comprises light source 519, control circuitry 526, XR display 512, optical element 561, and dimmable layer 514. optical component(s) 561, control circuitry 526, and XR device 502.

In some embodiments, light source 519 may be the same or have similar features to any light source of the present disclosure (e.g., any of light source 119, light source 219, light source 319, light source 346, light source 356, light source 400, light source 406, light source 420, and light source 430).

Figure 6:
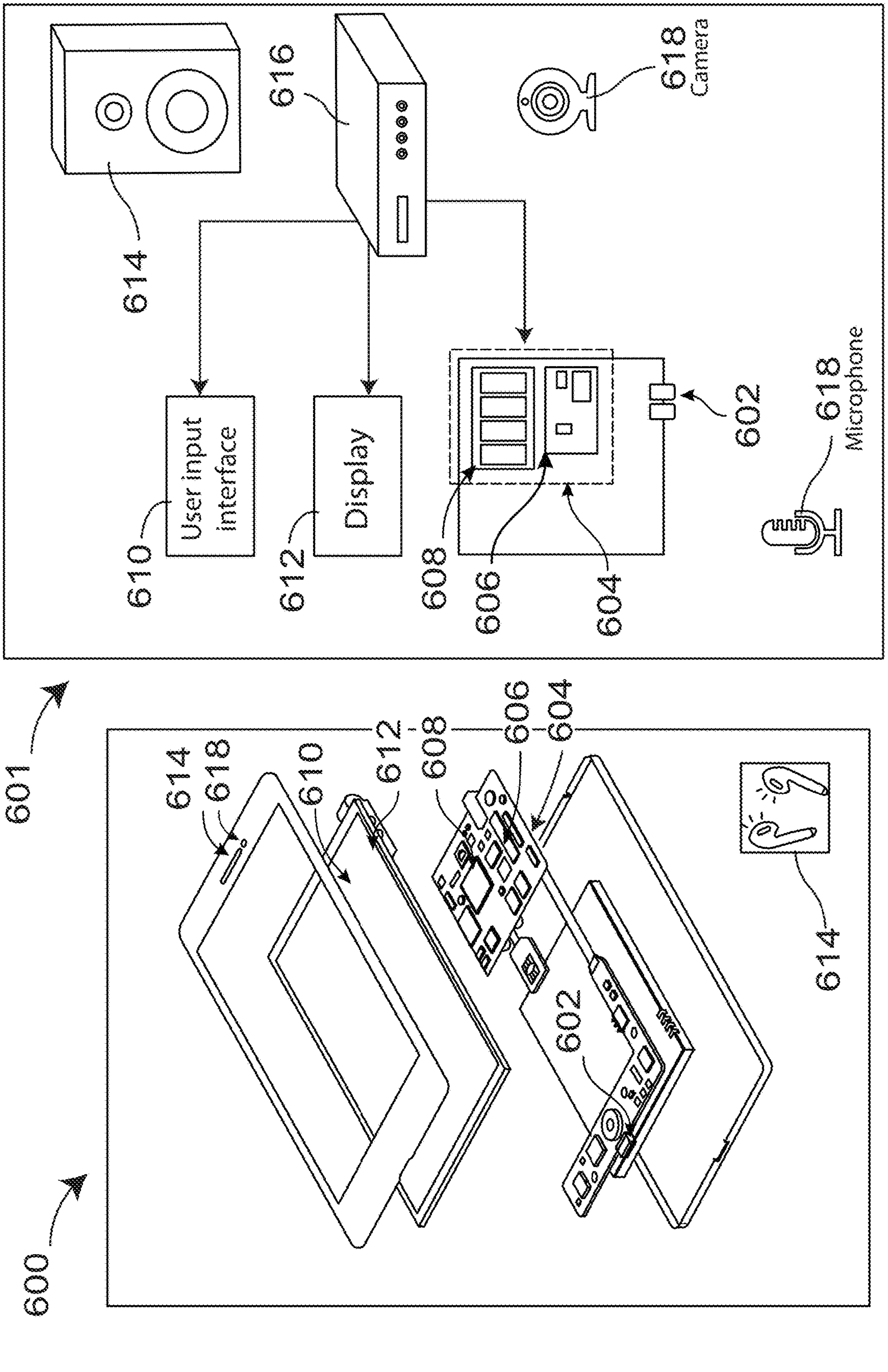
FIG. 6 is a block diagram of an illustrative user equipment device and system, according to some embodiments.
Figure 7:
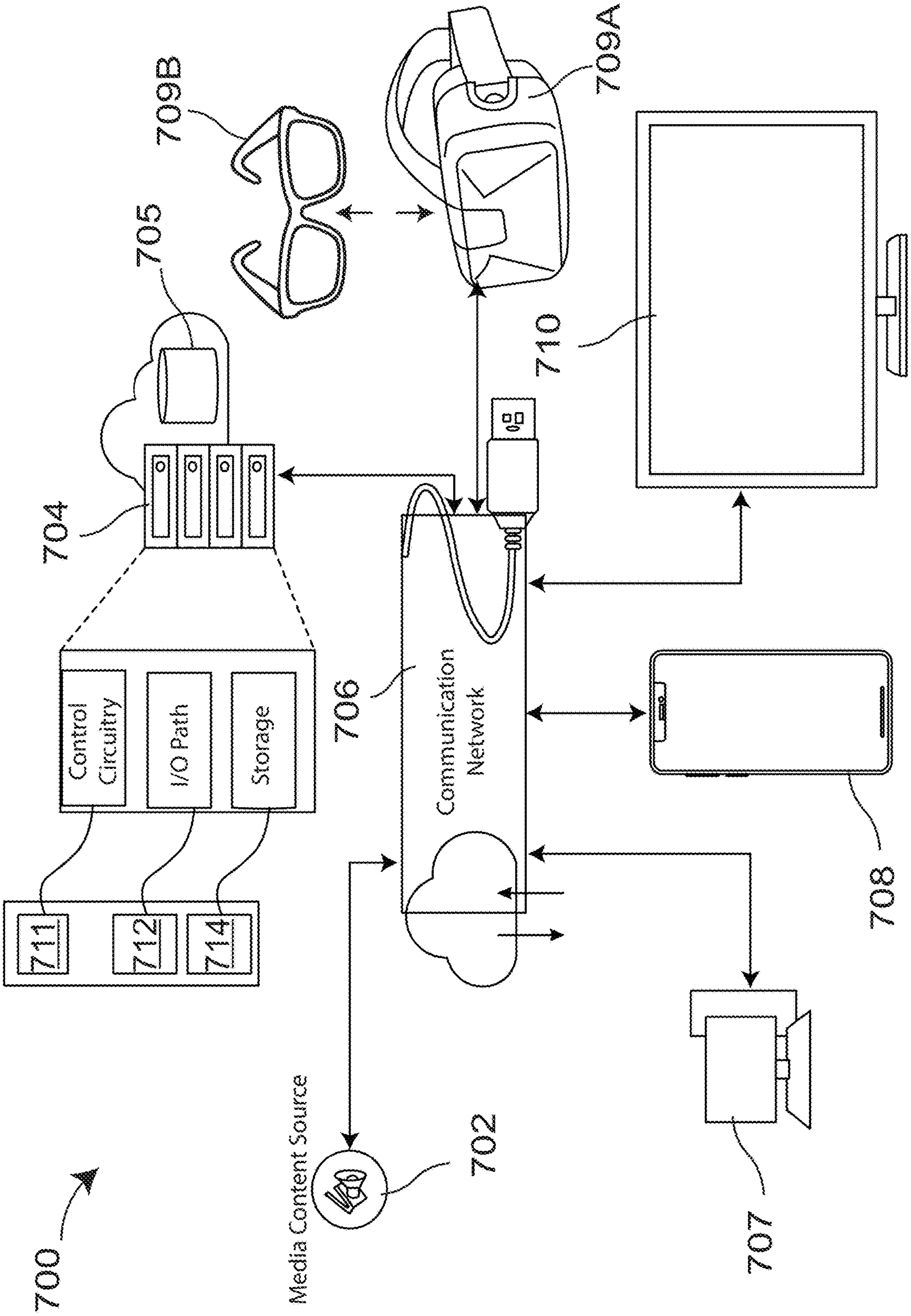
FIG. 7 is a block diagram of an illustrative user equipment device and system, according to some embodiments.

In some embodiments, control circuitry 526 may be the same as, or may include features similar to, the control circuitry described with respect to other embodiments, such as control circuitry 126 of FIG. 1B, control circuitry 604 of FIG. 6, and control circuitry 711 of FIG. 7. Each of these control units may be configured to coordinate display rendering, light modulation, sensor input processing, and drive signal generation for various optical and electronic components within each system described herein.

In one example, a control matrix 564 may be generated and used by control circuitry 526 to cause specific light intensities of light source 519 to be emitted. Drive signals may be driven at pixel level to cause varying, similar or same intensities, across the pixel map of light source 519. As depicted in FIG. 5A, control matrix 564 may comprise a plurality (e.g., 6×6) of values;

$$\begin{pmatrix} 0 & 0.9 & 0.7 & 0 & 0.7 & 0 \\ 0 & 0.7 & 0.4 & 0.4 & 0.7 & 0 \\ 0 & 0.7 & 0 & 0.3 & 0.7 & 0 \\ 0 & 0.7 & 0.6 & 0.3 & 0.7 & 0 \\ 0 & 0.7 & 0.8 & 0.3 & 0 & 0 \\ 0 & 0.9 & 1.0 & 0.9 & 0.7 & 0 \end{pmatrix}$$

Where each value of control matrix 564 may correspond to a respective light intensity value of light source 519 (e.g., VIS and/or IR). Although a 6×6 control matrix 564 is depicted, any suitable number of values may be used. In one approach, if light source 519 comprises 1920×1080 pixels, control matrix 564 may be adjusted to comprise a 1920×1080 matrix of values such that each value of control matrix 564 may cause internal control circuitry 526 to drive light intensity values proportional to values on control matrix 564. For example, a value of 0.9 may correspond to a signal causing a pixel of light source 519 to be driven to 90% intensity.

Although only one control matric is depicted there may be a plurality of control matrices, one generated per color (e.g., RGBI). In some embodiments, control matrix 564 may be output by an algorithm of a processor (on the XR device, application, or server).

In some embodiments, light source 519 may correspond to light path 562 and light path 563. In some embodiments, optical element 561 may be representative of a plurality of optical components (e.g., lenslet arrays, lenses, prisms, diffractive optical element, gratings, waveplates, holographic optical elements, optical filters, films or any combination thereof) configured to direct light from light source 519 into one or more waveguides.

In some embodiments, although a control matrix 564 is depicted, system 500 may not be limited to that specific implementation. Any suitable algorithms, processing techniques, or combinations thereof described herein may be utilized to achieve similar functionality. For example, system 500 may receive ambient light data (e.g., ambient light 504) and convert the received data into grayscale image data, as previously described with reference to FIG. 2. This grayscale data may then be used to perform brightness or opacity calculations on a per-pixel basis in connection with the control of IR emitter array.

In some embodiments, XR display 502 comprises waveguides and each waveguide may comprise an in-coupling diffractive grating 532, such that each respective light from light source 519 is coupled into the waveguides of XR display 502. In some embodiments, XR display 512 comprises substrate 527. In some embodiments, XR display 512 comprises out-coupling diffractive grating 536. In some embodiments, XR display 512 may generate a virtual image plane 506.

An enlarged view of what may be perceive through XR display 512 is illustrated at virtual image plane 506. In one example, representative boxes, depicting "pixels" of dimmable layer 514 are activated-based on the control matrix 564. A white pixel may correspond to a portion of the dimmable layer 514 comprising low to zero absorption (e.g., 0 value on the control matrix 564). A black pixel may correspond to a portion of the dimmable layer 514 excited to consist of high absorption (e.g., 0.9 value on the control matrix 564). In the example depicted in FIG. 5, control matrix 564 may correspond to the 6×6 pixel structure generally depicted.

In some embodiments, the light source 519 of the XR device 502 comprises a pixel driver system configured to independently control four subpixels per pixel unit, corresponding to red (approximately 620-750 nm), green (approximately 495-570 nm), blue (approximately 450-495 nm), and infrared (IR, approximately 850-1000 nm) emissions. The pixel driver system, implemented using a microdriver architecture, may be monolithically integrated with the microLED emitters on the same substrate using a chip-on-board (COB) configuration or operatively coupled via a separate IC die. The microdriver processes data streams containing visible image data (RGB) for rendering XR images and IR data for controlling the opacity of the dimmable layer 514.

In some embodiments, each subpixel within a pixel unit of the light source 519 may be driven by dedicated driver circuitry, comprising one or more transistors or current sources tailored to the electrical characteristics of the corresponding LED (e.g., first, second, third, or fourth LED. The driver circuitry may regulate current flow to each subpixel, providing control of light output intensity for red, green, blue, and IR emissions. In some embodiments, a subpixel may mean to be each independent drivable unit within a pixel capable of emitting light. For example, for a pixel capable of emitting RGBI light, a subpixel may be each individual element within that particular pixel.

In some embodiments, the microdriver of the light source 519 receives a data stream comprising at least four channels: three for visible red, green, and blue image content, and one for IR signals to control the dimmable layer 514's opacity. In some embodiments, the microdriver may apply drive signals to each subpixel based on the received data, modulating the intensity of visible light to render XR images and IR light to adjust the dimmable layer's opacity, such as forming opaque regions to enhance image contrast. In some instances, the IR channel may encode an opacity map to dynamically adjust light transmission in response to ambient light conditions detected by an imaging system.

In some embodiments, the pixel driver system provides dynamic modulation of subpixel output based on XR image content, ambient light luminance (e.g., measured in nits by the imaging system), user inputs, or control commands. For example, real-time per-pixel IR modulation may adjust the dimmable layer 514's opacity to achieve adaptive transparency or enhance contrast in specific regions of the XR display 512.

In some embodiments, incoming image data (e.g., video, AR scenes, or rendered graphics) is preprocessed by a system-on-chip (SoC) within the XR device 502 to separate visible image components (RGB) and opacity components for the dimmable layer 514. The SoC renders a three-dimensional (3D) scene and generates a per-pixel opacity map, encoded as IR intensity values, to control the dimmable layer's light transmission.

In some embodiments, the SoC computes per-pixel luminance from the RGB image data using a weighted sum, such as 0.2126R+0.7152G+0.0722B, to derive an IR opacity map for the dimmable layer 514. For example, pixels with high luminance (e.g., corresponding to bright XR image regions) may receive higher IR drive values to increase the dimmable layer's opacity, reducing ambient light interference, while low-luminance pixels may receive lower IR drive values to maintain transparency.

In some embodiments, additional sensors may be added to XR device 502 some examples include ambient light sensors, eye-tracking systems, or external cameras. For instance, if a bright region is detected in the environment (e.g., exceeding a luminance threshold in nits), the control circuitry may increase IR drive signals to darken corresponding regions of the dimmable layer 514, enhancing XR image contrast. In low-light conditions, IR drive signals may be reduced to preserve clarity and minimize power consumption.

In some embodiments, the SoC may generate IR opacity signals based solely on non-image inputs, such as ambient light sensor readings from an imaging system or user-defined settings stored in memory. For example, the system may apply a global opacity adjustment to the dimmable layer 514 based on environmental luminance levels or predefined preferences.

In some embodiments, the SoC combines ambient light sensor data from an imaging system with rendered RGB image content to generate a dynamic IR opacity map for the dimmable layer 514. The SoC may evaluates both external scene luminance (e.g., in nits) and computed pixel luminance from the RGB channels to determine per-pixel IR drive values. For example, in regions where high ambient luminance overlaps with bright XR image content, the SoC may increase IR intensity to enhance the dimmable layer's opacity.

FIGS. 6-7 describe example devices, systems, servers, and related hardware to provide XR objects in accordance with some embodiments of the present disclosure. FIG. 6 shows generalized embodiments of illustrative user equipment devices 600 and 601. For example, user equipment device 600 may be a smartphone device. In another example, user equipment system 601 may be a user television equipment system. User television equipment system 601 may include set-top box 616. Set-top box 616 may be communicatively connected to microphone 618, speaker 614, and dis-play 612. In some embodiments, microphone 618 may receive voice commands for the media ap-plication. In some embodiments, display 612 may be a television display 710, VR headset 709, mobile phone 708 or a computer display 707. In some embodiments, set-top box 616 may be communicatively connected to user input interface 610. In some embodiments, set-top box 616 is a smart home device. In some embodiments, user input interface 610 may be a remote control device. Set-top box 616 may include one or more circuit boards. In some embodiments, the circuit boards may include processing circuitry, control circuitry, and storage (e.g., RAM, ROM, Hard Disk, Removable Disk, etc.). In some embodiments, the circuit boards may include an input/output path. More specific implementations of user equipment devices are discussed below in connection with FIG. 6. Each one of user equipment device 600 and user equipment system 601 may receive con-tent and data via input/output ("I/O") path 602. I/O path 602 may provide content (e.g., broad-cast programming, on-demand programming, Internet content, content available over a local area network (LAN) or wide area network (WAN), and/or other content) and data to control circuitry 604, which includes processing circuitry 606 and storage 608. Control circuitry 604 may be used to send and receive commands, requests, and other suitable data using I/O path 602, which may comprise I/O circuitry. I/O path 602 may connect control circuitry 604 (and specifically processing circuitry 606) to one or more communications paths (described below). I/O functions may be provided by one or more of these communications paths, but are shown as a single path in FIG. 6 to avoid overcomplicating the drawing.

Control circuitry 604 may be based on any suitable processing circuitry such as processing circuitry 606. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores) or super-computer. In some embodiments, processing circuitry may be distributed across multiple separate processors or processing units, for example, multiple of the same type of processing units (e.g., two Intel Core i7 processors) or multiple different processors (e.g., an Intel Core i5 processor and an Intel Core i7 processor). In some embodiments, control circuitry 604 executes instructions for a media application stored in memory (i.e., storage 608). Specifically, control circuitry 604 may be instructed by the media application to perform the functions discussed above and below. In some implementations, any action performed by control circuitry 604 may be based on instructions received from the media application.

In client/server-based embodiments, control circuitry 604 may include communications circuitry suitable for communicating with a media application server or other networks or servers. The instructions for carrying out the above mentioned functionality may be stored on a server (which is described in more detail in connection with FIG. 6. Communications circuitry may include a cable modem, an integrated services digital network (ISDN) modem, a digital subscriber line (DSL) modem, a telephone modem, Ethernet card, or a wireless modem for communications with other equipment, or any other suitable communications circuitry. Such communications may involve the Internet or any other suitable communication networks or paths (which is described in more de-tail in connection with FIG. 6). In addition, communications circuitry may include circuitry that enables peer-to-peer communication of user equipment devices, or communication of user equipment devices in locations remote from each other (described in more detail below).

Memory may be an electronic storage device provided as storage 608 that is part of control circuitry 604. As referred to herein, the phrase "electronic storage device" or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVR, sometimes called a personal video recorder, or PVR), solid state devices, quantum storage devices, gaming consoles, gaming media, or any other suitable fixed or removable storage devices, and/or any combination of the same. Storage 608 may be used to store various types of content described herein as well as media ap-plication data described above. Nonvolatile memory may also be used (e.g., to launch a boot-up routine and other instructions). Cloud-based storage, described in relation to FIG. 6, may be used to supplement storage 608 or instead of storage 608.

Control circuitry 604 may include video generating circuitry and tuning circuitry, such as one or more analog tuners, one or more MPEG-2 decoders or other digital decoding circuitry, high-definition tuners, or any other suitable tuning or video circuits or combinations of such circuits. Encoding circuitry (e.g., for converting over-the-air, analog, or digital signals to MPEG signals for storage) may also be provided. Control circuitry 604 may also include scaler circuitry for up-converting and down converting content into the preferred output format of user equipment 600. Circuitry 604 may also include digital-to-analog converter circuitry and analog-to-digital convert-er circuitry for converting between digital and analog signals. The tuning and encoding circuitry may be used by user equipment device 600, 601 to receive and to display, to play, or to record content. The tuning and encoding circuitry may also be used to receive guidance data. The circuitry described herein, including for example, the tuning, video generating, encoding, decoding, encrypting, decrypting, scaler, and analog/digital circuitry, may be implemented using software running on one or more general purpose or specialized processors. Multiple tuners may be provided to handle simultaneous tuning functions (e.g., watch and record functions, picture-in-picture (PIP) functions, multiple-tuner recording, etc.). If storage 608 is provided as a separate device from user equipment device 600, the tuning and encoding circuitry (including multiple tuners) may be associated with storage 608.

A user may send instructions (e.g., target opacity) to control circuitry 604 using user input interface 610. User input interface 610 may be any suitable user interface, such as a remote control, mouse, trackball, key-pad, keyboard, touch screen, touchpad, stylus input, joystick, voice recognition interface, or other user input interfaces. Display 612 may be provided as a stand-alone device or integrated with other elements of each one of user equipment device 600 and user equipment system 601. For example, display 612 may be a touchscreen or touch-sensitive display. In such circumstances, us-er input interface 610 may be integrated with or combined with display 612. Display 612 may be one or more of a monitor, a television, a display for a mobile device, or any other type of display. A video card or graphics card may generate the output to display 612. The video card may be any processing circuitry described above in relation to control circuitry 604. The video card may be integrated with the control circuitry 604. Speakers 614 may be provided as integrated with other elements of each one of user equipment device 600 and user equipment system 601 or may be stand-alone units. The audio component of videos and other content displayed on display 612 may be played through the speakers 614. In some embodiments, the audio may be distributed to a receiver (not shown), which processes and outputs the audio via speakers 614.

The media application may be implemented using any suitable architecture. For example, it may be a stand-alone application wholly-implemented on each one of user equipment device 600 and user equipment system 601. In such an approach, instructions of the application are stored locally (e.g., in storage 608), and data for use by the application is downloaded on a periodic basis (e.g., from an out-of-band feed, from an Internet resource, or using another suitable approach). Control circuitry 604 may retrieve instructions of the application from storage 608 and process the instructions to rearrange the segments as discussed. Based on the processed instructions, control circuitry 604 may determine what action to perform when input is received from user input inter-face 610. For example, movement of a cursor on a display up/down may be indicated by the processed instructions when user input interface 610 indicates that an up/down button was selected.

In some embodiments, the media application is a client/server-based application. Data for use by a thick or thin client implemented on each one of user equipment device 600 and user equipment system 601 is retrieved on-demand by issuing requests to a server remote to each one of user equipment device 600 and user equipment system 601. In one example, of a client/server-based guidance application, control circuitry 604 runs a web browser that interprets web pages provided by a remote server. For example, the remote server may store the instructions for the application in a storage device. The remote server may process the stored instructions using circuitry (e.g., control circuitry 604) to perform the operations discussed in connection with any of FIGS. 1-11.

In some embodiments, the media application may be downloaded and interpreted or otherwise run by an interpreter or virtual machine (run by control circuitry 604). In some embodiments, the media application may be encoded in the ETV Binary Interchange Format (EBIF), received by the control circuitry 604 as part of a suitable feed, and interpreted by a user agent running on control circuitry 604. For example, the media application may be an EBIF application. In some embodiments, the media application may be defined by a series of JAVA-based files that are received and run by a local virtual machine or other suitable middleware executed by control circuitry 604. In some of such embodiments (e.g., those employing MPEG-2 or other digital media encoding schemes), the media application may be, for example, encoded and transmitted in an MPEG-2 object carousel with the MPEG audio and video packets of a program.

In some embodiments, instructions for determining and applying target opacity values to an XR device (e.g., one of XR device 102, XR device 202, XR device 502, XR device 709A, XR device 709B, XR device 802A, XR device, 802B or any other XR device of the present disclosure) may be executed either locally by the control circuitry 604 or remotely via a server. For example, the server may receive ambient light data, user preferences, device parameters, or contextual content information, and may calculate per-pixel or global opacity values accordingly. These opacity values may then be transmitted to user equipment device 600, 601, or another XR-capable display device for implementation. In other embodiments, control circuitry 604 on the local device may perform similar calculations using sensor inputs (e.g., cameras, ambient light detectors) and rendering instructions stored in memory 608 or received from the server.

FIG. 7 generally describes devices (e.g., XR capable devices) connected to a communication network 706, in accordance with some embodiments of the disclosure. User equipment devices 707, 708, 710, 709A, 709B may be coupled to communication network 706. Communication network 706 may be one or more net-works including the Internet, a mobile phone network, mobile voice or data network (e.g., a 4G or LTE network), cable network, public switched telephone network, or other types of communication network or combinations of communication networks. Paths (e.g., depicted as arrows connecting the respective devices to the communication network 706) may separately or together include one or more communications paths, such as a satellite path, a fiber-optic path, a cable path, a path that supports Internet communications (e.g., IPTV), free-space connections (e.g., for broadcast or other wireless signals), or any other suitable wired or wireless communications path or combination of such paths. Communications with the client devices may be provided by one or more of these communications paths but are shown as a single path in FIG. 7 to avoid over-complicating the drawing.

Although communications paths are not drawn between user equipment devices, these devices may communicate directly with each other via communications paths as well as other short-range, point-to-point communications paths, such as USB cables, IEEE 1394 cables, wireless paths (e.g., Bluetooth, infrared, IEEE 702-11x, etc.), or other short-range communication via wired or wire-less paths. The user equipment devices may also communicate with each other directly through an indirect path via communication network 706.

System 700 includes a media content source 702 and a server 704, which may comprise or be as-sociated with database 705. Communications with media content source 702 and server 704 may be exchanged over one or more communications paths but are shown as a single path in FIG. 7 to avoid overcomplicating the drawing. In addition, there may be more than one of each of media content source 702 and server 704, but only one of each is shown in FIG. 7 to avoid overcomplicating the drawing. If desired, media content source 702 and server 704 may be integrated as one source device.

In some embodiments, server 704 may include control circuitry 711 and a storage 714 (e.g., RAM, ROM, Hard Disk, Removable Disk, etc.). Server 704 may also include an input/output path 712. I/O path 712 may provide device information, or other data, over a local area network (LAN) or wide area network (WAN), and/or other content and data to the control circuitry 711, which includes processing circuitry, and storage 714. The control circuitry 711 may be used to send and receive commands, requests, and other suitable data using I/O path 712, which may comprise I/O circuitry. I/O path 712 may connect control circuitry 704 (and specifically processing circuitry) to one or more communications paths.

Control circuitry 711 may be based on any suitable processing circuitry such as one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores) or super-computer. In some embodiments, control circuitry 711 may be distributed across multiple separate processors or processing units, for example, multiple of the same type of processing units (e.g., two Intel Core i7 processors) or multiple different processors (e.g., an Intel Core i5 processor and an Intel Core i7 processor). In some embodiments, the control circuitry 711 executes instructions for an emulation system application stored in memory (e.g., the storage 714). Memory may be an electronic storage device provided as storage 714 that is part of control circuitry 711.

Server 704 may retrieve guidance data from media content source 702, process the data as will be described in detail below, and forward the data to \ user equipment devices 707 and 710. Media content source 702 may include one or more types of content distribution equipment including a television distribution facility, cable system headend, satellite distribution facility, programming sources (e.g., television broadcasters, such as NBC, ABC, HBO, etc.), intermediate distribution facilities and/or servers, Internet providers, on-demand media servers, and other content providers. NBC is a trademark owned by the National Broadcasting Company, Inc., ABC is a trade-mark owned by the American Broadcasting Company, Inc., and HBO is a trademark owned by the Home Box Office, Inc. Media content source 702 may be the originator of content (e.g., a television broadcaster, a Webcast provider, etc.) or may not be the originator of content (e.g., an on-demand content provider, an Internet provider of content of broadcast programs for down-loading, etc.). Media content source 702 may include cable sources, satellite providers, on-demand providers, Internet providers, over-the-top content providers, or other providers of con-tent. Media content source 702 may also include a remote media server used to store different types of content (including video content selected by a user), in a location remote from any of the client devices. Media content source 702 may also provide metadata that can be used to identify important segments of media content as described above.

Client devices may operate in a cloud computing environment to access cloud services. In a cloud computing environment, various types of computing services for content sharing, storage or distribution (e.g., video sharing sites or social networking sites) are provided by a collection of net-work-accessible computing and storage resources, referred to as "the cloud." For example, the cloud can include a collection of server computing devices (such as, e.g., server 704), which may be located centrally or at distributed locations, that provide cloud-based services to various types of users and devices connected via a network such as the Internet via communication network 706. In such embodiments, user equipment devices may operate in a peer-to-peer manner without communicating with a central server.

In some embodiments, a user device may be an extended reality (XR) display (e.g., HMD 709A) capable of augmented reality, virtual reality or a combination thereof. In some embodiments, the display may be combined with an XR system to provide enhanced 3D images with real depth and/or provide tactile features on the XR display itself.

Figure 8:
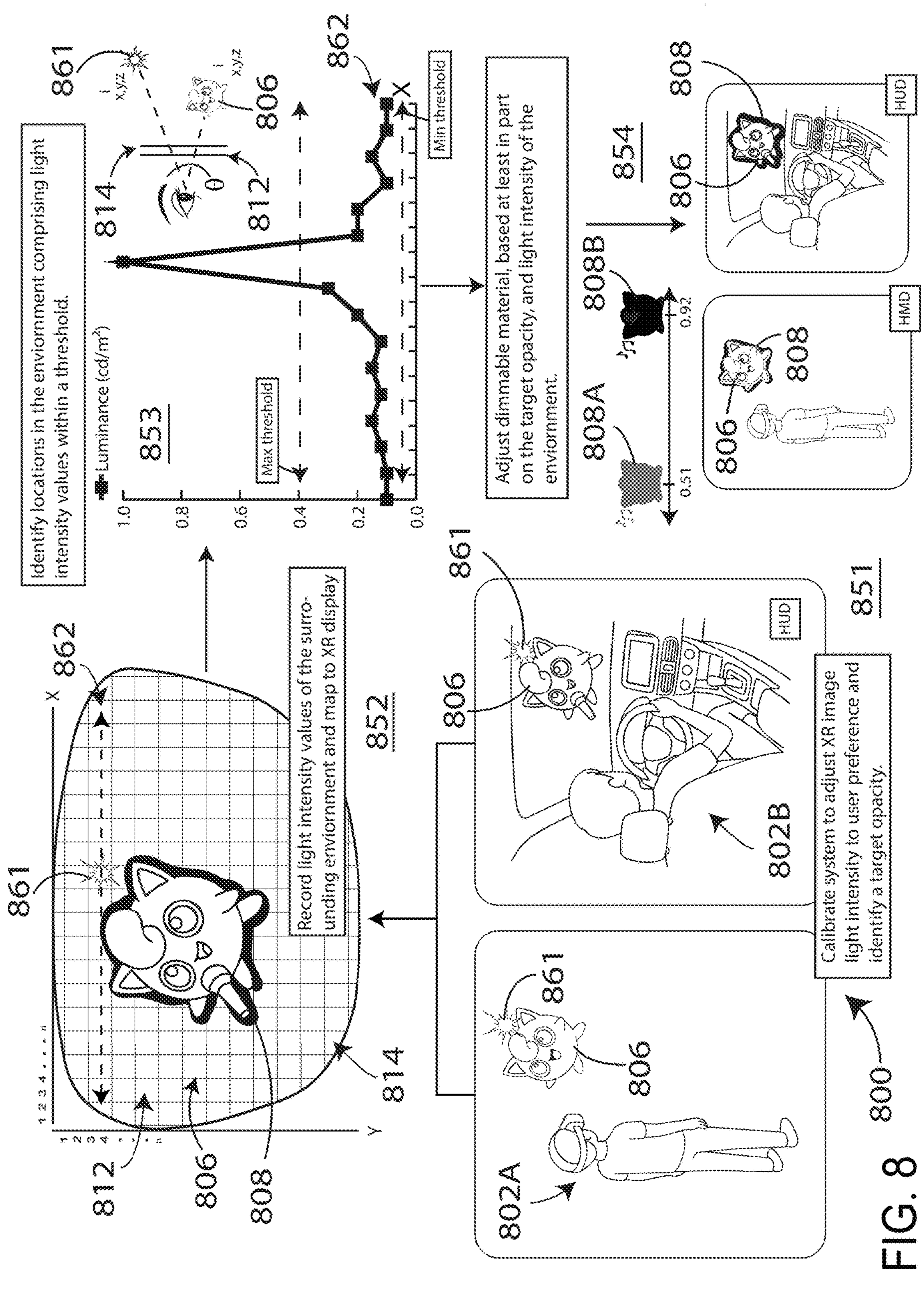
FIG. 8 is a block diagram illustrating a system for driving a dimmable material of a device, according to some embodiments.

FIG. 8 schematically illustrates an example process flow diagram for dynamically adjusting one or more regions of a dimmable layer 814 in an XR device (e.g., XR device 802A or XR device 802B) based on ambient light conditions (e.g., bright light source 861), according to some embodiments. In certain embodiments, XR device 802A may correspond to an XR HMD, while in other embodiments, XR device 802B may correspond to an XR HUD integrated into a vehicle.

XR device 802A and XR device 802B may be configured to present XR images 806. In some embodiments, system 800 includes XR device 802A and/or XR device 802B, which may correspond to any XR device described throughout the present disclosure In some embodiments, system 800 includes either XR device 802A or XR device 802B, each may be configured to display an XR image 806 and an opaque object 808 in response to a detected bright light (e.g., bright light source 861). In some embodiments, system 800 may be executable by an application (e.g., Pokémon GO) installed on the XR device or on a mobile application communicatively coupled to the XR device.

In one particular example, a user may initiate Pokemon GO on an XR HMD (e.g., XR device 802A) to provide XR images (e.g., Jigglypuff). A user may find it difficult to perceive the XR image, due in part to bright light source 861, and may initiate features on the XR application to change the opacity of the XR image (e.g., provide opaque object 808). Changing the opacity of the XR image (e.g., by providing opaque object 808) may increase the perceived brightness of the XR image and/or block (fully or partially) light from the environment (e.g., bright light source 861) incident on the XR display.

In some embodiments, the process executed by system 800 begins at step 851, which comprises calibrating the system to user preferences or environmental conditions. For instance, the user may be prompted (e.g., via a graphical user interface or application instruction) to manually adjust the opacity of the opaque object 806 overlaying the XR image 806. The user may adjust this opacity until the perceived visual contrast or clarity of the XR image reaches a satisfactory or optimal level. The resulting calibration settings may then be stored and applied dynamically during subsequent use. In some cases, system 800 may cause both XR image 806 and opaque object 808 to be disposed to the user, the system may provide (e.g., through UI) a scale (e.g., from 0-100) (e.g., scale at step 854) prompting the user to manually adjust the intensity of the XR image and the opacity of the opaque object 808 to preferred visibility in the current environment. System 800 may then record both user preferences with recorded light conditions. System 800 may prompt the user to calibrate a second time in a different light condition, once data is collected at two different environmental light levels, the system may determine a slope between each and interpolate accordingly in order to dynamically adjust brightness of the XR image and opacity of the opaque object in different lighting conditions.

In some embodiments, storing calibration settings may comprise storing drive signal values for each relevant light source—for example, the IR or UV light source configured to activate dimmable layer 814, and the visible light source responsible for rendering the XR image 806. Additionally, system 800 may associate and store these drive signal values with corresponding ambient light condition measurements or ranges obtained during the calibration step. In some embodiments, the calibration process causes system 800 to determine a target opacity.

In some embodiments, the calibration process may involve determining a contrast value preferred by the user. For example, the user may select or adjust the opacity of dimmable layer 814 to achieve a visually desirable contrast ratio between the XR image 806 and ambient light conditions. This contrast ratio may then be computed, stored, and subsequently applied by system 800 as an algorithmic reference. In one application, when ambient lighting conditions change (e.g., becoming brighter or dimmer) system 800 may automatically interpolate (e.g., using the stored algorithm) or extrapolate the stored contrast ratio to dynamically modulate both the opacity of the opaque object and the XR image brightness.

In other embodiments, system 800 may leverage the stored calibration data and contrast algorithms not only for optimal visual contrast but also to reduce power consumption. For instance, in situations with high ambient brightness, instead of significantly increasing the brightness of XR image 806 (e.g., by driving the light source which may substantially increase power usage) system 800 may increase the opacity of opaque object or attenuation provided by dimmable layer 814 (or vice versa).

In some embodiments, the calibration process, or any process and/or system described herein, may be controlled or dictated by a developer through an API.

At step 852, system 800 may cause the XR device (e.g., XR HMD 802A or XR HMD 802B) to record light intensity values of the surrounding environment. In some embodiments, external camera systems of XR device may be utilized for this process. In one example, device 802B may be inside or otherwise incorporated into a vehicle, and system 800 may utilize external camera systems of the vehicle to record light intensity values.

System 800 may correlate environmental data to areas on the XR display 814. In one example, system 800 may number pixels and/or pixel locations on the XR display 812 (e.g., 1, 2, 3, 4 . . . n). System 800 may then scan each row and/or column of the numbered pixels (e.g., line 862) and determine light intensity (e.g., luminance) values corresponding to pixel locations.

At step 853, the internal processing circuitry of XR device 802A or 802B may estimate projected luminance values corresponding to values that may appear across specific pixels on XR display 812 (e.g., via luminance graph). In some embodiments, a maximum and/or minimum threshold may be applied to determine locations of high or extreme luminance values. In the example generally depicted in FIG. 8, if a max light intensity threshold of 0.4 is applied, system 800 may be triggered to apply or adjust opaque object 808 in response to determining that the sun from the environment (e.g., bright light source 861) is over the intensity threshold.

At step 854, in some embodiments, upon determining the spatial location (e.g., x, y, and z coordinates) and corresponding light intensity (e.g., value i) of ambient light conditions (e.g., identifying glare spot and/or bright light source 861), system 800 may adjust and/or drive IR light from a light source to activation portions of the dimmable layer 814 generating opaque object 808.

In one example, system 800 may identify and target one or more regions of dimmable layer 814 for activation and/or modulation based at least in part on the recorded light intensity values. For example, although opaque object is in a similar shape to that of the XR image (e.g., Jigglypuff) system 800 may selectively activate portions of the dimmable layer to sole block bright light source 861. An example is generally depicted by the lone opaque pixel apart from opaque object 108, at step 155 in FIG. 1B. In other embodiments, system 800 may selectively target only those pixels of dimmable layer 814 that directly correspond to the perceived location of the bright light source 861 within the user's FOV.

In one example, XR image 806 may already be associated with an activated region of dimmable layer causing a first opaque object 808A (e.g., driven at 51% intensity). System 800 may dynamically modify the existing first opaque object 808A by expanding or shifting it to include a second opacity value (e.g., second opaque object 808B) (e.g., driven to 92%). Step 854 generally depicts what each user of each respective XR device may observe.

Figure 9:
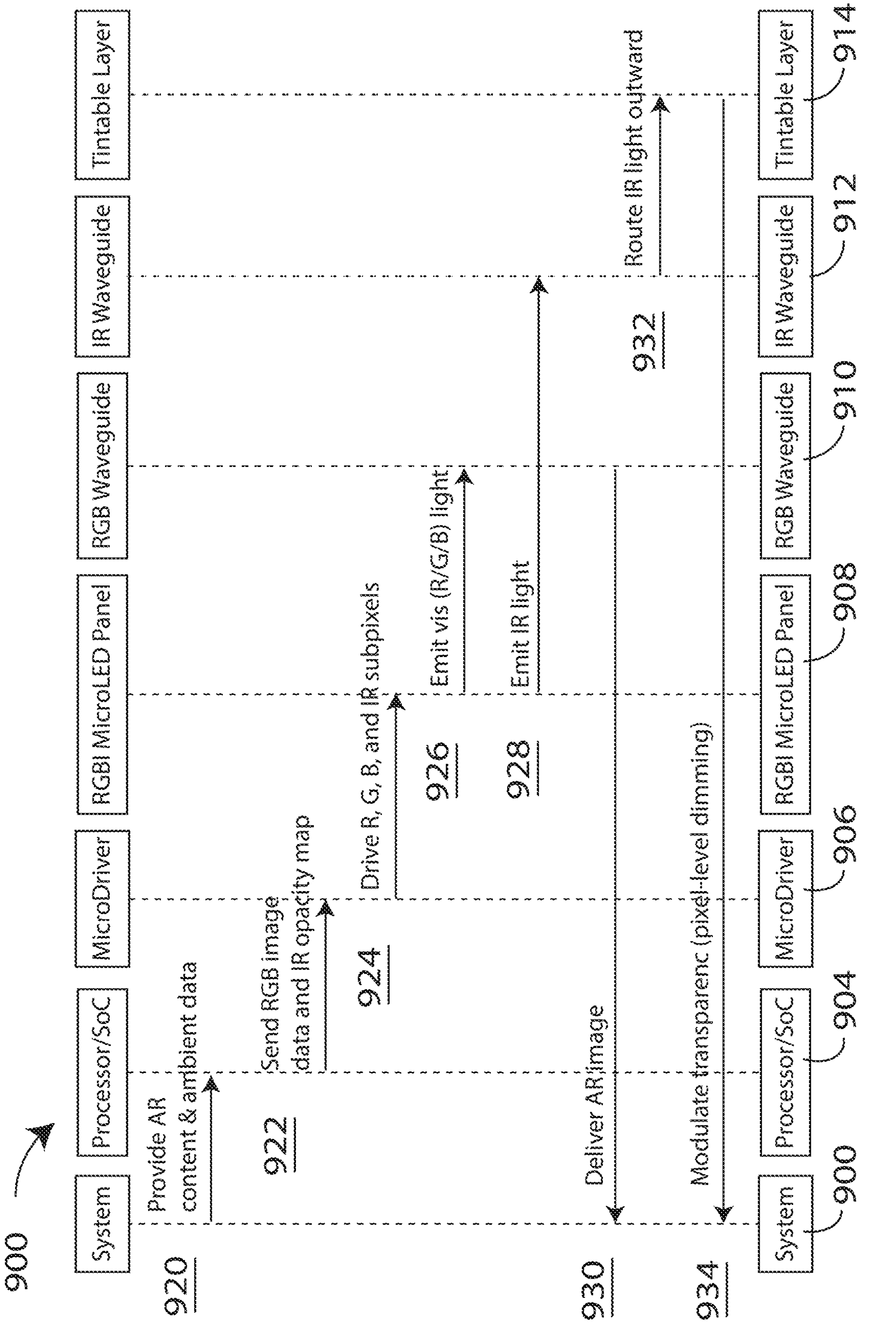
FIG. 9 is a sequence diagram illustrating a system for providing an XR content, according to some embodiments.

FIG. 9 is a process sequence diagram of system 900 for generating an XR images, according to some embodiments.

In some embodiments, system 900 may correspond to any system or be applied to any XR device described throughout the present disclosure. That is, features described with respect to any figure may be used in combination with features described in connection with FIG. 9, unless otherwise explicitly stated. System 900 generally describes adjusting an opaque object with an XR image to provide a brighter appearance of an XR image. In some embodiments, system 900, ran via an application on an XR device, comprises a processor/SoC 904, micro driver 906 (e.g., control circuitry), RGBI micro-LED panel 908 (e.g., light source), RGB waveguide 910 (e.g., XR display), IR waveguide 912, and tintable layer 914 (e.g., dimmable layer).

The system begins at step 920 where the system provides AR content and ambient data to the processor. At step 922 the processor sends RGB image data and IR opacity map to the micro driver. At step 924 the micro driver drives the RGB and IR subpixels. At step 926 the RGBI micro-LED panel emits RGB light, and at step 928 causes the RGBI micro-LED panel to emit IR light. At step 930 the light emitted from the RGB micro-LED panel is delivered through the RGB waveguide to generate/deliver an AR image. At step 932 IR light propagates through the IR waveguide to excite portions of the tintable layer 914. At step 934 the tintable layer modulates transparency causing pixel level dimming.

In one embodiment, an augmented reality (AR) system may comprise a head-mounted display (HMD), eyewear frame, or other wearable device incorporating a microLED display panel. Each pixel of the panel may include four subpixels configured to emit red (R), green (G), blue (B), and infrared (IR) light, respectively. The R, G, and B subpixels may be optically coupled to waveguides or other light-guiding elements that direct visible light inward toward the user's eye to form the AR image. The IR subpixel may be coupled to a separate waveguide configured to emit infrared light outward toward a tintable layer positioned on the outward-facing surface of the device.

The tintable layer may comprise an electro-optic or phototropic material configured to modulate its optical transmission properties in response to infrared illumination. Accordingly, the IR light emitted by the microLED IR subpixel may be used to control the local opacity of the tintable layer on a per-pixel basis. This configuration enables pixel-aligned, co-located control of both visible and IR emission paths, allowing the device to dynamically adjust the visibility of the real-world background without the need for a separate IR projector.

In operation, pixel-level data for both the RGB image content and the IR opacity map may be generated by an external or integrated processor. The RGBI data is transmitted to a micro driver that coordinates current delivery to each subpixel based on the desired brightness or opacity control. The RGB data is directed at the corresponding visible waveguides, while the IR drive signals are applied to modulate the tintable layer via the IR waveguide system. This allows each pixel to simultaneously deliver visual content and independently control local background dimming or transparency.

In some embodiments, one or more cameras may be integrated into the AR system to continuously capture real-time images of the surrounding environment. These image streams may be processed to assess ambient brightness levels and spatial contrast patterns. Based on the processed data, the system may generate an updated IR drive map that aligns with the visible display and is optimized for each region within the user's field of view. This feedback-driven approach enables dynamic, adaptive control of the tintable layer's transparency in response to environmental lighting conditions. As a result, the system maintains optimal contrast and readability for augmented content regardless of external illumination.

FIGS. 10A and 10B schematically illustrate cross-sectional side views of first and second elements 1002, 1004 prior to and after, respectively, a process for forming a directly bonded structure, and more particularly a hybrid bonded structure, according to some embodiments. In FIG. 10B, a bonded structure 1000 comprises the first and second elements 1002 and 1004 that are directly bonded to one another at a bond interface 1018 without an intervening adhesive. Conductive features **1006*a* of a first element 1002 may be electrically connected to corresponding conductive features 1006*b* of a second element 1004. In the illustrated hybrid bonded structure 1000, the conductive features 1006*a* are directly bonded to the corresponding conductive features 1006*b*** without intervening solder or conductive adhesive.

In some embodiments, the first element 1002 and second element 1004 may be the same or have similar features to each bond interface of FIG. 4A (e.g., any of bonding region 415, bonding region 416, bonding region 417, and/or bonding region 418).

The conductive features **1006*a* and 1006*b* of the illustrated embodiment are embedded in, and can be considered part of, a first bonding layer 1008*a* of the first element 1002 and a second bonding layer 1008*b* of the second element 1004, respectively. Field regions of the bonding layers 1008*a*, 1008*b* extend between and partially or fully surround the conductive features 1006*a*, 1006*b*. The bonding layers 1008*a*, 1008*b* can comprise layers of non-conductive materials suitable for direct bonding, as described above, and the field regions are directly bonded to one another without an adhesive. The non-conductive bonding layers 1008*a*, 1008*b* can be disposed on respective front sides 1014*a*, 1014*b* of base substrate portions 1010*a*, 1010*b***.

The first and second elements 1002, 1004 can comprise microelectronic elements, such as semiconductor elements, including, for example, integrated device dies, wafers, passive devices, discrete active devices such as power switches, MEMS, etc. In some embodiments, the base substrate portion can comprise a device portion, such as a bulk semiconductor (e.g., silicon) portion of the elements 1002, 1004, and back-end-of-line (BEOL) interconnect layers over such semiconductor portions. The bonding layers **1008*a*, 1008*b* can be provided as part of such BEOL layers during device fabrication, as part of redistribution layers (RDL), or as specific bonding layers added to existing devices, with bond pads extending from underlying contacts. Active devices and/or circuitry can be patterned and/or otherwise disposed in or on the base substrate portions 1010*a*, 1010*b*, and can electrically communicate with at least some of the conductive features 1006*a*, 1006*b*. Active devices and/or circuitry can be disposed at or near the front sides 1014*a*, 1014*b* of the base substrate portions 1010*a*, 1010*b*, and/or at or near opposite backsides 1016*a*, 1016*b* of the base substrate portions 1010*a*, 1010*b*. In other embodiments, the base substrate portions 1010*a*, 1010*b* may not include active circuitry, but may instead comprise dummy substrates, passive interposers, passive optical elements (e.g., glass substrates, gratings, lenses), etc. The bonding layers 1008*a*, 1008*b*** are shown as being provided on the front sides of the elements, but similar bonding layers can be additionally or alternatively provided on the back sides of the elements.

In some embodiments, the base substrate portions **1010*a*, 1010*b* can have significantly different coefficients of thermal expansion (CTEs), and bonding elements that include such different based substrate portions can form a heterogenous bonded structure. The CTE difference between the base substrate portions 1010***a* and 1010*b*, and particularly between bulk semiconductor (typically single crystal) portions of the base substrate portions 1010*a*, 1010*b*, can be greater than 5 ppm/° C. or greater than 10 ppm/° C. For example, the CTE difference between the base substrate portions 1010*a* and 1010*b* can be in a range of 5 ppm/° C. to 100 ppm/° C., 5 ppm/° C. to 40 ppm/° C., 10 ppm/° C. to 100 ppm/° C., or 10 ppm/° C. to 40 ppm/° C.

In some embodiments, one of the base substrate portions 1010*a*, 1010*b* can comprise optoelectronic single crystal materials, including perovskite materials, which are useful for optical piezoelectric or pyroelectric applications, and the other of the base substrate portions 1010*a*, 1010*b* comprises a more conventional substrate material. For example, one of the base substrate portions 1010*a*, 1010*b* comprises lithium tantalate (LiTaO3) or lithium niobate ($LiNbO_3$), and the other one of the base substrate portions 1010*a*, 1010*b* comprises silicon (Si), quartz, fused silica glass, sapphire, or a glass. In other embodiments, one of the base substrate portions 1010*a*, 1010*b* comprises a III-V single semiconductor material, such as gallium arsenide (GaAs) or gallium nitride (GaN), and the other one of the base substrate portions 1010*a*, 1010*b* can comprise a non-III-V semiconductor material, such as silicon (Si), or can comprise other materials with similar CTE, such as quartz, fused silica glass, sapphire, or a glass. In still other embodiments, one of the base substrate portions 1010*a*, 1010*b* comprises a semiconductor material and the other of the base substrate portions 1010*a*, 1010*b* comprises a packaging material, such as a glass, organic or ceramic substrate.

In some arrangements, the first element 1002 can comprise a singulated element, such as a singulated integrated device die. In other arrangements, the first element 1002 can comprise a carrier or substrate (e.g., a semiconductor wafer) that includes a plurality (e.g., tens, hundreds, or more) of device regions that, when singulated, forms a plurality of integrated device dies, though in other embodiments such a carrier can be a package substrate or a passive or active interposer. Similarly, the second element 1004 can comprise a singulated element, such as a singulated integrated device die. In other arrangements, the second element 1004 can comprise a carrier or substrate (e.g., a semiconductor wafer). The embodiments disclosed herein can accordingly apply to wafer-to-wafer (W2 W), die-to-die (D2D), or die-to-wafer (D2 W) bonding processes. In W2 W processes, two or more wafers can be directly bonded to one another (e.g., direct hybrid bonded) and singulated using a suitable singulation process. After singulation, side edges of the singulated structure (e.g., the side edges of the two bonded elements) can be substantially flush (substantially aligned x-y dimensions) and/or the edges of the bonding interfaces for both bonded and singulated elements can be coextensive and may include markings indicative of the common singulation process for the bonded structure (e.g., saw markings if a saw singulation process is used).

While only two elements 1002, 1004 are shown, any suitable number of elements can be stacked in the bonded structure 1000. For example, a third element (not shown) can be stacked on the second element 1004, a fourth element (not shown) can be stacked on the third element, and so forth. In such implementations, through substrate vias (TSVs) can be formed to provide vertical electrical communication between and/or among the vertically-stacked elements. Additionally, or alternatively, one or more additional elements (not shown) can be stacked laterally adjacent to one another along the first element 1002. In some embodiments, a laterally stacked additional element may be smaller than the second element. In some embodiments, the bonded structure can be encapsulated with an insulating material, such as an inorganic dielectric (e.g., silicon oxide, silicon nitride, silicon oxynitrocarbide, etc.). One or more insulating layers can be provided over the bonded structure. For example, in some implementations, a first insulating layer can be conformally deposited over the bonded structure, and a second insulating layer (which may include be the same material as the first insulating layer, or a different material) can be provided over the first insulating layer.

To effectuate direct bonding between the bonding layers 1008*a*, 1008*b*, the bonding layers 1008*a*, 1008*b* can be prepared for direct bonding. Non-conductive bonding surfaces 1012*a*, 1012*b* at the upper or exterior surfaces of the bonding layers 1008*a*, 1008*b* can be prepared for direct bonding by polishing, for example, by chemical mechanical polishing (CMP). The roughness of the polished bonding surfaces 1012*a*, 1012*b* can be less than 30 Å rms. For example, the roughness of the bonding surfaces 1012*a* and 1012*b* can be in a range of about 0.1 Å rms to 15 Å rms, 0.5 Å rms to 10 Årms, or 1 Å rms to 5 Å rms. Polishing can also be tuned to leave the conductive features 1006*a*, 1006*b* recessed relative to the field regions of the bonding layers 1008*a*, 1008*b*.

Preparation for direct bonding can also include cleaning and exposing one or both of the bonding surfaces 1012*a*, 1012*b* to a plasma and/or etchants to activate at least one of the surfaces 1012*a*, 1012*b*. In some embodiments, one or both surfaces 1012*a*, 1012*b* can be terminated with a species after activation or during activation (e.g., during the plasma and/or etch processes). Without being limited by theory, in some embodiments, the activation process can be performed to break chemical bonds at the bonding surface(s) 1012*a*, 1012*b*, and the termination process can provide additional chemical species at the bonding surface(s) 1012*a*, 1012*b* that alters the chemical bond and/or improves the bonding energy during direct bonding. In some embodiments, the activation and termination are provided in the same step, e.g., a plasma to activate and terminate the surface(s) 1012*a*, 1012*b*. In other embodiments, one or both of the bonding surfaces 1012*a*, 1012*b* can be terminated in a separate treatment to provide the additional species for direct bonding. In various embodiments, the terminating species can comprise nitrogen. For example, in some embodiments, the bonding surface(s) 1012*a*, 1012*b* can be exposed to a nitrogen-containing plasma. Other terminating species can be suitable for improving bonding energy, depending upon the materials of the bonding surfaces 1012*a*, 1012*b*. Further, in some embodiments, the bonding surface(s) 1012*a*, 1012*b* can be exposed to fluorine. For example, there may be one or multiple fluorine concentration peaks at or near a bond interface 1018 between the first and second elements 1002, 1004. Typically, fluorine concentration peaks occur at interfaces between material layers. Additional examples of activation and/or termination treatments may be found in U.S. Pat. No. 9,391,143, the activation and termination teachings of which are incorporated by reference herein.

Thus, in the directly bonded structure 1000, the bond interface 1018 between two non-conductive materials (e.g., the bonding layers 1008*a*, 1008*b*) can comprise a very smooth interface with higher nitrogen (or other terminating species) content and/or fluorine concentration peaks at the bond interface 1018. In some embodiments, the nitrogen and/or fluorine concentration peaks may be detected using various types of inspection techniques, such as SIMS techniques. The polished bonding surfaces 1012*a* and 1012*b* can be slightly rougher (e.g., about 1 Å rms to 30 Å rms, 3 Å rms to 20 Å rms, or possibly rougher) after an activation process. In some embodiments, activation and/or termination can result in slightly smoother surfaces prior to bonding, such as where a plasma treatment preferentially erodes high points on the bonding surface.

The non-conductive bonding layers 1008*a* and 1008*b* can be directly bonded to one another without an adhesive. In some embodiments, the elements 1002, 1004 are brought together at room temperature, without the need for application of a voltage, and without the need for application of external pressure or force beyond that used to initiate contact between the two elements 1002, 1004. Contact alone can cause direct bonding between the non-conductive surfaces of the bonding layers 1008*a*, 1008*b* (e.g., covalent dielectric bonding). Subsequent annealing of the bonded structure 1000 can cause the conductive features 1006*a*, 1006*b* to directly bond.

In some embodiments, prior to direct bonding, the conductive features 1006*a*, 1006*b* are recessed relative to the surrounding field regions, such that a total gap between opposing contacts after dielectric bonding and prior to anneal is less than 15 nm, or less than 10 nm. Because the recess depths for the conductive features 1006*a* and 1006*b* can vary across each element, due to process variation, the noted gap can represent a maximum or an average gap between corresponding conductive features 1006*a*, 1006*b* of two joined elements (prior to anneal). Upon annealing, the conductive features 1006*a* and 1006*b* can expand and contact one another to form a metal-to-metal direct bond.

During annealing, the conductive features 1006*a*, 1006*b* (e.g., metallic material) can expand while the direct bonds between surrounding non-conductive materials of the bonding layers 1008*a*, 1008*b* resist separation of the elements, such that the thermal expansion increases the internal contact pressure between the opposing conductive features. Annealing can also cause metallic grain growth across the bonding interface, such that grains from one element migrate across the bonding interface at least partially into the other element, and vice versa. Thus, in some hybrid bonding embodiments, opposing conductive materials are joined without heating above the conductive materials' melting temperature, such that bonds can form with lower anneal temperatures compared to soldering or thermocompression bonding.

In various embodiments, the conductive features 1006*a*, 1006*b* can comprise discrete pads, contacts, electrodes, or traces at least partially embedded in the non-conductive field regions of the bonding layers 1008*a*, 1008*b*. In some embodiments, the conductive features 1006*a*, 1006*b* can comprise exposed contact surfaces of TSVs (e.g., through silicon vias).

As noted above, in some embodiments, in the elements 1002, 1004 of FIG. 10A prior to direct bonding, portions of the respective conductive features 1006*a* and 1006*b* can be recessed below the non-conductive bonding surfaces 1012*a* and 1012*b*, for example, recessed by less than 30 nm, less than 20 nm, less than 15 nm, or less than 10 nm, for example, recessed in a range of 2 nm to 20 nm, or in a range of 4 nm to 10 nm. Due to process variation, both dielectric thickness and conductor recess depths can vary across an element. Accordingly, the above recess depth ranges may apply to individual conductive features 1006*a*, 1006*b* or to average depths of the recesses relative to local non-conductive field regions. Even for an individual conductive feature 1006*a*, 1006*b*, the vertical recess can vary across the feature, and so can be measured at or near the lateral middle or center of the cavity in which a given conductive feature 1006*a*, 1006*b* is formed, or can be measured at the sides of the cavity.

Beneficially, the use of hybrid bonding techniques (such as Direct Bond Interconnect, or DBI®, techniques commercially available from Adeia of San Jose, CA) can enable high density of connections between conductive features 1006*a*, 1006*b* across the direct bond interface 1018 (e.g., small or fine pitches for regular arrays).

In some embodiments, a pitch p of the conductive features 1006*a*, 1006*b*, such as conductive traces embedded in the bonding surface of one of the bonded elements, may be less than 40 μm, less than 20 μm, less than 10 μm, less than 5 μm, less than 2 μm, or even less than 1 μm. For some applications, the ratio of the pitch of the conductive features 1006*a* and 1006*b* to one of the lateral dimensions (e.g., a diameter) of the bonding pad is less than is less than 20, or less than 10, or less than 5, or less than 3 and sometimes desirably less than 2. In various embodiments, the conductive features 1006*a* and 1006*b* and/or traces can comprise copper or copper alloys, although other metals may be suitable, such as nickel, aluminum, or alloys thereof. The conductive features disclosed herein, such as the conductive features 1006*a* and 1006*b*, can comprise fine-grain metal (e.g., a fine-grain copper). Further, a major lateral dimension (e.g., a pad diameter) can be small as well, e.g., in a range of about 0.25 μm to 30 μm, in a range of about 0.25 μm to 5 μm, or in a range of about 0.5 μm to 5 μm.

For hybrid bonded elements 1002, 1004, as shown, the orientations of one or more conductive features 1006*a*, 1006*b* from opposite elements can be opposite to one another. As is known in the art, conductive features in general can be formed with close to vertical sidewalls, particularly where directional reactive ion etching (RIE) defines the conductor sidewalls either directly though etching the conductive material or indirectly through etching surrounding insulators in damascene processes. However, some slight taper to the conductor sidewalls can be present, wherein the conductor becomes narrower farther away from the surface initially exposed to the etch. The taper can be even more pronounced when the conductive sidewall is defined directly or indirectly with isotropic wet or dry etching. In the illustrated embodiment, at least one conductive feature 1006*b* in the bonding layer 1008*b* (and/or at least one internal conductive feature, such as a BEOL feature) of the upper element 1004 may be tapered or narrowed upwardly, away from the bonding surface 1012*b*. By way of contrast, at least one conductive feature 1006*a* in the bonding layer 1008*a* (and/or at least one internal conductive feature, such as a BEOL feature) of the lower element 1002 may be tapered or narrowed downwardly, away from the bonding surface 1012*a*. Similarly, any bonding layers (not shown) on the backsides 1016*a*, 1016*b* of the elements 1002, 1004 may taper or narrow away from the backsides, with an opposite taper orientation relative to front side conductive features 1006*a*, 1006*b* of the same element.

As described above, in an anneal phase of hybrid bonding, the conductive features 1006*a*, 1006*b* can expand and contact one another to form a metal-to-metal direct bond. In some embodiments, the materials of the conductive features 1006*a*, 1006*b* of opposite elements 1002, 1004 can interdiffuse during the annealing process. In some embodiments, metal grains grow into each other across the bond interface 1018. In some embodiments, the metal is or includes copper, which can have grains oriented along the 1011 crystal plane for improved copper diffusion across the bond interface 1018. In some embodiments, the conductive features 1006*a* and 1006*b* may include nano twinned copper grain structure, which can aid in merging the conductive features during anneal. There is substantially no gap between the non-conductive bonding layers 1008*a* and 1008*b* at or near the bonded conductive features 1006*a* and 1006*b*. In some embodiments, a barrier layer may be provided under and/or laterally surrounding the conductive features 1006*a* and 1006*b* (e.g., which may include copper). In other embodiments, however, there may be no barrier layer under the conductive features 1006*a* and 1006*b*.

Various embodiments disclosed herein include bonded structures in which two or more elements are directly bonded to one another without an intervening adhesive (referred to herein as “direct bonding,” “direct dielectric bonding,” or “directly bonded”). The resultant bonds formed by this technique may be described as “direct bonds” and/or “direct dielectric bonds”. In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term “hybrid bonding” refers to a species of direct bonding having both i) at least one (first) nonconductive feature directly bonded to another (second) nonconductive feature, and ii) at least one (first) conductive feature directly bonded to another (second) conductive feature, without any intervening adhesive. The resultant bonds formed by this technique may be described as “hybrid bonds” and/or “direct hybrid bonds.” In some hybrid bonding embodiments, there are many first conductive features, each directly bonded to a second conductive feature, without any intervening adhesive. In some embodiments, nonconductive features on the first element are directly bonded to nonconductive features of the second element at room temperature without any intervening adhesive, which is followed by bonding of conductive features of the first element directly bonded to conductive features of the second element via annealing at slightly higher temperatures (e.g., >100° C., >200° C., >250° C., >300° C., etc.).

Direct bonding may include direct dielectric bonding techniques as described herein and may give rise to direct dielectric bonds. Hybrid bonding may include hybrid bonding techniques as described herein and may give rise to direct hybrid bonds.

Hybrid bonding methods described herein generally include forming conductive features in the dielectric surfaces of the to-be-bonded substrates, activating the surfaces to open chemical bonds in the dielectric material, and terminating the surfaces with a desired species. In some embodiments, activating the surface may weaken chemical bonds in the dielectric material. Activating and terminating the surfaces with a desired species may include exposing the surfaces to radical species formed in a plasma. In some embodiments, the plasma is formed using a nitrogen-containing gas, e.g., N2, or forming gas and the terminating species includes nitrogen and hydrogen. In some embodiments, the surfaces may be activated using a wet cleaning process, e.g., by exposing the surfaces to aqueous solutions. In some embodiments, the aqueous solution is tetramethylammonium hydroxide diluted to a certain degree or percentage. In some embodiments, an aqueous solution may be ammonia. In some embodiments, the plasma is formed using a fluorine-containing gas, e.g., fluorine gas or helium containing a small amount of fluorine and/or nitrogen such as about 10% or less by volume, 9% or less, 8% or less, 7% or less, 6% or less, 5% or less, 4% or less, 3% or less, 2% or less, for example 1% or less.

Typically, the hybrid bonding methods further include aligning the substrates, and contacting the activated surfaces to form direct dielectric bonds. After the dielectric bonds are formed, the substrates may be heated to a temperature between 50° C. to 150° C. or more, or of 150° C. or more and maintained at the elevated temperature for a duration of about 1 hour or more, such as between 8 and 24 hours, to form direct metallurgical bonds between the metal features.

Figure 11:
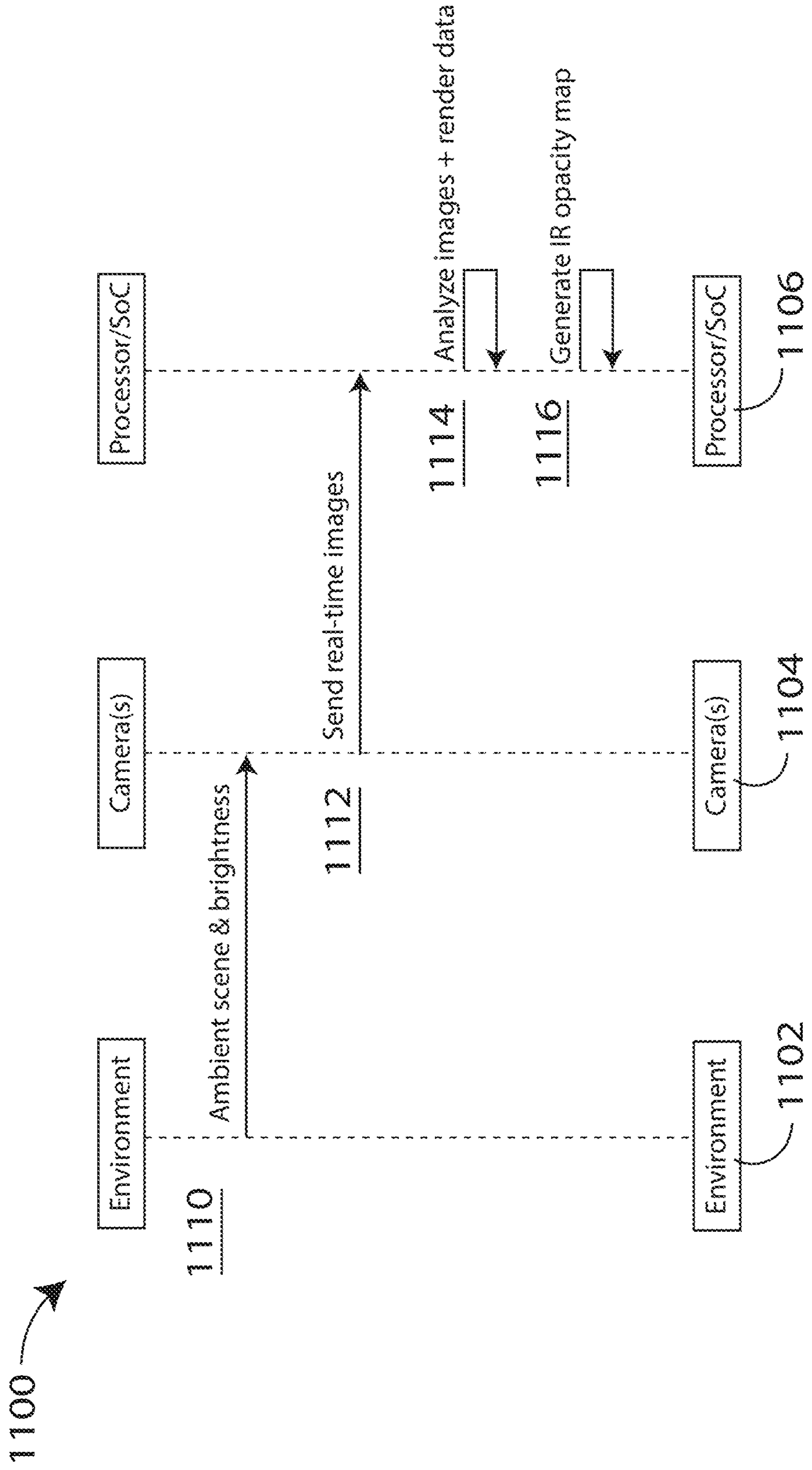
FIG. 11 is a sequence diagram illustrating a system for providing an XR content, according to some embodiments.

FIG. 11 is a process sequence diagram of system 1100 for generating an XR images, according to some embodiments. In some embodiments, system 1100 may correspond to any system or be applied to any XR device described throughout the present disclosure. That is, features described with respect to any figure may be used in combination with features described in connection with FIG. 11, unless otherwise explicitly stated. System 1100 generally describes adjusting an opaque object with an XR image to provide a brighter appearance of an XR image based at least in part on received data (e.g., corresponding to lighting in the environment). In some embodiments, system 1100, ran via an application on an XR device, comprises an environment 1102, camera(s) 1104 and processor/SoC 1106.

In some embodiments, the process begins at step 1110, where the cameras 1104 of the imaging system 221 record an ambient scene of the environment 1102, capturing real-time data on ambient light luminance (e.g., measured in nits). At step 1112, the cameras 1104 transmit the recorded image data to the processor/SoC 1106 for analysis. At step 1114, the processor/SoC 1106 analyzes the image data to determine ambient light conditions and renders a three-dimensional (3D) representation of the XR image, incorporating visible light data (e.g., red, green, blue) (e.g., from the light source 219). At step 1116, the processor/SoC 1106 generates an IR opacity map based on the ambient light data, calculating per-pixel IR drive values to adjust the dimmable layer 214's opacity.

At step 1118, the control circuitry applies the IR opacity map to the dimmable layer (e.g., dimmable layer 214), activating photochromic materials or UCNPs to form opaque regions that enhance the XR image's contrast.

At step 1120, the light source (e.g., light source 219), under control of the processor/SoC 1106, emits visible light to render the XR image on the XR display (e.g., XR display 212), synchronized with the adjusted opacity of the dimmable layer (e.g., dimmable layer 214), ensuring optimal visibility under varying ambient light conditions.

As used herein, the term “substantially” is intended to account for variations, tolerances, or minor deviations that may arise due to manufacturing limitations, alignment imprecision, sensor noise, or other practical considerations. For example, when referring to an XR object being “substantially overlaid” with an activated region of a dimmable material, this may mean that the region of the dimmable material overlaps at least a threshold portion (e.g., 85%-100%) of the projected area of the XR object as perceived by the user. In one example, if the XR object spans an area corresponding to 100 pixels on the display, a substantially overlaid dimmed region may cover at least 85 of those pixels, allowing for slight spatial mismatches without materially impacting performance or user experience. The term "substantially" should be interpreted in a manner consistent with achieving the described technical function or benefit, even in the presence of such minor variations.

As used herein, the term "light intensity" may refer to either radiometric or photometric measurements of optical power, depending on implementation or context. In the radiometric sense, light intensity may refer to quantities such as radiant flux (watts), irradiance (watts per square meter, $W/m^2$), or radiance (watts per steradian per square meter, $W/sr{\cdot}m_2$), which describe the energy of electromagnetic radiation regardless of human perception. In the photometric sense, "light intensity" may refer to human-visible brightness levels, such as illuminance (lux), luminance (candelas per square meter, $cd/m^2$), or luminous flux (lumens).

In one example, a display panel may output an XR object at 300 nits (i.e., 300 $cd/m^2$ of luminance), while ambient lighting in the surrounding environment may register at 500 lux on an illuminance sensor.

The embodiments discussed above are intended to be illustrative and not limiting. One skilled in the art would appreciate that individual aspects of the displays, display devices, and methods discussed herein may be omitted, modified, combined, and/or rearranged without departing from the scope of the disclosure.

The term "and/or" may be understood to mean "either or both" of the elements thus indicated. Additional elements may optionally be present unless excluded by the context. Terms such as "first," "second," "third" in the claims referring to a structure, module or step should not necessarily be construed to mean precedence or temporal order but are generally intended to distinguish between claim elements.

Unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

The above-described embodiments are intended to be examples only. Components or processes described as separate may be combined or combined in ways other than as described, and components or processes described as being together or as integrated may be provided separately. Steps or processes described as being performed in a particular order may be re-ordered or recombined.

The interfaces, processes, and analyses described may, in some embodiments, be performed by an application. The application may be loaded directly onto each device of any of the systems described or may be stored in a remote server or any memory and processing circuitry accessible to each device in the system. The generation of interfaces and analysis there-behind may be performed at a receiving device, a sending device, or some device or processor therebetween.

Any use of a phrase such as "in some embodiments" or the like with reference to a feature is not intended to link the feature to another feature described using the same or a similar phrase. Any and all embodiments disclosed herein are combinable or separately practiced as appropriate. Absence of the phrase "in some embodiments" does not imply that the feature is necessary. Inclusion of the phrase "in some embodiments" does not imply that the feature is not applicable to other embodiments or even all embodiments. Throughout the specification, the phrases "in response to" and "based on" shall be understood to have a broad meaning unless context requires otherwise. For example, "in response to" may refer to a step that is in direct or indirect response to a prior step, and "based on" may refer to a step that is based at least in part on a prior step or on another factor.

Features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time.

The systems and/or methods described above may be applied to, or used in accordance with, other systems and/or methods. In various embodiments, additional elements may be included, some elements may be removed, and/or elements may be arranged differently from what is shown. Alterations, modifications, combinations, and variations may be made to the particular embodiments by those of skill in the art without departing from the scope of the present application, which is defined solely by the claims appended hereto.

What is claimed is:

1. An extended reality (XR) system comprising:
- an XR display, comprising:
  - a transparent waveguide layer;
  - an infrared (IR) waveguide layer disposed on the XR display;
  - a dimmable layer disposed on the IR waveguide layer;
- a light source array configured to emit red light, green light, blue light, and IR light controllable on per-pixel level; and
- a control circuitry configured to:
  - generate pixel-level drive signals to cause the light source array to:
    - (i) emit a red light pattern, green light pattern, and blue light pattern through the transparent waveguide layer to generate an XR image defined by the pixel-level drive signals; and
    - (ii) emit an IR light pattern through the IR waveguide layer to the dimmable layer to change respective opacities of respective portions of the dimmable layer, on a pixel-level where respective portions of the dimmable layer correspond to pixels of the XR display.

2. The XR system of claim 1, wherein the control circuitry is configured to:
- determine a correlation between:
  - (a) drive signals causing the red light pattern, the green light pattern, and the blue light pattern, and
  - (b) drive signals causing the IR light pattern;
- wherein the pixel-level drive signals are generated based at least in part on the determined correlation to cause the light source array to emit the light source array to emit the red, green, and blue light patterns in coordination with the IR light pattern.

3. The XR system of claim 2, wherein the correlation is determined based at least in part on a weighted sum of luminance values associated with the red light pattern, the green light pattern, and the blue light pattern, and wherein the weighted sum is used to generate the corresponding IR light pattern.

4. The XR system of claim 1, further comprising:
- an ambient light sensor configured to detect ambient light conditions in an environment of the XR system, wherein the control circuitry is further configured to adjust an intensity of the IR light pattern emitted by the light source array based at least in part on the detected ambient light conditions.

5. The XR system of claim 1, further comprising:

a camera configured to detect ambient light conditions in an environment of the XR system, wherein the control circuitry is further configured to:

(a) adjust an intensity of at least one of the red light pattern, green light pattern, or blue light pattern emitted by the light source array based at least in part on the detected ambient light conditions; and (b) adjust an intensity of the IR light pattern emitted by the light source array based at least in part on the detected ambient light conditions.

6. The XR system of claim 1, wherein each of the transparent waveguide layers comprises a diffractive grating configured to in-couple and/or out-couple corresponding colored light.

7. The XR system of claim 1, wherein the IR waveguide layer comprises a diffractive grating configured to in-couple and/or out-couple corresponding IR light.

8. The XR system of claim 1, wherein the dimmable layer comprises an electrochromic, liquid crystal, or suspended particle material configured to modulate transmission of visible light in response to the IR light pattern.

9. The XR system of claim 1, wherein the control circuitry is further configured to apply different drive signals such that intensities of the IR light pattern applied to different regions of the dimmable layer spatially vary the opacity across the XR display.

10. The XR system of claim 1, wherein the control circuitry is further configured to operate in a time-multiplexed mode, alternating between emitting the red light pattern, the green light pattern, and the blue light pattern for image generation with emitting the IR light pattern for dimming control.

11. The XR system of claim 1, wherein the transparent waveguide layer further comprises:

a first transparent waveguide layer configured to diffract red light;

a second transparent waveguide layer configured to diffract green light; and a blue transparent waveguide layer configured to diffract blue light.

12. A method for operating an extended reality (XR) system that comprises:

an XR display, comprising:

a transparent waveguide layer;

an infrared (IR) waveguide layer disposed on the XR display;

a dimmable layer disposed on the IR waveguide layer;

a light source array configured to emit red light, green light, blue light, and IR light controllable on per-pixel level;

wherein the method comprises:

generating by a control circuitry of the XR system a pixel-level drive signals to cause the light source array to:

(i) emit a red light pattern, green light pattern, and blue light pattern through the transparent waveguide layer to generate an XR image defined by the pixel-level drive signals; and (ii) emit an IR light pattern through the IR waveguide layer to the dimmable layer to change respective opacities of respective portions of the dimmable layer, on a pixel-level where respective portions of the dimmable layer correspond to pixels of the XR display.

13. The method of claim 12, wherein the control circuitry is configured to:

determine a correlation between:

(a) drive signals causing the red light pattern, the green light pattern, and the blue light pattern, and (b) drive signals causing the IR light pattern;

wherein the pixel-level drive signals are generated based at least in part on the determined correlation to cause the light source array to emit the light source array to emit the red, green, and blue light patterns in coordination with the IR light pattern.

14. The method of claim 13, wherein the correlation is determined based at least in part on a weighted sum of luminance values associated with the red light pattern, the green light pattern, and the blue light pattern, and wherein the weighted sum is used to generate the corresponding IR light pattern.

15. The method of claim 12, further comprising:

an ambient light sensor configured to detect ambient light conditions in an environment of the XR system, wherein the control circuitry is further configured to adjust an intensity of the IR light pattern emitted by the light source array based at least in part on the detected ambient light conditions.

16. The method of claim 12, further comprising:

a camera configured to detect ambient light conditions in an environment of the XR system, wherein the control circuitry is further configured to:

(a) adjust an intensity of at least one of the red light pattern, green light pattern, or blue light pattern emitted by the light source array based at least in part on the detected ambient light conditions; and (b) adjust an intensity of the IR light pattern emitted by the light source array based at least in part on the detected ambient light conditions.

17. The method of claim 12, wherein each of the transparent waveguide layers comprises a diffractive grating configured to in-couple and/or out-couple corresponding colored light.

18. The method of claim 12, wherein the IR waveguide layer comprises a diffractive grating configured to in-couple and/or out-couple corresponding IR light.

19. The method of claim 12, wherein the dimmable layer comprises an electrochromic, liquid crystal, or suspended particle material configured to modulate transmission of visible light in response to the IR light pattern.

20. The method of claim 12, wherein the control circuitry is further configured to apply different drive signals such that intensities of the IR light pattern applied to different regions of the dimmable layer spatially vary the opacity across the XR display.

* * * * *